United States Patent [19]
Hosoba

[11] Patent Number: 5,814,839
[45] Date of Patent: Sep. 29, 1998

[54] SEMICONDUCTOR LIGHT-EMITTING DEVICE HAVING A CURRENT ADJUSTING LAYER AND A UNEVEN SHAPE LIGHT EMITTING REGION, AND METHOD FOR PRODUCING SAME

[75] Inventor: Hiroyuki Hosoba, Soraku-gun, Japan

[73] Assignee: Sharp Kabushiki Kaisha, Osaka, Japan

[21] Appl. No.: 600,008

[22] Filed: Feb. 14, 1996

[30] Foreign Application Priority Data

Feb. 16, 1995 [JP] Japan .................................. 7-028420
Feb. 24, 1995 [JP] Japan .................................. 7-037377

[51] Int. Cl.$^6$ .................................................. H01L 33/00
[52] U.S. Cl. ................................ 257/96; 257/98; 257/99; 257/102; 372/46
[58] Field of Search .......................... 257/94, 98, 101, 257/102; 372/45, 46, 48; 357/96, 99, 622, 627

[56] References Cited

U.S. PATENT DOCUMENTS 5,115,443 5/1992 Miyazawa .................................. 372/46
5,528,615 6/1996 Shima ........................................ 372/45

FOREIGN PATENT DOCUMENTS 4-229665 8/1992 Japan ........................................ 257/94

*Primary Examiner*—Minh-Loan Tran
*Attorney, Agent, or Firm*—Nixon & Vanderhye P.C.

[57] ABSTRACT

A current path adjusting layer composed of a current blocking region and a current passing region is provided on a layered structure including an active layer. An n-type electrode is provided above the current path adjusting layer so as to oppose the current blocking region. A p-type GaAs substrate has a groove-formed region where a plurality of grooves are formed, and the conductivities of the current path adjusting layer containing Zn and Se as dopants, grown on the substrate, depend upon an orientation of each slope of the grooves and that of a flat region of the substrate surface.

33 Claims, 22 Drawing Sheets

FIG.1A
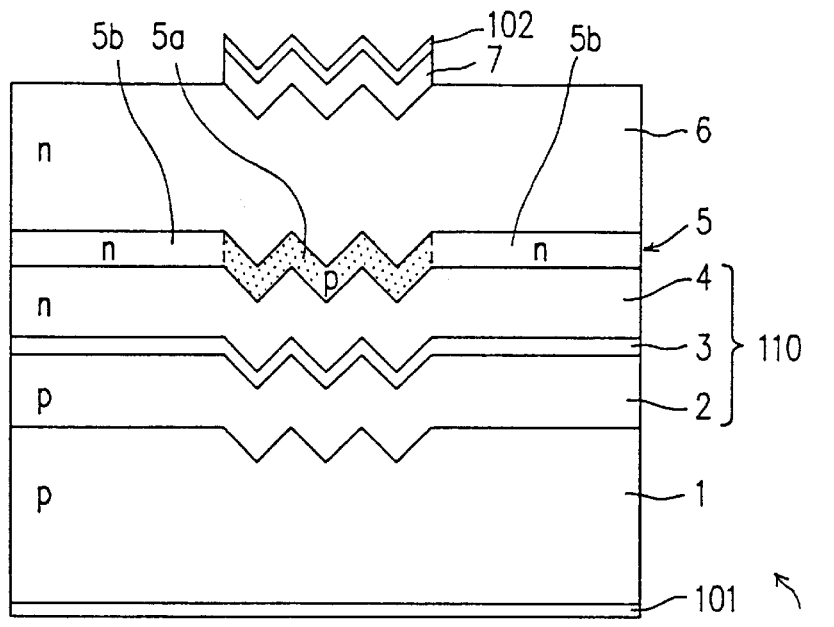
FIG.1B
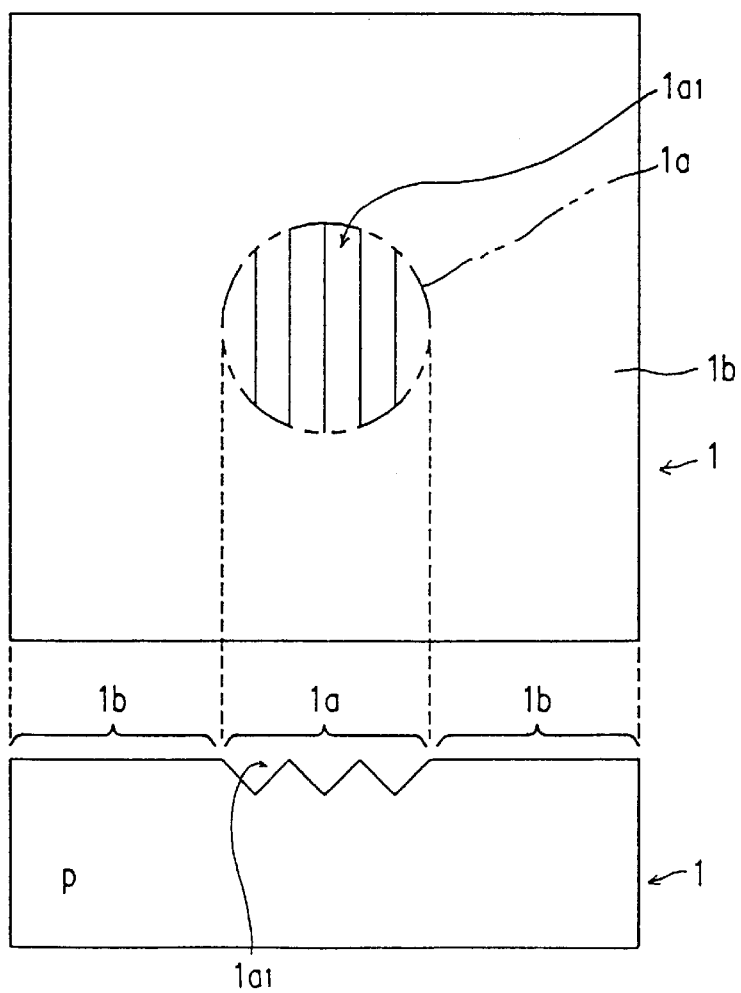
FIG.1C

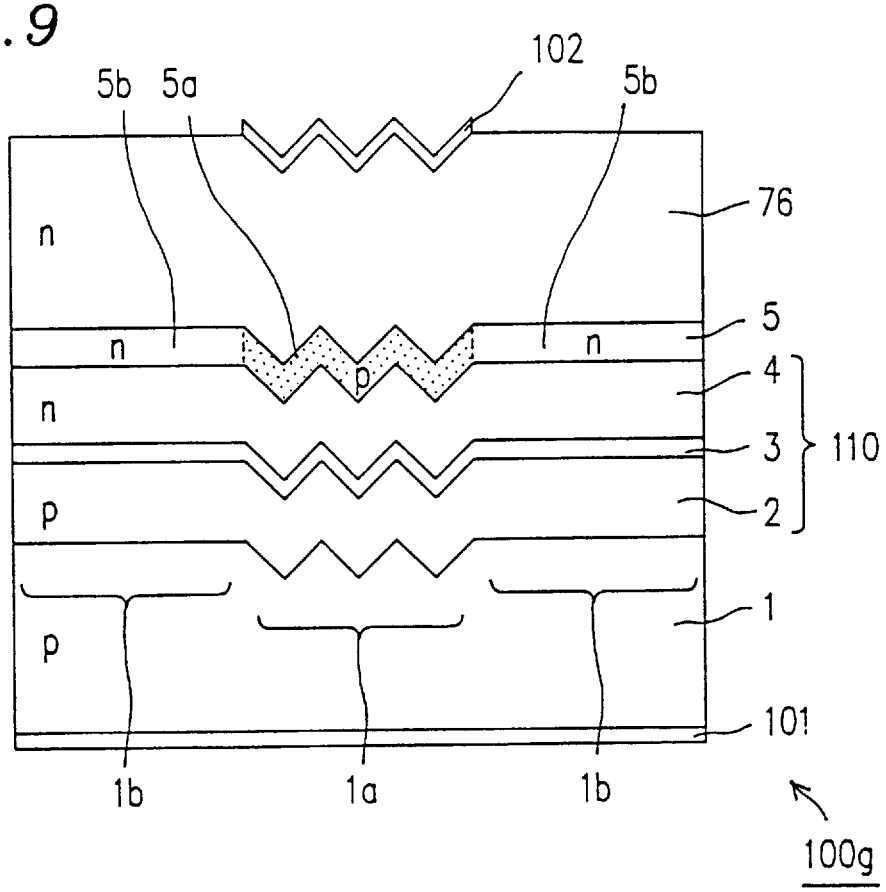

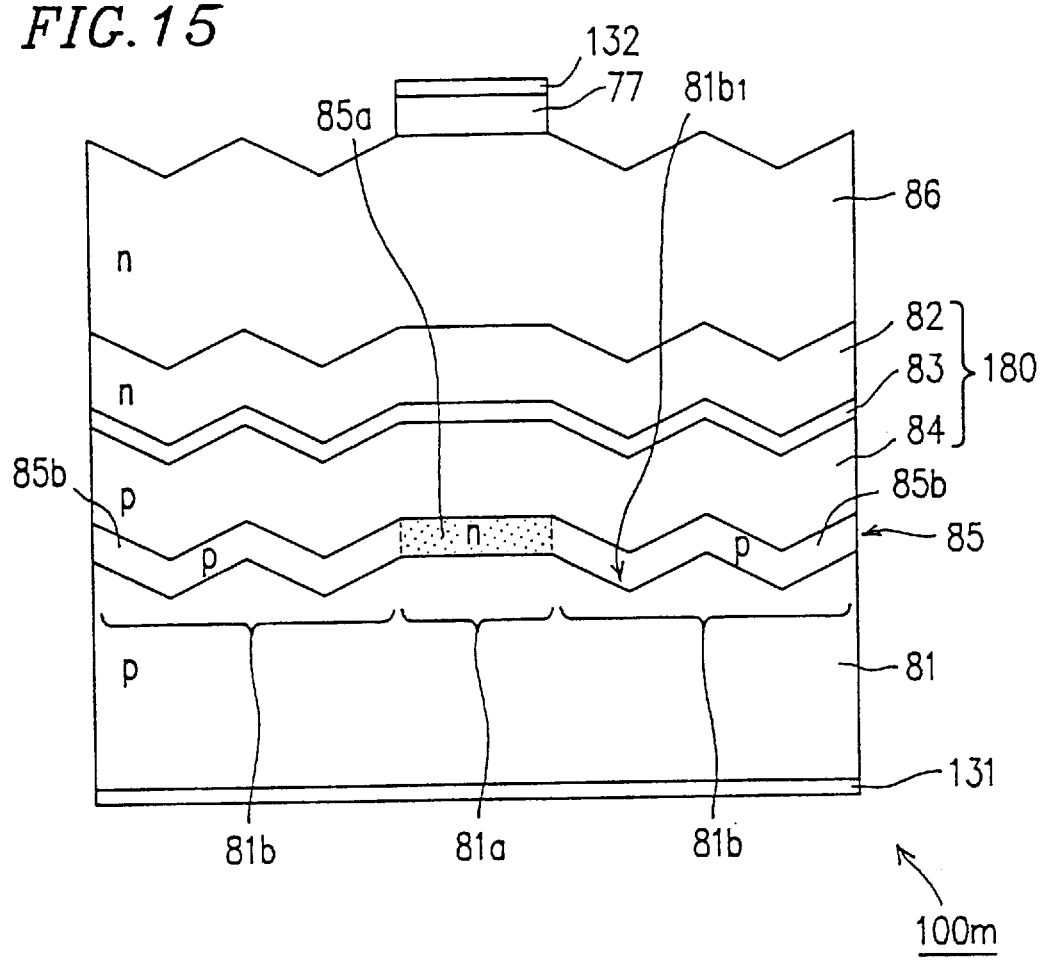

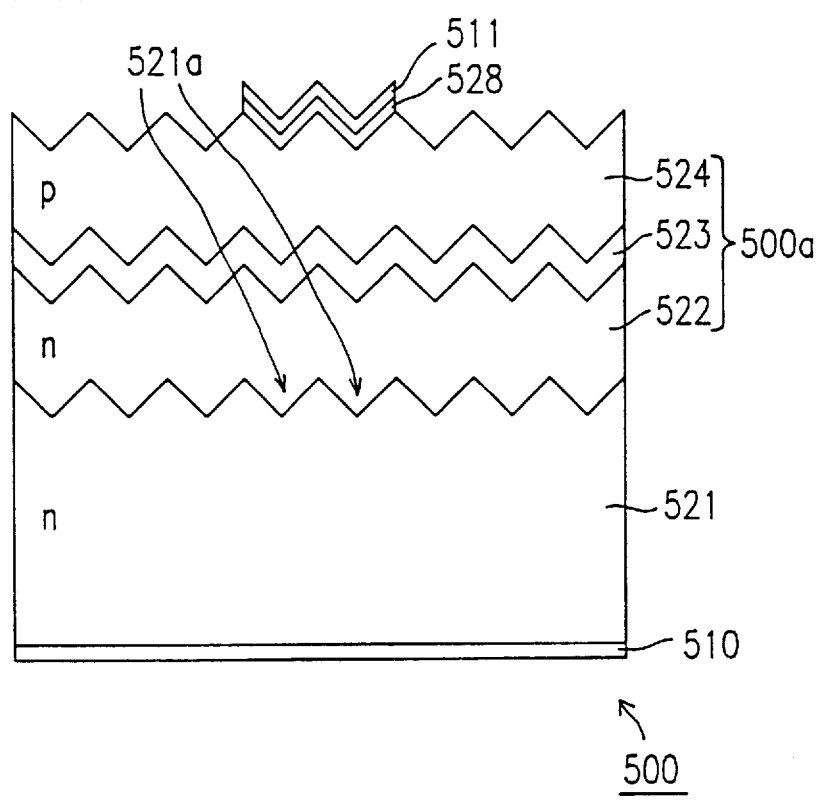

SEMICONDUCTOR LIGHT-EMITTING DEVICE HAVING A CURRENT ADJUSTING LAYER AND A UNEVEN SHAPE LIGHT EMITTING REGION, AND METHOD FOR PRODUCING SAME

BACKGROUND OF THE INVENTION

1. Field of the Invention

The present invention relates to a semiconductor light-emitting device and a method for producing the same. In particular, the present invention relates to a structure of a device enabling brightness to be enhanced without increasing the number of production steps and a process for producing the same.

2. Description of the Related Art

In recent years, light-emitting diodes (LEDs) have been in the limelight as indoor and outdoor display devices. In particular, it is expected that the market for outdoor display devices will expand during the next few years along with a need for increased brightness and that LEDs will grow into a display media capable of replacing neon signs in the future. High-brightness LEDs are realized in red LEDs having a AlGaAs-type double-hetero (DH) structure, and recently, high-brightness LEDs were also realized in orange to green LEDs having a AlGaInP-type DH structure.

AlGaInP-type materials have the largest direct transition type bandgap among (III–V)-group compound semiconductor materials excluding nitrides and have drawn attention as materials for light-emitting devices of 0.5 to 0.6 μm.

In particular, pn-junction type LEDs using GaAs as a substrate material and having a light-emitting portion made of AlGaInP which lattice-matches with GaAs are capable of emitting red to green light with a higher brightness, as compared with LEDs using an indirect transition type material such as GaP and GaAsP as a material for constituting the light-emitting portions. In order to realize LEDs with a high brightness, that is, in order to increase the amount of light emitted from LEDs, it is important to increase the light-emitting efficiency at the light-emitting portions of devices and to take light generated at the light-emitting portions out of the devices efficiently, considering light absorption in the devices, and the relative positional relationship between the light-emitting portions and electrodes.

FIGS. 21A and 21B are cross-sectional views of a conventional LED having a AlGaInP light-emitting portion (see Japanese Laid-Open Patent Publication No. 4-229665): in FIG. 21A, a current distribution is represented by a dotted line; and in FIG. 21B, the way light is emitted in the device is represented by a path (a solid line) of light (hereinafter, referred to as LED light) emitted from the light-emitting portion.

Referring to these figures, a pn-junction type LED 10 includes a p-GaAs substrate 11, on which a layered structure 10a having a DH junction portion is formed. The layered structure 10a includes a p-AlGaInP lower cladding layer 12, a AlGaInP active layer 13, and an n-AlGaInP upper cladding layer 14 in this order from the surface of the p-GaAs substrate 11. An n-type electrode 15a is provided on an n-GaAs contact layer 15 formed on a part of the n-AlGaInP upper cladding layer 14, and a p-type electrode 11a is provided over the entire reverse surface of the p-GaAs substrate 11. A portion of the AlGaInP active layer 13 right below the n-type electrode 15a and the vicinity thereof form a light-emitting portion 13a of the LED 10. The LED 10 having the above-mentioned structure has three problems.

First, since the light-emitting portion 13a is limited to a narrow region below the n-type electrode 15a, the efficiency at which light is taken out of the upper surface of the device is low.

In other words, the resistance of the n-AlGaInP upper cladding layer 14 is slightly smaller than that of the p-AlGaInP lower cladding layer 12; however, the degree of electron movement in the n-AlGaInP upper cladding layer 14 is small (i.e., 100 cm/V·s) even when the n-AlGaInP upper cladding layer 14 is doped at about $10^{15}$ cm$^{-3}$, consequently current does not sufficiently diffuse in the n-AlGaInP upper cladding layer 14.

As a result, the amount of light emitted at a portion of the AlGaInP active layer 13 right below the n-type electrode 15a increases, and as shown in FIG. 21B, the LED light (a, b and c) flowing upward from the portion of the AlGaInP active layer 13 right below the n-type electrode 15a is reflected by the n-type electrode 15a. Therefore, the efficiency at which light is taken out of the front surface of the device is low.

Second, the efficiency at which light is taken out is low due to the reflection of the LED light by the upper surface of the device. That is, as shown in FIG. 21B, LED light (d) flowing from the portion of the AlGaInP active layer 13 right below the n-type electrode 15a to the outside of the position where the n-type electrode 15a is provided on the surface of the device is incident upon the upper surface of the device at an angle equal to or larger than a critical angle and is reflected by the upper surface of the device to the inside of the device. Thus, the efficiency at which light is taken out of the upper surface of the device is very low.

Third, a high-brightness LED emitting LED light in the range of orange to green colors uses an AlGaInP mixed semiconductor material as its constituent material. Therefore, when this crystal material is grown on a (100) plane of the substrate, a super-lattice is formed in the grown layers.

The super-lattice is a long-distance ordered structure in a <111> direction, formed of In, Ga, and Al which are group-III atoms. Taking GaInP as an example, a bandgap of $Ga_{0.5}In_{0.5}P$ in which such a super-lattice is formed is smaller by about 90 meV than that of $Ga_{0.5}In_{0.5}P$ in an ideal mixed crystal state in which a super-lattice is not formed. Thus, in the case where a super-lattice is formed, a wavelength becomes longer than a desired wavelength. This requires that the Al composition be increased so as to allow the wavelength to take an originally set value. As a result, light-emitting efficiency and reliability decreases due to the increase in Al composition.

Japanese Laid-Open Patent Publication No. 4-229665 discloses an invention which overcomes the above-mentioned first problem. According to this publication, a current diffusion layer is provided, which allows a current to diffuse between a light-emitting portion and an electrode on a side where light is taken out, whereby a current distribution at the light-emitting portion is improved.

FIG. 22 is a cross-sectional view of an LED having a current diffusion layer as described above. Referring to this figure, an LED 20 having a current diffusion layer 28 includes an n-GaAs substrate 21 in the same way as in the LED 10 shown in FIGS. 21A and 21B, on which a layered structure 20a having a DH junction portion is provided. The layered structure 20a includes an n-AlGaInP lower cladding layer 22, an AlGaInP active layer 23, and a p-AlGaInP upper cladding layer 24 in this order from the surface of the n-GaAs substrate 21. A p-GaInP intermediate bandgap layer 26 is provided on the p-AlGaInP upper cladding layer 24, and an n-AlGaInP current blocking layer 27 is provided on a predetermined region of the surface of the p-GaInP intermediate bandgap layer 26.

The current diffusion layer 28 is provided over the entire surface of the p-GaInP intermediate bandgap layer 26 and the n-AlGaInP current blocking layer 27. A p-type electrode 25a is provided, via a p-GaAs contact layer 25, above the surface of the current diffusion layer 28, opposing the n-AlGaInP current blocking layer 27. An n-type electrode 21a is formed over the entire reverse surface of the n-GaAs substrate 21.

Hereinafter, a method for producing the above-mentioned LED will be described.

In a first crystal growth step, the n-AlGaInP lower cladding layer 22, the AlGaInP active layer 23, and the p-AlGaInP upper cladding layer 24 are formed in this order on the n-GaAs substrate 21 placed in a crystal growth apparatus. Then, the p-GaInP intermediate bandgap layer 26 and an n-AlGaInP layer are grown on the p-AlGaInP upper cladding layer 24.

The resultant n-GaAs substrate 21 is taken out of the crystal growth apparatus and is placed in an etching apparatus, where a first etching treatment is conducted. Specifically, the n-AlGaInP layer is selectively etched so as to form the n-AlGaInP current blocking layer 27 in the form of a circle on the p-GaInP intermediate bandgap layer 26.

Then, the n-GaAs substrate 21 subjected to the above-mentioned etching treatment is placed in a crystal growth apparatus, where a second crystal growth is conducted. In the second crystal growth step, the current diffusion layer 28 is grown over the entire surface of the p-GaInP intermediate bandgap layer 26 and the n-AlGaInP current blocking layer 27, and a p-GaAs layer is grown on the current diffusion layer 28.

The resultant n-GaAs substrate 21 is taken out of the crystal growth apparatus, and the p-type electrode 25a and the n-type electrode 21a are formed on the p-GaAs layer and on the reverse surface of the n-GaAs substrate 21, respectively. Here, the p-type electrode 25a is formed in a region on the surface of the p-GaAs layer right above the current blocking layer 27. The p-GaAs layer in the portion other than that right under the p-type electrode 25a is removed by selective etching, whereby the p-GaAs contact layer 25 is formed right under the p-type electrode 25a.

In the conventional LED 20 shown in FIG. 22, a current $L_{20}$ injected into the current diffusion layer 28 from the p-type electrode 25a substantially diffuses to both sides of the p-type electrode 25a in the current diffusion layer 28 and is injected into the p-AlGaInP upper cladding layer 24 via the p-GaInP intermediate bandgap layer 26. Thus, in the LED 20 having the above-mentioned structure, the light-emitting region widely spreads into a region right below the p-type electrode 25a and into an outside region in the vicinity thereof. The current flowing from the p-type electrode 25a to the region right therebelow is blocked by the current blocking layer 27, so that the current injected into the region of the AlGaInP active layer 23 right below the p-type electrode 25a is directed to other regions. Because of this, the amount of emitted light in the region other than that right below the p-type electrode 25a increases and the efficiency at which the LED light is taken out increases.

However, in order to produce the LED 20 having such a structure, two crystal growth steps are required, causing problems in terms of cost and yield. In addition, the current diffusion layer 28 is re-grown on the p-GaInP intermediate bandgap layer 26 and the current blocking layer 27 after the n-AlGaInP layer to be the current blocking layer 27 is selectively etched. Therefore, there is a problem as to crystallinity of a re-growth interface, affecting the characteristics and reliability of the device.

As described above, the conventional LED 20 shown in FIG. 22 overcomes the above-mentioned first problem. That is, the problem that the light-emitting portion is limited to a narrow region below the p-type electrode, thus decreasing the efficiency at which light is taken out of the upper surface of the device. However, the LED 20 causes a fourth problem related to the production process.

Furthermore, the structure of the LED 20 cannot overcome the above-mentioned second problem. That is, the problem that the efficiency at which light is taken out is low due to the reflection of the LED light by the surface of the device. Also, the third problem is not overcome, that is, the problem related to a super-lattice caused in the situation where the AlGaInP mixed semiconductor material is grown on the (100) plane of the substrate. Thus, according to the LED 20, it is difficult to increase brightness, keep satisfactory characteristics, reliability, and the like.

As described above, the conventional semiconductor light-emitting devices shown in FIGS. 21A, 21B, and 22 respectively have various problems.

In summary, in the conventional LED 10, a current sufficiently diffuses in the n-AlGaInP upper cladding layer 14. Therefore, the amount of light emitted in the region right below the n-type electrode increases and the LED light (a, b and c) flowing upward from the region right below the n-type electrode is reflected by the n-type electrode 15a, as shown in FIG. 21B. This results in a low efficiency at which light is taken out of the upper surface of the device.

Furthermore, the LED light (d) flowing from the light-emitting portion to the outside of the position where the n-type electrode is provided on the surface of the device is incident upon the upper surface of the device at an angle equal to or larger than a critical angle and is not emitted out of the device. In this respect, the efficiency at which light is taken out of the upper surface of the device is low.

Still furthermore, in the AlGaInP semiconductor light-emitting device, a super-lattice is formed on the substrate surface having a (100) plane, which makes the wavelength of the LED light longer than the desired wavelength. However, in order to adjust the color shift of the emitted LED light caused by a lengthened wavelength, the Al composition is required to increase. This causes problems of a decrease in light-emitting efficiency and reliability.

In the LED shown in FIG. 22, the current diffusion layer and the current blocking layer enable the light-emitting region to extend to a region other than that right below the electrode and enhance the efficiency at which light is taken out. However, the LED light, which is incident upon the upper surface of the substrate from the inside of the device at an angle equal to or larger than a critical angle, cannot be output from the upper surface of the device. Thus, there still remains a problem that the efficiency at which light is taken out of the upper surface of the device is very low. Also, the structure of the LED 20 is not effective for the problem caused by a super-lattice in the AlGaInP mixed semiconductor LED.

In addition, according to the method for producing the LED 20 having a structure shown in FIG. 22, two crystal growth steps are required, leading to an increase in cost and decrease in yield.

Furthermore, according to this method, after the lower cladding layer, the active layer, the upper cladding layer, the intermediate bandgap layer, and the semiconductor layer to be the current blocking layer are grown on a wafer (substrate), the wafer is taken out of the crystal growth apparatus, and the semiconductor layer is selectively etched, whereby the current blocking layer is formed. Then, the wafer is placed in the crystal growth apparatus again, and the current diffusion layer is re-grown on the wafer with the intermediate bandgap layer and the current blocking layer exposed. Because of this, when the current blocking layer is etched, the wafer is taken out of the crystal growth apparatus and is exposed to the air. This is likely to cause the re-growth interface to be oxidized and impurities to be mixed. Thus, there are problems that crystallinity of the re-growth interface is degraded and the characteristics and reliability of the device are adversely affected.

SUMMARY OF THE INVENTION

A semiconductor light-emitting device of the present invention includes: a semiconductor substrate of first conductivity type having a top surface and a bottom surface; a current path adjusting layer including a current blocking region and a current passing region, containing a first dopant of the first conductivity type and a second dopant of a second conductivity type; multi-layer structure formed between the top surface of the semiconductor substrate and the current path adjusting layer, the multi-layer structure including an active layer for emitting light and a pair of cladding layers sandwiching the active layer; a first electrode formed on the bottom surface of the semiconductor substrate; and a second electrode formed over the current blocking region of the current path adjusting layer, wherein the top surface of semiconductor substrate has a flat region and a groove-formed region in which at least one groove is formed and conductivity of the current path adjusting layer is locally changed depending upon a crystal orientation of a slope of the groove and a crystal orientation of the flat region of the top surface of the semiconductor substrate, and the current blocking region above the groove-formed region has the first conductivity and the current passing region above the flat region has the second conductivity.

In one embodiment of the present invention, the crystal orientation of the flat region of the top surface of the semiconductor substrate is (100), the crystal orientation of the slope of the groove in the groove-formed region is A orientation.

In another embodiment of the present invention, a cladding layer having the second conductivity type is formed between the current path adjusting layer and the second electrode.

In another embodiment of the present invention, the above-mentioned semiconductor light-emitting device includes a current diffusion layer having the second conductivity type formed between the current path adjusting layer and the second electrode, diffusing a current so that a cross-section of a current path becomes larger on the current path adjusting layer side than on the side of the second electrode.

In another embodiment of the present invention, the current diffusion layer includes a second current path adjusting layer therein, the second current path adjusting layer contains a first dopant for the first conductivity type and a second dopant for the second conductivity type, and the second current path adjusting layer includes a second current blocking region has a first conductivity type by the first dopant based on the crystal orientation of the slope of the groove in the groove-formed region of the semiconductor substrate and a second current passing region has the second conductivity by the second dopant based on the crystal orientation of the flat region of the semiconductor substrate.

In another embodiment of the present invention, the current blocking region of the current path adjusting layer is a high-resistant region.

In another embodiment of the present invention, the multi-layer structure includes a reflective layer reflecting light generated in the active layer.

In another embodiment of the present invention, the multi-layer structure is made of a $(Al_xGa_{1-x})_{1-y}In_yP$ layer ($0 \leq x \leq 1$, $0 \leq y \leq 1$).

In another embodiment of the present invention, the current path adjusting layer is made of a $(Al_xGa_{1-x})_{1-y}In_yP$ layer ($0 \leq x \leq 1$, $0 \leq y \leq 1$).

In another embodiment of the present invention, the current diffusion layer is made of $Al_xGa_{1-x}As$ ($0 \leq x \leq 1$).

In another embodiment of the present invention, the current diffusion layer is mde of a $In_y(Ga_{1-x}Al_x)_{1-y}P$ layer ($0 \leq x \leq 1$, $0 \leq y \leq 1$).

Alternatively, a semiconductor light-emitting device of the present invention includes: a semiconductor substrate of a first conductivity type having a top surface and a bottom surface; a multi-layer structure including an active layer for emitting light and a pair of cladding layers sandwiching the active layer; a current path adjusting layer formed between the top surface of the semiconductor substrate and the multi-layer structure, the current path adjusting layer including a current blocking region and a current passing region, containing a first dopant of the first conductivity type and a second dopant of a second conductivity type; a first electrode formed on the bottom surface of the semiconductor substrate, a second electrode formed over the current blocking region of the current path adjusting layer; and wherein the top surface of semiconductor substrate has a flat region and a groove-formed region in which at least one groove is formed, and conductivity of the current path adjusting layer is locally changed depending upon a crystal orientation of a slope of the groove and a crystal orientation of the flat region of the top surface of the semiconductor substrate, and the current blocking region above the groove-formed region has the first conductivity and the current passing region above the flat region has the second conducitivity.

In one embodiment of the present invention, the current blocking region of the current path adjusting layer is a high-resistant region.

In another embodiment of the present invention, the semiconductor substrate includes a second cladding layer having the first conductivity formed between the semiconductor substrate and the current path adjusting layer.

In another embodiment of the present invention, the above-mentioned semiconductor light-emitting device includes a current diffusion layer having the second conductivity, provided between the multi-layer structure and the second electrode, diffusing a current so that a cross-section of a current path becomes larger on the layered structure side than on the side of the second electrode.

In another embodiment of the present invention, a reflective layer reflecting light generated in the active layer is formed on the semiconductor substrate.

In another embodiment of the present invention, the multi-layer structure is made of a $(Al_xGa_{1-x})_{1-y}In_yP$ layer ($0 \leq x \leq 1$, $0 \leq y \leq 1$).

In another embodiment of the present invention, the current path adjusting layer is made of a $(Al_xGa_{1-x})_{1-y}In_yP$ layer ($0 \leq x \leq 1$, $0 \leq y \leq 1$).

In another embodiment of the present invention, the current diffusion layer is made of $Al_xGa_{1-x}As$ ($0 \leq x \leq 1$).

In another embodiment of the present invention, the current diffusion layer is made of a $In_y(Ga_{1-x}Al_x)_{1-y}P$ layer ($0 \leq x \leq 1$, $0 \leq y \leq 1$).

According to another aspect of the present invention, a method for producing a semiconductor light-emitting device, includes the steps of: forming a groove-formed region and a flat region on a top surface of a semiconductor substrate of a first conductivity type; forming a multi-layer structure on the top surface side of the semiconductor substrate, the multi-layer structure including an active layer for emitting light and a pair of cladding layers sandwiching the active layer; and growing the current path adjusting layer on the multi-layer structure while doping the current path adjusting layer simultaneously with a first dopant of the first conductivity type and a second dopant of a second conductivity type, wherein, in the current path adjusting layer, a current blocking region is formed above a groove-formed region of the semiconductor substrate so as to have a first conductivity type and a current passing region is formed above the flat region of the semiconductor substrate so as to have the second conductivity type.

In one embodiment of the present invention, the first dopant is Zn and the second dopant is Se.

Alternatively, a method for producing a semiconductor light-emitting device, includes the steps of: forming a groove-formed region and a flat region on a top surface of a semiconductor substrate of a first conductivity type; forming a current path adjusting layer on the top surface of the semiconductor substrate while doping the current path adjusting layer simultaneously with first dopant of the first conductivity type and second dopant of a second conductivity type; and forming a multi-layer structure on the current path adjusting layer, the multi-layer structure including an active layer for emiting light and a pair of cladding layers sandwiching the active layer, wherein, in the current path adjusting layer, a current blocking region is formed above the groove-formed region of the semiconductor substrate so as to have the second conductivity of the second dopant and a current passing region formed above the flat region of the semiconductor substrate so as to have the first conductivity of the first dopant.

In one embodiment of the present invention, the first dopant is Se and the second dopant is Zn.

According to another aspect of the present invention, a semiconductor light-emitting device includes: a semiconductor substrate of a first conductivity type having a top surface and a bottom surface; a current path adjusting layer including a current blocking region and a current passing region, containing a first dopant of the first conductivity type and a second dopant of a second conductivity type; a multi-layer structure formed between the top surface of the semiconductor substrate and the current path adjusting layer, the multi-layer structure including an active layer for emitting light and a pair of cladding layers sandwiching the active layer; a first electrode formed on the bottom surface of the semiconductor substrate; and a second electrode formed over the current blocking region of the current path adjusting layer, wherein the top surface of the semiconductor substrate has a flat region and a groove-formed region on the top surface, and conductivity of the current path adjusting layer is locally changed depending upon a crystal orientation of slopes of the grooves and a crystal orientation of the flat region of the top surface of the semiconductor substrate, and the current blocking region above the flat region has the first conductivity type and the current passing region above the groove-formed region has the second conductivity type.

In one embodiment of the present invention, the above-mentioned light-emitting device includes a current diffusion layer having the second conductivity formed between the current path adjusting layer and the second electrode, diffusing a current so that a cross-section of a current path becomes larger on the current path adjusting layer side than on the side of the second electrode.

In another embodiment of the present invention, the current diffusion layer include a second current path adjusting layer, the second current path adjusting layer contains a first dopant for the first conductivity and a second dopant for the second conductivity, and the second current path adjusting layer includes a second current blocking region formed so as to have a conductivity of the first dopant based on the orientation of the flat region of the semiconductor substrate and a second current passing region formed so as to have a conductivity of the second dopant based on the orientation of the slopes of the grooves in the groove-formed region of the semiconductor substrate.

In another embodiment of the present invention, the current blocking region is a high-resistant region.

In another embodiment of the present invention, a reflective layer reflecting light generated in the active layer is formed on the semiconductor substrate.

Alternatively, a semiconductor light-emitting device includes: a semiconductor substrate of a first conductivity type having a top surface and a bottom surface; a multi-layer structure including an active layer for emitting light and a pair of cladding layers sandwiching the active layer; a current path adjusting layer formed between the top surface of the semiconductor substrate and the multi-layer structure, the current path adjusting layer including a current blocking region and a current passing region, containing a first dopant of the first conductivity type and a second dopant for a second conductivity type; a first electrode formed on the bottom surface of the semiconductor substrate; and a second electrode formed over the current blocking region of the current path adjusting layer, wherein the top surface of the semiconductor substrate has a flat region and a groove-formed region, in which grooves are formed, and conductivity of the current path adjusting layer is locally changed depending upon a crystal orientation of slopes of the grooves and a crystal orientation of the flat region of the top surface of the semiconductor substrate, and the current blocking region above the flat region has the second conductivity type and the current passing region above the groove-formed region has the first conductivity type.

In one embodiment of the present invention, the current blocking region is a high-resistant region.

In another embodiment of the present invention, the above-mentioned semiconductor light-emitting device includes a current diffusion layer having the second conductivity provided between the multi-layer structure and the second electrode, diffusing a current so that a cross-section of a current path becomes larger on the layered structure side than on the side of the second electrode.

In another embodiment of the present invention, a reflective layer reflecting light generated in the active layer is formed on the semiconductor substrate.

According to another aspect of the present invention, a method for producing a semiconductor light-emitting device, includes the steps of: forming a groove-formed region and a flat region on a top surface of a semiconductor substrate of a first conuctivity type; forming a multi-layer structure on the top surface side of the semiconductor substrate, including an active layer for emitting light and a pair of cladding layers sandwiching the active layer; and forming a current path adjusting layer on the multi-layer structure while doping the current path adjusting layer simultaneously with a first dopant for the first conductivity type and a second dopant for a second conductivity type, wherein, in the current path adjusting layer, a current blocking region blocking a current is formed above the flat region so as to have the first conductivity type of the first dopant and a current passing region passing a current is formed above the groove-formed region so as to have the second conductivity of the second dopant.

In one embodiment of the present invention, the first dopant is Se and the second dopant is Zn.

Alternatively, a method for producing a semiconductor light-emitting device, includes the steps of: forming a groove-formed region and a flat region on a top surface of a semiconductor substrate of a first conductivity; forming a current path adjusting layer on the top surface of the semiconductor substrate while doping the current path adjusting layer simultaneously with a first dopant for the first conductivity type and a second dopant for a second conductivity type; and forming a multi-layer structure on the current path adjusting layer, the multi-layer structure including an active layer for emitting light and a pair of cladding layers sandwiching the active layer, wherein, in the current path adjusting layer, a current blocking region blocking a current is formed above the flat so as to have the second conductivity of the second dopant and a current passing region passing a current is formed above the groove-formed region so as to have the first conuctivity.

In one embodiment of the present invention, the first dopant is Zn and the second dopant is Se.

According to another aspect of the present invention, a semiconductor light-emitting device includes: a semiconductor substrate with a top surface in an uneven shape, having a first conductivity type; a light-emitting portion including an active layer and a pair of cladding layers sandwiching the active layer, the light-emitting portion disposed on the top surface of the semiconductor substrate, emitting light generated in the active layer; a first electrode formed on a bottom surface of the semiconductor substrate; and a second electrode formed over the light-emitting portion, wherein each semiconductor layer included in the light-emitting portion has a front face in an uneven shape corresponding to the uneven shape of the top surface of the semiconductor substrate.

In one embodiment of the present invention, a plurality of stripe-shaped grooves are formed on the top surface of the semiconductor substrate so that the top surface becomes uneven, and an orientation of slopes of the grooves is an A-plane with respect to a (100) plane of semiconductor crystal.

In another embodiment of the present invention, the top surface of the semiconductor substrate is tilted in a [011] direction from the (100) plane of semiconductor crystal.

In another embodiment of the present invention, the top surface of the semiconductor substrate includes a plane tilted in a [011] direction from a (100) plane of semiconductor crystal and a (100) plane.

According to the present invention, the current path adjusting layer composed of the current blocking region blocking a current and the current passing region passing a current is provided on the layered structure including the active layer disposed on the surface side of the p-type compound semiconductor substrate, and the n-type electrode is provided on the upper side of the current path adjusting layer so as to oppose the current blocking region. Therefore, the working current of the device is blocked by the current blocking region right below the n-type electrode and widely diffuses to both sides thereof. Thus, LED light is generated in the regions other than that right below the n-type electrode, and the LED light thus generated is taken out of the device effectively without being blocked by the n-type electrode. This improves the efficiency at which LED light is taken out and enables the semiconductor light-emitting device to have a higher brightness.

Furthermore, the p-type compound semiconductor substrate has a groove-formed region where one or a plurality of grooves are formed, the orientation of each slope of the grooves and that of the flat region of the substrate surface regulate the conductivity of the semiconductor layer grown on the substrate containing predetermined dopants. Therefore, the current blocking region and the current passing region are capable of being simultaneously formed in the current path adjusting layer containing the first and second dopants. More specifically, the current blocking region is formed so as to have the conductivity of the first dopant based on the orientation of each scope of the grooves of the substrate and the current passing region is formed so as to have the conductivity of the second dopant based on the orientation of the flat region of the substrate. This enables a device structure having the current blocking region in a part of the upper side of the active layer to be formed by a single crystal growth step.

According to the present invention, the orientation of the flat region of the surface of the p-type compound semiconductor substrate has a (100) plane, the orientation of each slope of the grooves in the groove-formed region has an A-face, and the current path adjusting layer includes the current blocking region with a p-type conductivity and the current passing region with an n-type conductivity. Therefore, by using Zn as a p-type dopant of the current path adjusting layer and Se as an n-type dopant, the conductivities of the p-type current blocking region and the n-type current passing region based on the orientation of the substrate can be made to have a high carrier concentration in each of the regions, and the function of the current path adjusting layer can be made effective.

According to the present invention, the second n-type upper cladding layer is provided on the current path adjusting layer, so that the thickness of the n-type upper cladding layer between the current path adjusting layer and the active layer can be made thin. This enables the curernt blocking region of the current path adjusting layer to prevent a current which has once diffused from diffusing to the underside of the current blocking region and reduces a current to be injected into a region of the active layer right below the n-type electrode. As a result, the amount of light emitted in the regions of the active layer other than that right below the n-type electrode increases, and the efficiency at which light is taken out can be improved.

According to the present invention, a current diffusion layer is provided between the current path adjusting layer and the n-type electrode. Therefore, the current flowing from the n-type electrode to the active layer spreads on the current path adjusting layer side more greatly than on the n-type electrode side. This causes the light-emitting region of the active layer to spread to regions far away from the region right below the n-type electrode, whereby the efficiency at which light is taken out is improved.

Furthermore, by allowing the current diffusion layer to have a bandgap wider than that of the active layer, the efficiency at which light is taken out can be improved without causing light generated in the active layer to be absorbed by the current diffusion layer, whereby the semiconductor light-emitting device with higher brightness can be obtained.

According to the present invention, the n-type current diffusion layer has a second current path adjusting layer composed of the current blocking region and the current passing region, which has the same structure as that of the above-mentioned current path adjusting layer. Therefore, a current can be diffused to a wider region in a current path from the n-type electrode to the active layer. This increases the amount of light emitted outside of the region of the active layer right below the n-type electrode, and the efficiency at which light is taken out can be improved.

According to the present invention, the current path adjusting layer composed of the current blocking region blocking a current and the current passing region passing a current is provided on the n-type compound semiconductor substrate, the layered structure including the active layer is provided on the current path adjusting layer, and the p-type electrode is positioned on the upper side of the layered structure so as to oppose the current blocking region of the current path adjusting layer. Therefore, the working current of the device is blocked by the current blocking region right below the p-type electrode and widely spreads to both sides thereof. This generates LED light in the regions of the active layer other than that right below the p-type electrode, and the LED light thus generated is taken out of the device effectively without being blocked by the p-type electrode. As a result, the efficiency at which light is taken out is improved and the semiconductor light-emitting device can have a higher brightness.

Furthermore, the n-type compound semiconductor substrate has a groove-formed region where one or a plurality of grooves are formed, and the orientation of each slope of the grooves and that of the flat region of the substrate surface regulate the conductivity of the semiconductor layer grown on the substrate containing predetermined dopants. Therefore, the current blocking region and the current passing region are capable of being simultaneously formed in the current path adjusting layer containing the first and second dopants. This enables the device structure having the current blocking region in a part of the upper side of the active layer to be formed by a single crystal growth step.

Still furthermore, since the n-type compound semiconductor substrate is used, the current path adjusting layer composed of the p-type current blocking region and the n-type current passing region can be disposed under the layered structure so as to be close to the substrate. Because of this, the configuration of the grooves formed on the substrate is sufficiently transferred to the current path adjusting layer, the carrier concentration of the p-type current blocking region and that of the n-type current passing region, depending upon the orientation of the underlying layer, can be set at desired large values with respect to the respective conductivities. This enables the function of the current path adjusting layer to be more effective.

According to the present invention, the current blocking region of the current path adjusting layer has a high resistance, so that the doping amount of either one of the first and second dopants can be reduced.

According to the present invention, the second n-type lower cladding layer is provided between the n-type compound semiconductor substrate and the current path adjusting layer. Therefore, the thickness of the n-type lower cladding layer between the current path adjusting layer and the active layer can be made thin, and a current flowing to the region of the active layer opposing the p-type electrode can be reduced. Thus, a current can be diffused in a wider region, the amount of light emitted in the active layer other than the groove-formed region increases, and the efficiency at which light is taken out can be improved.

According to the present invention, the current diffusion layer is provided between the p-type electrode and the layered structure including the active layer. Therefore, a current diffuses in the current diffusion layer while flowing from the p-type electrode to the active layer, the amount of light emitted in regions other than that of the active layer opposing the p-type electrode increases, and the efficiency at which light is taken out improves. Furthermore, by allowing the current diffusion layer to have a bandgap wider than that of the active layer, the efficiency at which light is taken out can be improved without causing light generated in the active layer to be absorbed by the current diffusion layer, whereby the semiconductor light-emitting device with higher brightness can be obtained.

According to the present invention, in the above-mentioned semiconductor light-emitting device, the light reflective layer is provided on the surface of the compound semiconductor substrate, so that light emitted from the active layer to the substrate side is reflected by the reflective layer. Thus, the light is not absorbed by the substrate having a higher refractive index and the efficiency at which light is taken out can be improved.

According to the present invention, in the above-mentioned semiconductor light-emitting device, the layered structure having a DH junction portion is made of a $(Al_xGa_{1-x})_{1-y}In_yP$ layer ($0 \leq x \leq 1$, $0 \leq y \leq 1$), emitted light in a visible light region from red to green can be realized by changing the Al composition.

According to the present invention, the current path adjusting layer is made of a $(Al_xGa_{1-x})_{1-y}In_yP$ layer ($0 \leq x \leq 1$, $0 \leq y \leq 1$), so that light emitted by the active layer can be prevented from being absorbed by the current path adjusting layer. Moreover, the conductivity of the current path adjusting layer doped with Zn and Se depends upon the orientation of the substrate.

According to the present invention, the current diffusion layer is made of $Al_xGa_{1-x}As$. Therefore, light emitted by the active layer can be prevented from being absorbed by the current path adjusting layer, and the current diffusion layer is lattice-matched with the substrate, whereby the semiconductor layers between the current diffusion layer and the substrate are allowed to have satisfactory crystallinity without any strain.

According to the present invention, the current diffusion layer is made of a $(Al_xGa_{1-x})_{1-y}In_yP$ layer ($0 \leq x \leq 1$, $0 \leq y \leq 1$). Therefore, the current diffusion layer can have a bandgap larger than that made of $Al_xGa_{1-x}As$, and the absorption of light emitted int he active layer by the current diffusion layer can be reduced, and the efficiency at which light is taken out can be improved.

According to the present invention, the grooves are formed in a predetermined region of the p-type compound semiconductor substrate, the conductivity of the semiconductor layer grown on the substrate containing predetermined dopants is made different depending upon the orientation of each slope of the grooves and the orientation of the flat region of the substrate surface, the layered structure having a DH junction portion is formed on the substrate, and the current path adjusting layer is formed on the layered structure while being simultaneously doped with the first and second dopants with different conductivities. Therefore, the current blocking region is formed in a region of the current path adjusting layer opposing the groove-formed region of the substrate so as to have a conductivity of the first dopant based on the orientation of each slope of the grooves, and the current passing region is formed in a region of the current path adjusting layer opposing the flat region of the substrate so as to have a conductivity of the second dopant based on the orientation of the flat region.

Because of the above, a semiconductor light-emitting device having the current blocking region in the layered structure of the semiconductor layers can be produced by single MOCVD growth, substantially reducing cost and greatly improving yield. In addition, the current blocking region in the current path adjusting layer can be selectively formed in the current path adjusting layer during MOCVD growth, so that an etching treatment for forming the current blocking region is not required. More specifically, the step of growing the semiconductor layers on the substrate, taking out the substrate from a growth apparatus, and subjecting the substrate to an etching treatment is not required. Thus, the surface of the semiconductor layers during growth are not exposed to the air, and the problem related to crystallinity at the re-growth interface caused by oxidation of the re-growth interface and mixing of impurities therein can be overcome. As a result, the characteristics and reliability of the semiconductor light-emitting device can be maintained at a high level.

According to the present invention, the surface of the n-type compound semiconductor substrate is treated so that the groove-formed region and the flat region have selectivity with respect to the conductivity of the semiconductor layer to be grown thereon, containing predetermined dopants, the current path adjusting layer is formed on the substrate while being simultaneously doped with the first and second dopants with different conductivities, and the layered structure including the active layer is formed on the current path adjusting layer. Therefore, the current blocking region is formed in a region of the current path adjusting layer corresponding to the groove-formed region of the substrate and the current passing region is formed in a region of the current path adjusting layer corresponding to the flat region of the substrate. Because of this, the semiconductor light-emitting device having the current blocking region can be provided by single MOCVD growth and substantial reduction in cost and improvement of yield can be realized, and the problem related to crystallinity at the re-growth interface can be overcome.

Furthermore, since an n-type compound semiconductor substrate is used, the current path adjusting layer composed of the p-type current blocking region and the n-type current passing region can be disposed under the layered structure so as to be close to the substrate. Because of this, the configuration of the grooves formed on the substrate is sufficiently transferred to the current path adjusting layer, and the carrier concentrations of the p-type current blocking region and the n-type current passing region can be controlled so as to be high with good precision.

According to the present invention, in a method for producing the above-mentioned semiconductor light-emitting device, Zn and Se are used as the group-II dopant and the group-IV dopant, respectively. Therefore, the conductivities of the p-type current blocking region and the n-type current passing region based on the orientation of the substrate can be prescribed so that each region has a high carrier concentration. Thus, the function of the current path adjusting layer can be made effective.

According to the present invention, the current path adjusting layer composed of the current blocking region and the current passing region is provided on the layered structure including the active layer formed on the surface side of the n-type compound semiconductor substrate, and the p-type electrode is provided on the upper side of the current path adjusting layer so as to oppose the current blocking region. Therefore, a current flowing from the p-type electrode to the active layer is blocked by the current blocking region and widely spreads to both sides thereof. Because of this, the amount of LED light emitted in the regions of the active layer other than that right below the p-type electrode increases and the LED light thus generated is taken out of the device effectively without being blocked by the p-type electrode. This enables the efficiency at which LED light is taken out to improve and the semiconductor light-emitting device to have a higher brightness.

Furthermore, the n-type compound semiconductor substrate has the groove-formed region and the flat region, and the conductivities of the semiconductor layer grown on the substrate, containing predetermined dopants, depend upon the orientation of each slope of the grooves and that of the flat region of the substrate. Therefore, the current blocking and the current passing region are capable of being simultaneously formed in the current path adjusting layer containing the first and second dopants. This enables the device structure having the current blocking region in a part below the active layer to be formed by a single crystal growth step.

Furthermore, since the p-type electrode is not provided in a region on the surface of the substrate from which LED light is emitted, the LED light is not blocked. In addition, the surface of this region has an uneven shape corresponding to that of the groove-formed region of the substrate; therefore, the ratio of the LED light incident upon the surface of the substrate from the inside of the device at an angle equal to or larger than a critical angle decreases, whereby the efficiency at which light is taken out of the upper surface of the substrate improves.

Since the current passing region of the current path adjusting layer is positioned so as to correspond to the groove-formed region of the substrate, so that the light-emitting region of the active layer is also positioned so as to correspond to the groove-formed region and has an uneven shape corresponding to that of the groove-formed region. BEcause of this, the light-emitting area of the active layer becomes larger than that of LEDs having a flat light-emitting region and the amount of light emitted increases, whereby the efficiency at which light is taken out increases.

Furthermore, by allowing the current path adjusting layer to have a bandgap wider than that of the active layer, the efficiency at which light is taken out can be improved without causing light generated in the active layer to be absorbed by the current path adjusting layer, whereby a semiconductor light-emitting device with a higher brightness can be obtained.

Still furthermore, by making the orientation of each slope of the grooves of the groove-formed region of the substrate an A-face, even when a AlGaInP mixed semiconductor is grown by an MOCVD method, a super-lattice is not formed int he light-emitting region of the activel layer and the wavelength of the emitted light can be prevented from becoming larger due to the super-lattice. Because of this, it is not required to increase the Al composition of the active layer so as to obtain a predetermined wavelength, and a semiconductor light-emitting device with a high brightness and high reliability can be obtained.

In addition, since the region of the substrate right below the p-type electrode is flat, the surface of the p-type electrode becomes flat and the adhesion between the p-type electrode and the wire to be bonded thereto can be enhanced.

According to the present invention, the p-type current diffusion layer is provided in the upper portion of the current path adjusting layer. Therefore, a curernt can be diffused in the p-type current diffusion layer and light can be emitted in a wider region other than that of the active layer corresponding to the p-type electrode. By allowing the current diffusion layer to have a bandgap larger than that of the active layer, light from the active layer can be prevented from being absorbed by the current diffusion layer, the efficiency at which light is taken out is improved, and a semiconductor light-emitting device with a higher brightness can be obtained.

According to the present invention, the p-type current diffusion layer is composed of the current blocking region and the current passing region, which has the same structure as that of the above-mentioned current path adjusting layer. Therefore, a current can be diffused to a wider region in a current path from the p-type electrode to the active layer. This increases the amount of light emitted outside of the region of the active layer right below the p-type electrode, and the efficiency at which light is taken out can be improved.

According to the present invention, conductivity of the compound semiconductor substrate is prescribed to be a p-type, the layered structure having a DH junction portion includes an active layer diposed between the p-type lower cladding layer and the n-type upper cladding layer, and the current path adjusting layer having the n-type current blocking region and the p-type current passing region is positioned between the layered structure and the substrate. Therefore, the function of the current path adjusting layer in the semiconductor light-emitting device can be made more effective.

More specifically, since the p-type compound semiconductor substrate is used, the current path adjusting layer composed of the n-type current blocking region and the p-type current passing region can be disposed under the layered structure so as to be close to the substrate. Because of this, the configuration of the grooves formed on the substrate is sufficiently transferred to the current path adjusting layer, the carrier concentration of the n-type current blocking region and that of the p-type current passing region, depending upon the orientation of the underlying layer, can be set at desired large values with respect to the respective conductivities. This enables the function of the current path adjusting layer to be more effective.

According to the present invention, the current blocking region of the current path adjusting layer has a high resistance, so that the doping amount of either one of the first and second dopants can be reduced.

According to the present invention, the current diffusion layer is provided on the layered structure having a DH junction portion. Therefore, a current can be diffused in the current diffusion layer, and light can be emitted in a wider region other than that of the active layer corresponding to the n-type electrode.

The degree of carrier movement in the n-type current diffusion layer is larger than that in the p-type current diffusion layer. Therefore, the n-type current diffusion layer has greater current diffusion effect and enables light to be emitted in wider regions. By allowing the current diffusion layer to have a bandgap larger than that of the active layer, the efficiency at which light is taken out can be improved without causing light generated in the active layer to be absorbed by the current diffusion layer, whereby a semiconductor light-emitting device with higher brightness can be obtained.

According to the present invention, in each of the above-mentioned semiconductor light-emitting devices, the light reflective layer is provided on the surface of the compound semiconductor substrate, so that light emitted from the active layer to the substrate side is reflected by the reflective layer. Thus, the light is not absorbed by the substrate having a higher refractive index and the efficiency at which light is taken out can be improved.

According to the present invention, the surface of the n-type compound semiconductor substrate is treated so that the groove-formed region and the flat region have selectivity with respect to the conductivity of the semiconductor layer to be grown thereon, containing predetermined dopants, the layered structure including the active layer is formed on the substrate, and the current path adjusting layer is formed on the layered structure while being simultaneously doped with the first and second dopants with different conductivities. Therefore, the current blocking region is formed in a region of the current path adjusting layer corresponding to the groove-formed region of the substrate and the current passing region is formed in a region of the current path adjusting layer corresponding to the flat region of the substrate. Because of this, the semiconductor light-emitting device having the current blocking region can be produced by a single MOCVD growith. More specifically, the step of growing the semiconductor layers on the substrate, taking out the substrate from a growth apparatus, and subjecting the substrate to an etching treatment is not required. Thus, the surface of the semiconductor layers during growth are not exposed to the air, and the problem related to crystallinity at the re-growth interface caused by oxidation of the re-growth interface and mixing of impurities therein can be overcome. In addition, cost can be substantially reduced and yield can be remarkably enhanced.

According to the present invention, the groove-formed region and the flat region are formed on the surface of the substrate; the current path adjusting layer is formed on the substrate; and the p-type lower cladding layer, the active layer, and the n-type upper cladding layer are successively grown on the current path adjusting layer to form the layered structure. Therefore, the carrier concentrations of the current blocking region and the current passing region having the respective conductivities of the current path adjusting layer can be made high.

More specifically, since a p-type compound semiconductor substrate is used, the current path adjusting layer composed of the n-type current blocking region and the p-type current passing region can be disposed under the layered structure so as to be close to the substrate. Because of this, the configuration of the grooves formed on the substrate is sufficiently transferred to the current path adjusting layer, and the carrier concentration of the n-type current blocking region and that of the p-type current passing region can be controlled with good precision so as to be high.

According to the present invention, since Zn and Se are used as the group-II dopant and the group-VI dopant, respectively, the carrier concentrations of the p-type current blocking region and the n-type current passing region based on the orientation of the substrate are made high and the function of the current path adjusting layer is made effective.

According to the present invention, the compound semiconductor substrate has an uneven surface, the light-emitting portion disposed on the substrate at least includes the lower cladding layer with a first conductivity type, the active layer, and the upper cladding layer with a second conductivity type, and each semiconductor layer included in the light-emitting portion has an uneven shape corresponding to that of the substrate surface. Therefore, the device surface from which the LED light is emitted also has an uneven shape, and the ratio of the LED light incident upon the device surface at an angle equal to or larger than a critical angle decreases. In addition, even when the LED light is incident upon the device surface at an angle equal to or larger than a critical angle and reflected, the LED light is incident upon the substrate surface again at an angle smaller than a critical angle and is taken out of the device. Thus, the efficiency at which the LED light is taken out of the device surface improves.

Furthermore, the active layer which is an LED light-emitting region has an uneven shape corresponding to that of the substrate surface. Thus, the light-emitting area becomes larger than that of the flat active layer, and the LED light-emitting efficiency increases.

The increase in the light-emitting efficiency and the improvement of the efficiency at which light is taken out enable the semiconductor light-emitting device to have a higher brightness.

According to the present invention, a plurality of stripe-shaped grooves are formed on the surface of the compound semiconductor substrate so that the substrate has an uneven shape, and the orientation of each slope of the grooves is made an A-face based on a (100) plane of the semiconductor crystal. Therefore, even when a AlGaInP mixed semiconductor material is grown on the surface of the substrate by an MOCVD method, a super-lattice is not formed and LED light can be prevented from having a longer wavelength due to the super-lattice. Because of this, it is not required to adjust the wavelength of the LED light by increasing the Al composition, and a semiconductor light-emitting device with a high brightness and high reliability can be obtained.

Thus, the invention described herein makes possible the advantages of (1) providing a semiconductor light-emitting device and a method for producing the same in which the efficiency at which light is taken out is enhanced by allowing a current injected into an active layer to widely diffuse into the outside of a region right below an electrode on the surface of the device and a device structure with a current blocking region formed on a part above the active layer can be obtained by a single crystal growth step; and (2) providing a semiconductor light-emitting device and a method for producing the same in which the efficiency at which light is taken out is enhanced by suppressing the reflection of the LED light by the surface of the device as well as by allowing a current injected into the active layer to diffuse, emitted light with a desired light-emitting wavelength can be obtained without decreasing light-emitting efficiency and reliability by preventing a super-lattice from being formed when an AlGaInP mixed semiconductor material is used, and a device structure with a current blocking region formed on a part above the active layer can be formed by a single crystal growth step.

These and other advantages of the present invention will become apparent to those skilled in the art upon reading and understanding the following detailed description with reference to the accompanying figures.

BRIEF DESCRIPTION OF THE DRAWINGS

FIG. 1A is a cross-sectional view of an LED of the first example according to the present invention; FIG. 1B is a plan view of a substrate included in the LED; and FIG. 1C is a cross-sectional view of the substrate included in the LED.

FIG. 9 is a cross-sectional view of an LED of the seventh example according to the present invention.

FIG. 15 is a cross-sectional view of an LED of the twelfth example according to the present invention.

FIG. 20 is a cross-sectional view of an LED of the seventeenth example according to the present invention.

DESCRIPTION OF THE PREFERRED EMBODIMENTS

Hereinafter, the present invention will be described by way of illustrative examples with reference to the drawings.

EXAMPLE 1

Figure 2A:
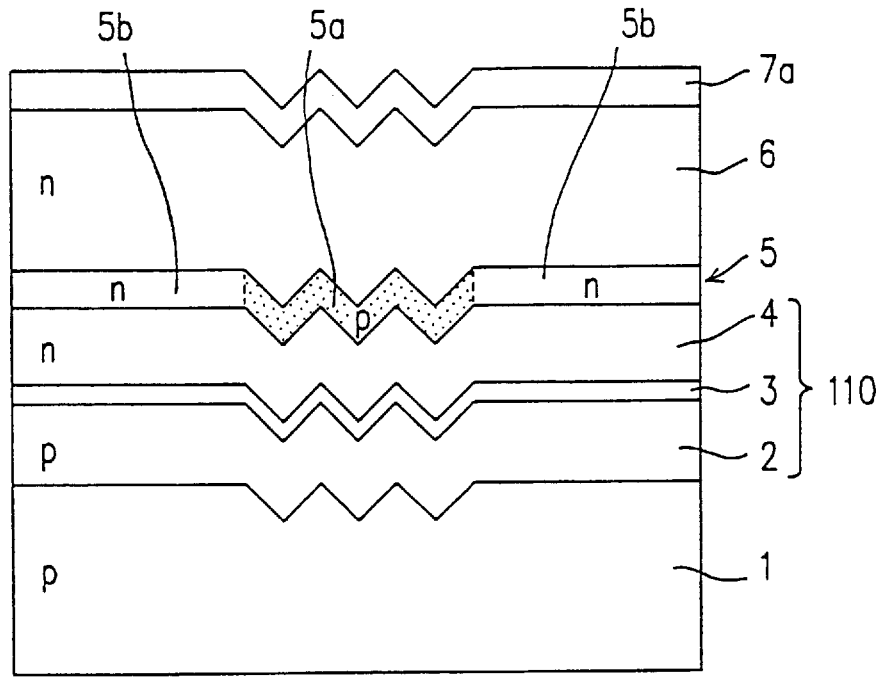
FIG. 2A is a view showing the steps of crystal growth in a method for producing the LED of the first example according to the present invention.
Figure 2B:
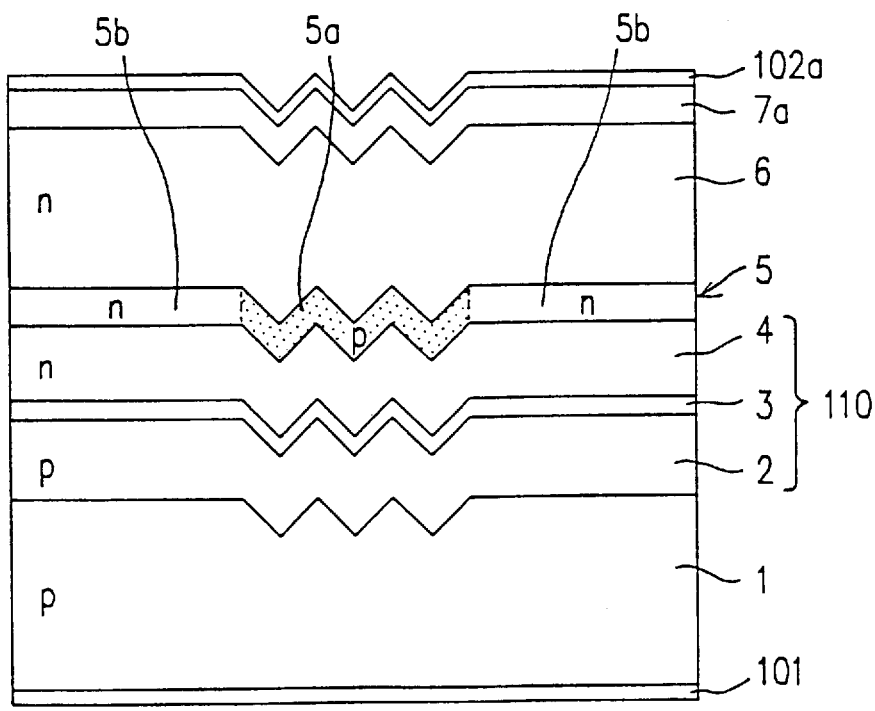
FIG. 2B is a view showing the steps of forming metal layers to be electrodes.

FIGS. 1A to 1C are views each illustrating an LED as a semiconductor light-emitting deviced of the first example according to the present invention. Specifically, FIG. 1A is a cross-sectional view showing a structure of the LED; and FIGS. 1B and 1C are a plan view and a cross-sectional view of a substrate included in the LED. FIGS. 2A and 2B illustrate a method for producing the LED. Specifically, FIG. 2A is a view showing the steps of crystal growth of various semiconductor layers included in the LED; and FIG. 2B is a view showing the steps of forming electrodes in the LED.

In these figures, the reference numeral 100a denotes an LED of the present example in which a layered structure 110 with a DH junction portion including a p-type lower cladding layer 2, an active layer 3, and an n-type upper cladding layer 4 in this order is provided on the surface of a p-type GaAs substrate 1. In the present example, a current path adjusting layer 5 composed of a p-type semiconductor region (current blocking region) 5a for blocking current and n-type semiconductor regions (current passing regions) 5b for passing current is provided on the n-type cladding layer 4 of the layered structure 110. A p-type GaAs contact layer 7 is provided above the current path adjusting layer 5 via an n-type current diffusion layer 6 so as to be positioned right above the current blocking region 5a of the current path adjusting layer 5. An n-type electrode 102 made of AuGa is provided on the p-type GaAs contact layer 7. A p-type electrode 101 is formed over the entire reverse surface of the p-type GaAs substrate 1.

The p-type GaAs substrate 1 has a plurality of stripe-shaped V-grooves $1a_1$ with a depth of 4.3 $\mu$m and a width 6 $\mu$m in a circular region (groove-formed region) 1a with a diameter of 200 $\mu$m at the center of the substrate 1. Regions other than the groove-shaped region 1a of the substrate 1 are flat regions 1b each having a flat surface. The flat regions 1b of the substrate 1 have an orientation of a (100) plane, and each slope of the V-grooves $1a_1$ has an orientation of a (111)A plane.

The lower cladding layer 2, the active layer 3, and the upper cladding layer 4 are respectively made of $(Al_xGa_{1-x})_{1-y}In_yP$ ($0 \leq x \leq 1$, $0 \leq y \leq 1$); the lower cladding layer 2 and the upper cladding layer 4 have a composition ratio, for example, of x=0.70, and y=0.50, and have a thickness of 1.0 $\mu$m; the lower cladding layer 2 has a Zn carrier concentration of $1 \times 10^{18}$ cm$^{-3}$ and the upper cladding layer 4 has a Si carrier concentration of $5 \times 10^{17}$ cm$^{-3}$. The active layer 3, for example, has a composition ratio of x=0.30 and y=0.50 and a thickness of 1.0 $\mu$m.

The current path adjusting layer 5 is also made of $(Al_xGa_{1-x})_{1-y}In_yP$ ($0 \leq x \leq 1$, $0 \leq y \leq 1$), has a composition ratio of x=0.70 and y=0.50 and a thickness of 7.0 $\mu$m. The current path adjusting layer 5 is doped with Zn as a group-II dopant and with Se as a group-VI dopant. The current blocking region 5a of the current path adjusting layer 5 is positioned right above the groove-formed region 1a of the substrate 1 and has a carrier concentration of $3 \times 10^{18}$ cm$^{-3}$, exhibiting a p-type conductivity of the Zn dopant, based on the (111)A plane which is an orientation of each slope of the grooves $1a_1$ of the substrate 1. The current passing regions 5b of the current path adjusting layer 5 are positioned above the flat regions 1b of the substrate 1, and have a carrier concentration of $3 \times 10^{18}$ cm$^{-3}$, exhibiting an n-type conductivity of the Se dopant, based on the (100) plane which is an orientation of the flat region 1b.

The n-type current diffusion layer 6 is made of n-type $Al_xGa_{1-x}As$ ($0 \leq x \leq 1$) and has a composition ratio of x=0.70 and a thickness of 5 $\mu$m. The n-type current diffusion layer 6 and the n-type GaAs contact layer 7 have a carrier concentration of $5 \times 10^{18}$ cm$^{-3}$, respectively.

Hereinafter, a method for producing the LED 100a will be described.

A plurality of stripe-shaped grooves $1a_1$ are formed by etching in a circular region with a diameter of 200 $\mu$m on the p-type GaAs substrate 1 so as to have a depth of 4.3 $\mu$m, a width of 6 $\mu$m, and an orientation of a slope of, for example, a (111)A plane (see FIGS. 1A and 1B).

Then, each of the semiconductor layers 2 to 7 is formed on the substrate 1, which was subjected to the etching treatment, by an MOCVD method during the first crystal growth step (FIG. 2A).

Specifically, p-type $(Al_{0.7}Ga_{0.3})_{0.5}In_{0.5}P$ is grown as the p-type lower cladding layer 2 so as to have a thickness of about 1.0 $\mu$m and a Zn carrier concentration of $1 \times 10^{18}$ cm$^{-3}$. Then, $(Al_{0.3}Ga_{0.7})_{0.5}In_{0.5}P$ is grown as the active layer 3 so as to have a thickness of about 0.50 $\mu$m, and n-type $(Al_{0.7}Ga_{0.3})_{0.5}In_{0.5}P$ is grown as the n-type upper cladding layer 4 so as to have a thickness of about 1 $\mu$m and a Si carrier concentration of $5 \times 10^{17}$ cm$^{-3}$. At this time, the surface configuration of the substrate 1 is transferred to the semiconductor layers grown thereon. That is, a region of the surface of the n-type upper cladding layer 4 corresponding to the groove-formed region 1a of the substrate 1 has a plurality of grooves whose crystal orientation of a slope is (111)A, and regions of the surface of the n-type upper cladding layer 4 corresponding to the flat regions 1b of the substrate 1 have a flat face whose crystal orientation is (100).

Furthermore, $(Al_{0.7}Ga_{0.3})_{0.5}In_{0.5}P$ is grown as the current path adjusting layer 5 on the surface of the n-type upper cladding layer 4 so as to have a thickness of about 0.7 $\mu$m while being simultaneously doped with Zn (group-II dopant) and Se (group-VI dopant).

Figure 3:
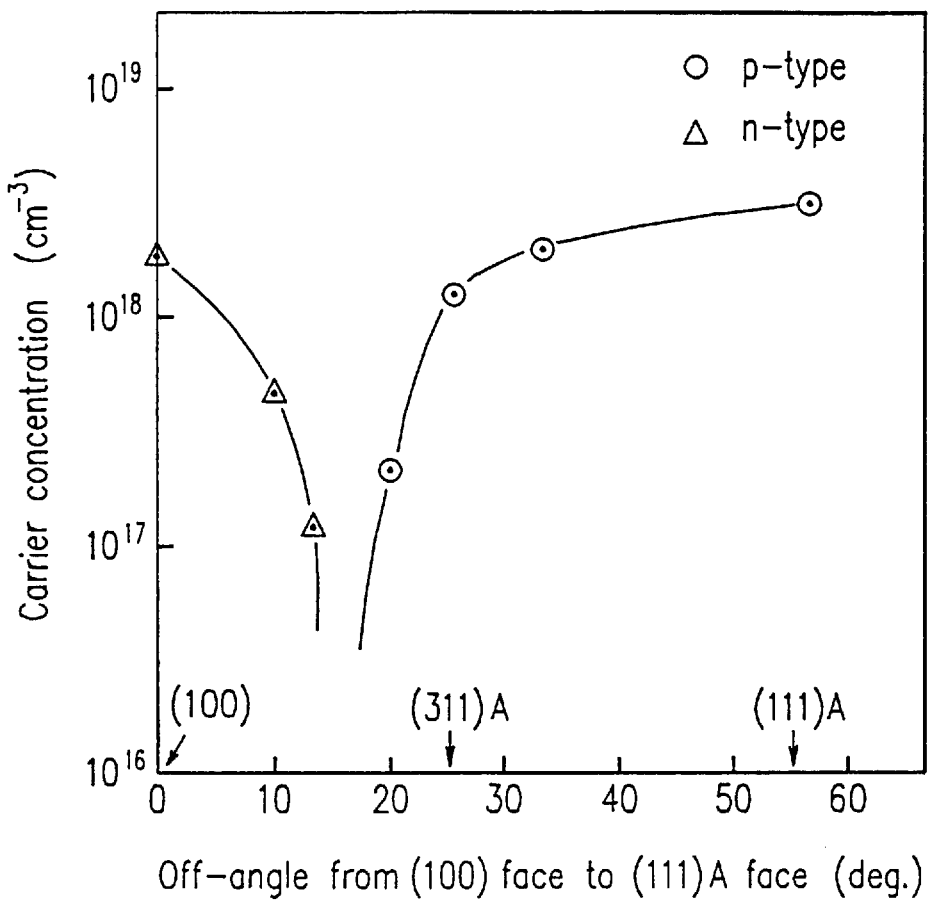
FIG. 3 is a graph showing the dependency of the carrier concentration of an InGaAlP layer grown while being simultaneously doped with Zn and Se on the orientation of the underlying surface.

It is known that when AlGaInP is grown while being simultaneously doped with Zn (group-II dopant) and Se (group-VI dopant), the conductivity and carrier concentration thereof change due to the orientation of the underlying semiconductor crystal. FIG. 3 shows the experimental result of changes in conductivity and carrier concentration with respect to an off-angle from the (100)A plane to the (111)A plane. In this figure, ○ and Δ represent the p-type carrier concentration and the n-type carrier concentration with respect to an off-angle.

As is understood from this figure, when AlGaInP is grown while being simultaneously doped with Zn and Se at $3 \times 10^{18}$ cm$^{-3}$, respectively, a p-type semiconductor region with a carrier concentration $3 \times 10^{18}$ cm$^{-3}$ is obtained on a (311)A plane and the (111)A plane, and an n-type semiconductor region with a carrier concentration of $3 \times 10^{18}$ cm$^{-3}$ is obtained on the (100) plane.

Thus, when $(Al_{0.7}Ga_{0.3})_{0.5}In_{0.5}P$ is grown on the n-type upper cladding layer 4 while being simultaneously doped with Zn and Se at $3 \times 10^{18}$ cm$^{-3}$, a p-type semiconductor region with a carrier concentration of $3 \times 10^{18}$ cm$^{-3}$ is formed, as the current blocking region 5a, in a region of the n-type upper cladding layer 4 where the (111) A plane is exposed, i.e., a region corresponding to the groove-formed region 1a of the substrate 1, and n-type semiconductor regions with a carrier concentration of $3 \times 10^{18}$ cm$^{-3}$ are formed, as the current passing regions 5b, in regions of the n-type upper cladding layer 4 where the (100) plane is exposed, i.e., regions corresponding to the flat regions 1b of the substrate 1.

Then, n-type $Al_{0.7}Ga_{0.3}As$ is grown on the current path adjusting layer 5 as the current diffusion layer 6 so as to have a thickness of about 5 µm, and an n-type GaAs layer 7a is grown on the current diffusion layer 6 so as to have a thickness of about 1 µm and a Si carrier concentration of $5\times10^{18}$ cm$^{-3}$.

As shown in FIG. 2B, a AuGe layer 102a is formed on the n-type GaAs layer 7a, and a AuZn layer 101 is formed on the reverse surface of the p-type substrate 1 as a p-type electrode. Thereafter, the n-type GaAs layer 7a and the AuGe layer 102 are selectively etched so that portions thereof positioned right above the groove-formed region 1a of the substrate 1 remain, whereby the n-type GaAs contact layer 7 and the n-type electrode 102 are formed. Thus, the LED 100a is completed (see FIG. 1A).

A voltage of 2 volts is applied to the LED 100a of the present example in a forward direction so that a current of 20 mA flows therethrough. LED light is obtained, which has a luminance of more than 5 cd at a peak wavelength of 584 nm.

When the composition x and y of the $(Al_xGa_{1-x})_{1-y}In_yP$ active layer 3 is set at 0.50, respectively, pure green emitted light having a luminance of more than 3 cd at a peak wavelength of 555 nm is obtained.

In the LED 100a of the present example, the current path adjusting layer 5 composed of the current blocking region 5a and the current passing regions 5b positioned on either side of the current blocking region 5a is formed on the layered structure 110 including the active layer 3 on the p-type GaAs substrate 1, and the n-type electrode 102 is provided above the current path adjusting layer 5 via the current diffusion layer 6 so as to be positioned right above the current blocking region 5a. Therefore, the current diffusion layer 6 allows a current to diffuse from a portion right below the n-type electrode 102 to both sides thereof between the active layer 3 and the n-type electrode 102. Furthermore, a current is not likely to flow to a portion of the active layer 3 right below the n-type electrode 102 because of the current blocking region 5a. The light-emitting region of the active layer 3 is not formed in a region right below the n-type electrode 102 and spreads to both sides of the region. Thus, LED light generated in the active layer 3 is efficiently taken out of a region on the surface of the LED 100a where the n-type electrode 102 is not positioned.

Furthermore, since the current diffusion layer 6 and the current path adjusting layer 5 are made of $(Al_{0.7}GA_{0.3})_{0.5}In_{0.5}P$, they have a bandgap wider than that of the active layer 3 made of $(Al_{0.3}Ga_{0.7})_{0.5}In_{0.5}P$. This does not allow the current diffusion layer 6 and the current path adjusting layer 5 to absorb the LED light from the active layer 3, improving the efficiency at which light is taken out to make the brightness of the LED 100a higher.

In the present example, the p-type GaAs substrate 1 has the (100) plane on its surface, in which the groove-formed region 1a with the stripe-shaped grooves formed therein having a slope of the (111)A plane is partially exposed. Therefore, the (111)A plane in the groove-formed region 1a and the (100) plane of the flat region 1b appear on the surface of the layered structure 110 including the active layer 3, i.e., on the surface of the n-type upper cladding layer 4.

Furthermore, in the present example, AlGaInP is grown on the n-type upper cladding layer 4 while being doped with Zn and Se. Therefore, the current blocking region 5a having an n-type conductivity of the Se dopant is formed on the (100) plane and the current passing regions 5b having a p-type conductivity of the Zn dopant are formed on the (111)A plane. Because of this, a crystal growth process is not interrupted during the step of forming the current path adjusting layer 5 having the current blocking region 5a; and the n-type upper cladding layer 4, the active layer 5, the current diffusion layer 6, and the n-type contact layer 7 are grown during a single MOCVD step. This reduces production cost and substantially increases yield.

In addition, characteristics and reliability can be prevented from being degraded due to the crystallinity at the re-growth interface in the semiconductor layered structure included in the LED.

More specifically, according to the conventional method for producing LEDs, the layered structure including the active layer and the semiconductor layer to be the current blocking layer are grown on the substrate. Thereafter, the substrate (wafer) is taken out of the crystal growth apparatus, and the semiconductor layer is selectively etched to form the current blocking layer. Then, the wafer is placed in the crystal growth apparatus again, and the current diffusion layer is re-grown on the wafer on which the intermediate bandgap layer and the current blocking layer formed thereon are exposed. Therefore, the re-growth interface is likely to be oxidized and impurities are likely to be mixed in the re-growth interface, causing a problem in crystallinity at the re-growth interface and adversely affecting the characteristics and the reliability of the device.

In contrast, according to the method for producing the LED of the present example, each semiconductor layer included in the LED can be formed by a single MOCVD growth process without any re-growth; therefore, high reliability as well as satisfactory characteristics can be obtained.

EXAMPLE 2

Figure 4:
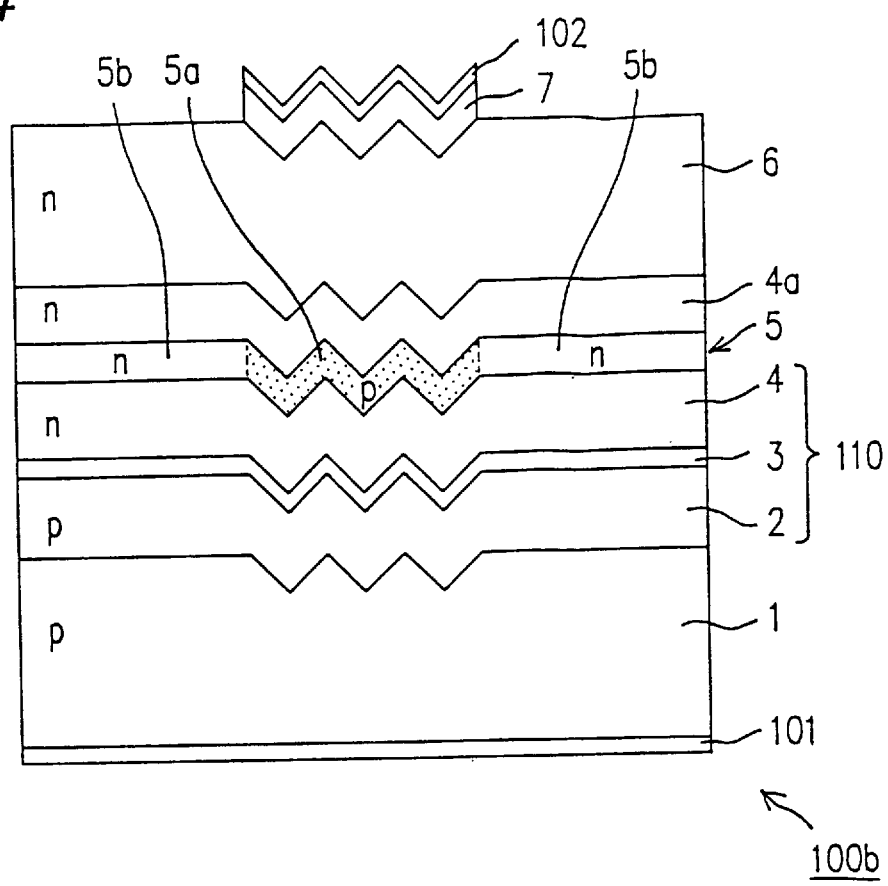
FIG. 4 is a cross-sectional view of an LED of the second example according to the present invention.

FIG. 4 is a cross-sectional view illustrating an LED as a semiconductor light-emiting device of the second example according to the present invention. In this figure, the reference numeral 100b denotes an LED of the present example; and like reference numerals refer to like parts of FIGS. 1A 1B and 1C. The LED 100b is different from the LED 100a of Example 1 in that a second n-type upper cladding layer 4a is provided between the current path adjusting layer 5 and the current diffusion layer 6.

The second n-type upper cladding layer 4a is made of n-type $(Al_{0.7}Ga_{0.5})_{0.3}In_{0.5}P$ with a Si carrier concentration of $5\times10^{17}$ cm$^{-3}$ in the same way as the n-type upper cladding layer 4 between the active layer 3 and the current path adjusting layer 5 and has a thickness of about 1 µm.

A method for producing the LED 100b of the present example is the same as that of the LED 100a of Example 1, except that the second n-type upper cladding layer 4a is formed on the current path adjusting layer 5.

A voltage of 2 volts is applied to the LED 100b of the present example in a forward direction so that a current of 20 mA flows therethrough. LED light is obtained, which has a luminance of more than 5.5 cd at a peak wavelength of 584 nm.

When the composition x and y of the $(Al_xGa_{1-x})_{1-y}In_yP$ active layer 3 is set at 0.50, respectively, pure green emitted light having a luminance of more than 3.5 cd at a peak wavelength of 555 nm is obtained.

In the present example, the second n-type upper cladding layer 4a is provided between the current path adjusting layer 5 and the current diffusion layer 6, so that the thickness of the n-type upper cladding layer 4 between the current path adjusting layer 5 and the active layer 3 can be made as small as about 0.5 µm. This allows the current blocking region 5a of the current path adjusting layer 5 to prevent a current which has once diffused from spreading into the underside of the current blocking region 5a, reducing a current flown into a region of the active layer 3 right below the n-type electrode 102. As a result, the amount of emitted light increases in the region of the active layer 3 other than that right below the n-type electrode 102, and the efficiency at which light is taken out can be increased, compared with the LED 100a of Example 1.

EXAMPLE 3

Figure 5:
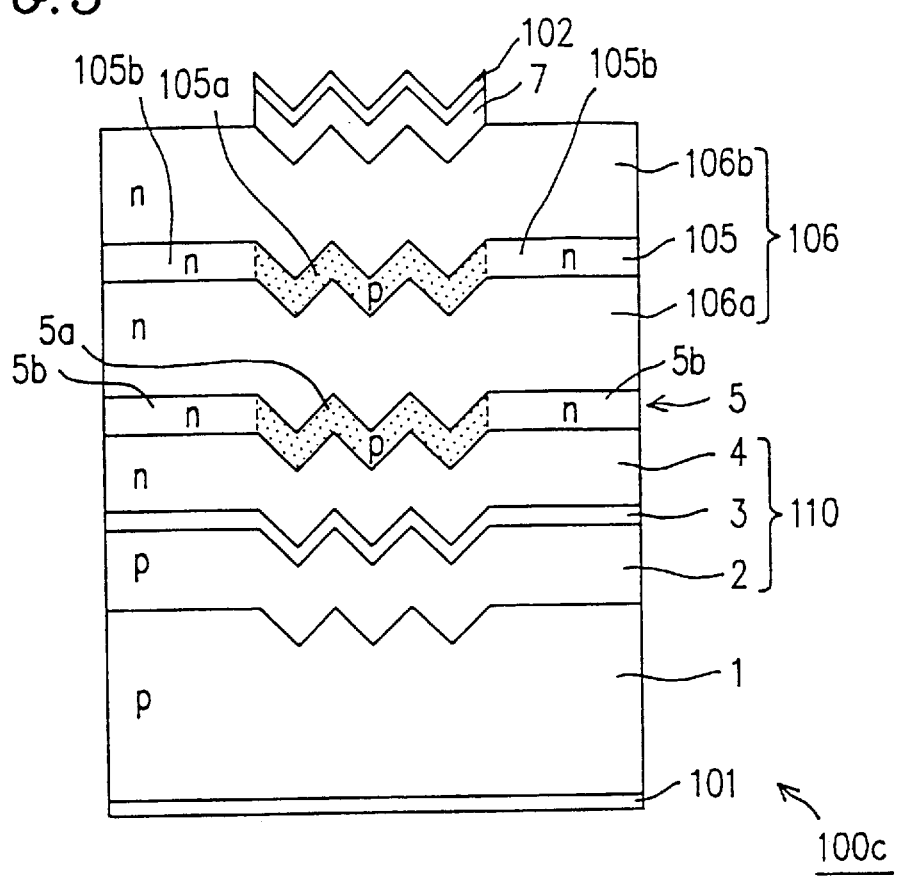
FIG. 5 is a cross-sectional view of an LED of the third example according to the present invention.

FIG. 5 is a cross-sectional view illustrating an LED as a semiconductor light-emitting device of the third example according to the present invention. In this figure, the reference numeral 100c denotes an LED of the present example. In the LED 100c, an n-type current diffusion layer 106 having a second current path adjusting layer 105 formed therein is used in place of the current diffusion layer 6 of Example 1, and the second current path adjusting layer 105 is composed of a current blocking region 105a positioned right below the n-type electrode 102 and current passing regions 105b positioned on either side of the current blocking region 105a in the same way as in the current path adjusting layer 5 of Example 1.

The second current path adjusting layer 105 is made of a $(Al_{0.7}GA_{0.3})_{0.5}In_{0.5}P$ layer having a thickness of 0.7 μm doped with Zn and Se, and the current blocking region 105a of the current path adjusting layer 105 is the one with a carrier concentration of $3\times10^{18}$ cm$^{-3}$ exhibiting a p-type conductivity of the Zn dopant, based on the (111)A which is a crystal orientation of each slope of the grooves $1a_1$ of the substrate 1.

The reference numerals 106a and 106b denote the lower and upper portions of the n-type current diffusion layer 106, respectively. The lower and upper portions 106a and 106b have a thickness of 2.5 μm, respectively.

A method for producing the LED 100c of the present example is the same as that of the LED 100a of Example 1, except that the second current path adjusting layer 105 is formed in the course of growing the current diffusion layer.

A voltage of 2 volts is applied to the LED 100c of the present example in a forward direction so that a current of 20 mA flows therethrough. LED light is obtained, which has a luminance of more than 5.1 cd at a peak wavelength of 584 nm.

When the composition x and y of the $(Al_xGa_{1-x})_{1-y}In_yP$ active layer 3 is set at 0.50, respectively, pure green emitted light having a luminance of more than 3.2 cd at a peak wavelength of 555 nm is obtained.

In the present example, the second current path adjusting layer 105 is provided in the n-type current diffusion layer 106 in addition to the current path adjusting layer 5 provided between the n-type upper cladding layer 4 and the current diffusion layer 106. Therefore, a current flowing between the n-type electrode 102 and the active layer 3 is blocked at two places, i.e., by the current blocking region 5a of the current path adjusting layer 5 and the current blocking region 105a of the second current path adjusting layer 105, and diffuses to the outside of the region of the active layer 3 right below the n-type electrode 102. Thus, the current flowing into the active layer 3 can be diffused into a much wider region. This reduces the amount of emitted light in the region of the active layer 3 right below the n-type electrode 102 and the vicinity thereof, and the amount of emitted light increases by the reduced amount in regions away from that of the active layer 3 right below the n-type electrode 102, whereby the efficiency at which light is taken out can be increased.

EXAMPLE 4

Figure 6:
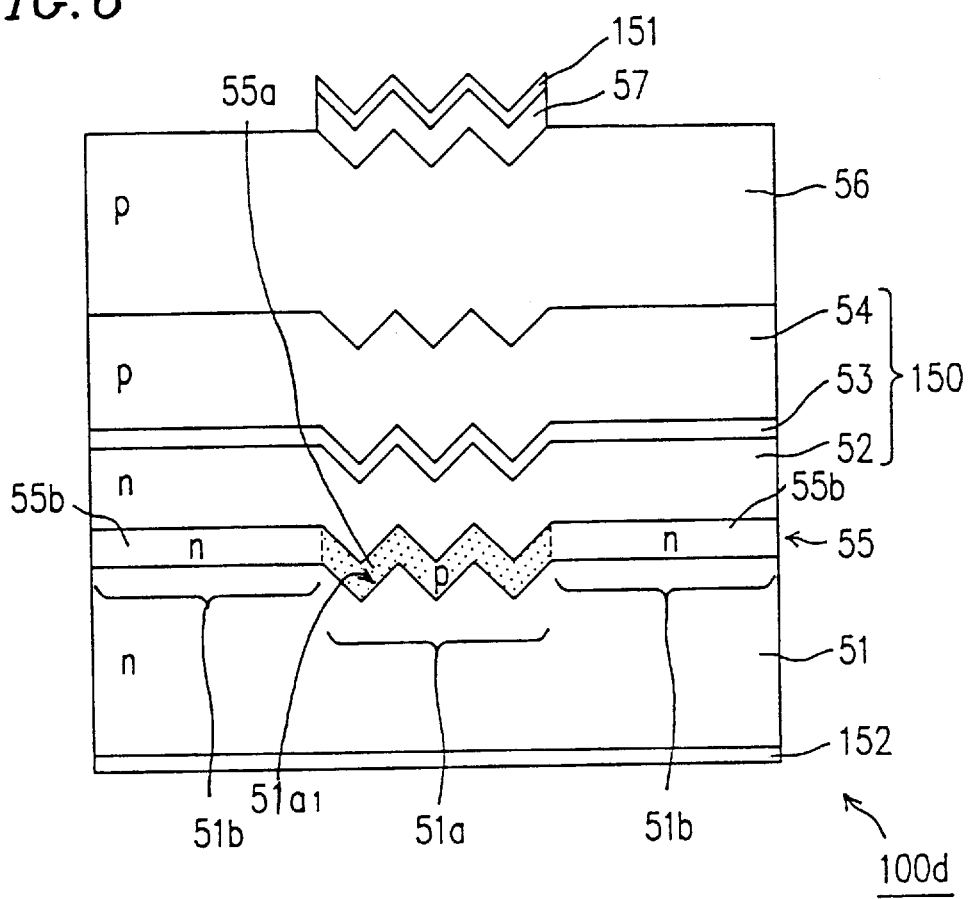
FIG. 6 is a cross-sectional view of an LED of the fourth example according to the present invention.

FIG. 6 is a cross-sectional view illustrating an LED as a semiconductor light-emitting device of the fourth example according to the present invention. In this figure, the reference numeral 100d denotes an LED of the present example. The LED 100d includes an n-type GaAs substrate 51, on which a current path adjusting layer 55 composed of a p-type semiconductor region (current blocking region) 55a blocking a current and n-type semiconductor regions (current passing regions) 55b passing a current is provided.

A layered structure 150 having a DH junction portion is provided on the current path adjusting layer 55. The layered structure 150 includes an n-type lower cladding layer 52, an active layer 53, and a p-type upper cladding layer 54 in this order from the substrate side.

Furthermore, an n-type GaAs contact layer 57 is provided above the layered structure 150 via a p-type current diffusion layer 56, and a p-type electrode 151 made of AuZn is disposed on the n-type GaAs contact layer 57. An n-type electrode 152 made of AuGe is formed over the entire reverse surface of the n-type GaAs substrate 51.

The n-type GaAs substrate 51 has a plurality of stripe-shaped V-grooves $51a_1$ with a depth of 4.3 μm and a width 6 μm in a circular region (groove-formed region) 51a with a diameter of 200 μm at the center of the substrate 51. The regions other than the groove-shaped region 51a of the substrate 51 are flat regions 51b with a flat surface. The flat regions 51b of the substrate 51 have an orientation of a (100) plane, and each slope of the V-grooves $51a_1$ has an orientation of a (111)A plane.

The current path adjusting layer 55 is made of $(Al_xGa_{1-x})_{1-y}In_yP$ ($0\leq x\leq 1$, $0\leq y\leq 1$), where x is 0.70 and y is 0.50, and has a thickness of 0.7 μm. The current path adjusting layer 55 is doped with Zn as a group-II dopant and Se as a group-VI dopant. The current blocking region 55a of the current path adjusting layer 55 is disposed on the groove-formed region 51a of the substrate 51 and has a carrier concentration of $3\times10^{18}$ cm$^{-3}$, exhibiting a p-type conductivity of the Zn dopant, based on the (111)A plane which is an orientation of each slope of the grooves $51a_1$ of the substrate 51. The current passing regions 55b of the current path adjusting layer 55 are disposed on the flat regions 51b of the substrate 51 and have a carier concentration of $3\times10^{18}$ cm$^{-3}$, exhibiting an n-type conductivity of the Se dopant, based on the (100) plane which is an orientation of the flat region 51b.

The lower cladding layer 52, the active layer 53, and the upper cladding layer 54 are respectively made of $(Al_xGa_{1-x})_{1-y}In_yP$ ($0\leq x\leq 1$, $0\leq y\leq 1$); the n-type lower cladding layer 52 and the p-type upper cladding layer 54 have a composition ratio, for example, of x=0.70, and y=0.50, and have a thickness of 1.0 μm; the n-type lower cladding layer 52 has a Si carrier concentration of $5\times10^{17}$ cm$^{-3}$ and the p-type upper cladding layer 54 has a Zn carrier concentration of $1\times10^{18}$ cm$^{-3}$. The active layer 53, for example, has a composition ratio of x=0.30 and y=0.50 and a thickness of 0.50 μm.

Furthermore, the p-type current diffusion layer 56 is made of p-type $Al_xGa_{1-x}As$ ($0\leq x\leq 1$), and has a composition ratio of x=0.70 and a thickness of 5 μm. The p-type current diffusion layer 56 and the p-type GaAs contact layer 57 have a Zn carrier concentration of $3\times10^{18}$ cm$^{-3}$, respectively.

Hereinafter, a method for producing the LED 100d will be described.

A plurality of stripe-shaped grooves $51a_1$ are formed by etching in a circular region with a diameter of 200 μm on the n-type GaAs substrate 51 so as to have a depth of 4.3 μm, a width of 6 μm, and a crystal orientation of a slope of, for example, (111)A i the same way as in Example 1 (see FIGS. 1A and 1B).

Then, each of the semiconductor layers 55, 52 to 54, and 56 is formed on the substrate 51, subjected to the etching treatment, by an MOCVD method during the first crystal growth step.

Specifically, after the etching treatment, $(Al_{0.7}Ga_{0.3})_{0.5}In_{0.5}P$ is grown as the current path adjusting layer 55 on the substrate 51 so as to have a thickness of about 0.7 μm while being doped with Zn (group-II dopant) and Se (group-VI dopant). At this time, the p-type semiconductor region with a Zn carrier concentration of $3 \times 10^{18}$ cm$^{-3}$ is formed, as the current blocking region 55a, in a region of the surface of the substrate 51 where the (111)A plane is exposed, i.e., on the groove-formed region 51a of the substrate 51, and an n-type semiconductor region with a Se carrier concentration of $3 \times 10^{18}$ cm$^{-3}$ is formed, as the current passing regions 55b, in regions of the surface of the substrate 51 where the (100) plane is exposed, i.e., on the flat regions 51b of the substrate 51.

Thereafter, $(Al_{0.7}Ga_{0.3})_{0.5}In_{0.5}P$ is grown on the current path adjusting layer 55 while the conductivity and thickness are controlled, whereby the n-type lower cladding layer 52, the active layer 53, the p-type upper cladding layer 54, and the current diffusion layer 56 are grown, and a p-type GaAs layer is grown on the current diffusion layer 56.

Next, a AuZd layer is formed on the p-type GaAs layer, while an AuGe layer 152 is formed on the reverse surface of the n-type substrate 51 as the n-type electrode. Then, the p-type GaAs layer and the AuZn layer thereon are selectively etched so that portions thereof positioned right above the groove-formed region 51a of the substrate 51 remain, whereby the p-type GaAs contact layer 57 and the p-type electrode 151 are formed. Thus, the LED 100d is completed (see FIG. 6).

A voltage of 2 volts is applied to the LED 100d of the present example in a forward direction so that a current of 20 mA flows therethrough. LED light is obtained, which has a luminance of more than 5.4 cd at a peak wavelength of 584 nm.

When the composition x and y of the $(Al_xGa_{1-x})_{1-y}In_yP$ active layer 53 is set at 0.50, respectively, pure green emitted light having a luminance of more than 3.3 cd at a peak wavelength of 555 nm is obtained.

In the present example, the efficiency at which LED light is taken out can be improved by the current path adjusting layer and the current diffusion layer in the same way as in Example 1. The semiconductor layers included in the LED can be continuously formed during a single crystal growth step. Therefore, production steps are simplified, cost is reduced, and yield is increased. Furthermore, crystal growth is not interrupted by the etching treatment and the like, so that the characteristics and the reliability of the LED can be maintained at a high level, preventing the crystallinity of the re-growth interface from degrading.

Furthermore, in the present example, an n-type substrate is used in the LED. Therefore, the current path adjusting layer 55 composed of the p-type current blocking region 55a and the n-type current passing regions 55b can be disposed on the substrate 51 and under the layered structure 150. Because of this, the orientation of the underlying crystal structure does not become distorted, and the p-type current blocking region 55a and the n-type current passing regions 55b are satisfactorily selectively grown depending upon the orientation of the underlying crystal, while the carrier concentration of each region is prescribed to be sufficiently large. As a result, the function of the current path adjusting layer 55 becomes more effective, and the amount of emitted light in a region of the active layer 53 right below the p-type electrode 151 increases and the efficiency at which light is taken out can be increased.

EXAMPLE 5

Figure 7:
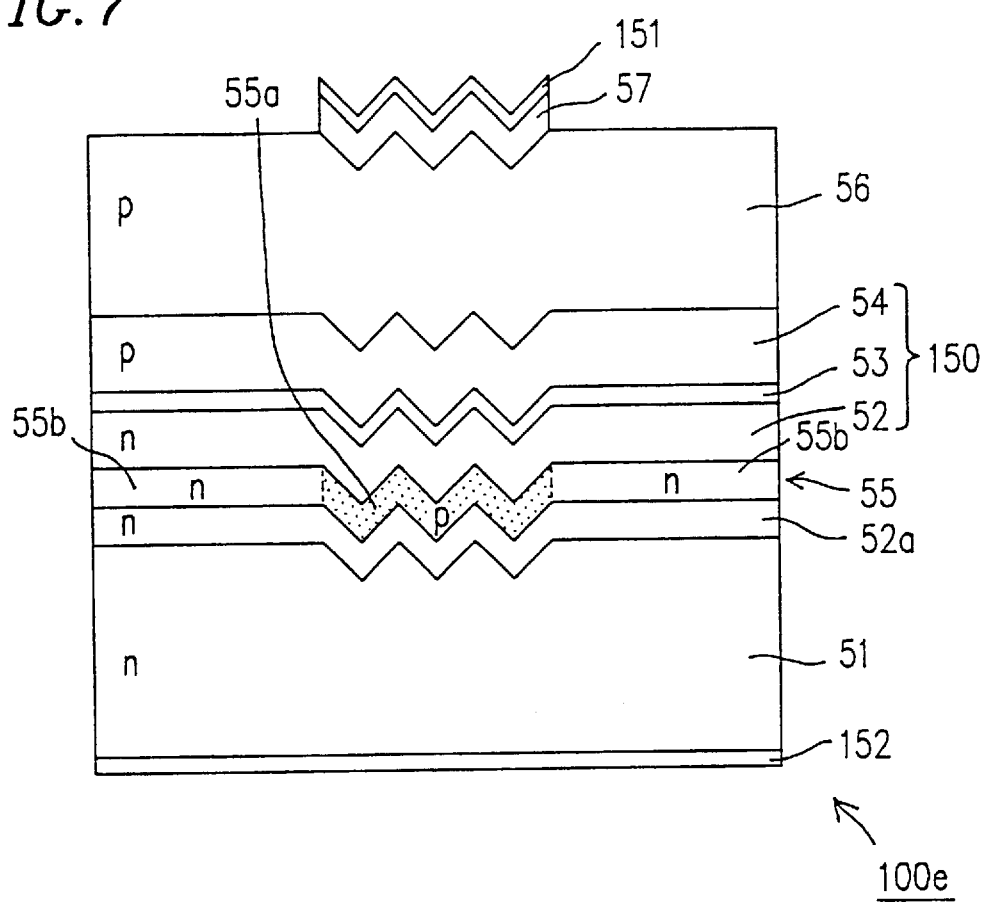
FIG. 7 is a cross-sectional view of an LED of the fifth example according to the present invention.

FIG. 7 is a cross-sectional view illustrating an LED as a semiconductor light-emitting device of the fifth example according to the present invention. In this figure, the reference numeral 100e denotes an LED of the present example; and like reference numerals refer to like parts of FIG. 6. The LED 100e is different from the LED 100d of Example 4 in that a second n-type lower cladding layer 52a is provided between the n-type GaAs substrate 51 and the current path adjusting layer 55.

The second n-type lower cladding layer 52a is made of n-type $(Al_{0.7}Ga_{0.3})_{0.5}In_{0.5}P$ with a Si carrier concentration of $5 \times 10^{17}$ cm$^{-3}$ in the same way as the n-type lower cladding layer 52 between the active layer 53 and the current path adjusting layer 55 and has a thickness of about 0.5 μm.

A method for producing the LED 100e of the present example is the same as that of the LED 100d of Example 4, except that the second n-type lower cladding layer 52a is formed on the substrate 51 before the current path adjusting layer 55 is formed.

A voltage of 2 volts is applied to the LED 100e of the present example in a forward direction so that a current of 20 mA flows therethrough. LED light is obtained, which has a luminance of more than 5.8 cd at a peak wavelength of 584 nm.

When the composition x and y of the $(Al_xGa_{1-x})_{1-y}In_yP$ active layer 53 is set at 0.50, respectively, pure green emitted light having a luminance of more than 3.5 cd at a peak wavelength of 555 nm is obtained.

In the present example, the second n-type lower cladding layer 52a is provided between the n-type GaAs substrate 51 and the current path adjusting layer 55, so that the thickness of the n-type lower cladding layer 52 between the current path adjusting layer 55 and the active layer 53 can be made as small as about 0.5 μm. This allows the current blocking region 55a of the current path adjusting layer 55 to prevent a current which has once diffused from spreading into the upper side of the current blocking region 55a, reducing a current flown into a region of the active layer 53 right below the p-type electrode 151. As a result, the amount of emitted light increases in the region of the active layer 53 other than that right below the p-type electrode 151, and the efficiency at which light is taken out can be increased, compared with the LED 100d of Example 4.

EXAMPLE 6

Figure 8:
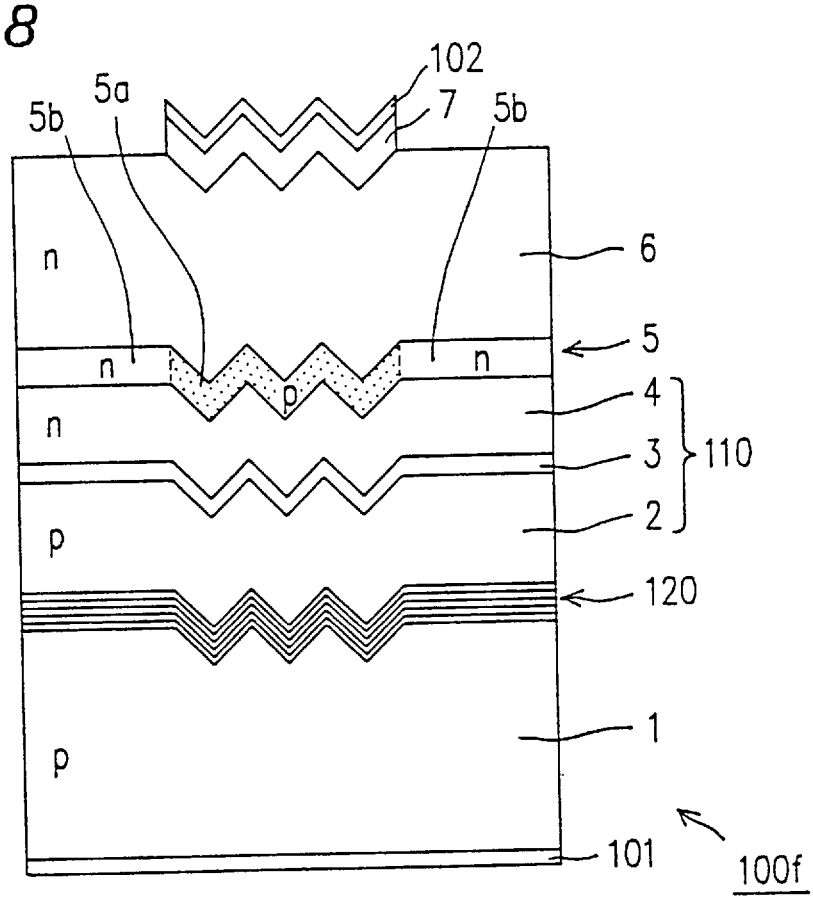
FIG. 8 is a cross-sectional view of an LED of the sixth example according to the present invention.

FIG. 8 is a cross-sectional view illustrating an LED as a semiconductor light-emitting device of the sixth example according to the present invention. In this figure, the reference numeral 100f denotes an LED of the present example; and like reference numerals refer to like parts of FIGS. 1A 1B and 1C. The LED 100f has the same structure as that of the LED 100a of Example 1, except that a p-type reflective layer 120 reflecting LED light, which travels from the active layer 3 to the p-type GaAs substrate 1, to the active layer 3, is disposed between the p-type GaAs substrate 1 and the layered structure 110 having a DH junction portion.

The p-type reflective layer 120 has 10 pairs of a GaAs layer and a AlInP layer, which are alternately layered. Each GaAs layer has a thickness of 0.01 μm, each AlInP layer has a thickness of 0.005 μm, and the p-type reflective layer 120 has a thickness of about 0.15 μm.

A method for producing the LED 100f of the present example is the same as that of the LED 100a of Example 1, except that the p-type reflective layer 120 is formed on the p-type GaAs substrate 1 before the p-type lower cladding layer 2 is formed.

A voltage of 2 volts is applied to the LED 100f of the present example in a forward direction so that a current of 20 mA flows therethrough. LED light is obtained, which has a luminance of more than 6 cd at a peak wavelength of 585 nm.

When the composition x and y of the $(Al_xGa_{1-x})_{1-y}In_yP$ active layer 3 is set at 0.50, respectively, pure green emitted light having a luminance of more than 4 cd at a peak wavelength of 555 nm is obtained.

In the present example, the p-type reflective layer 120 reflecting LED light, which travels from the active layer 3 to the p-type GaAs substrate 1, to the active layer 3 is disposed between the p-type GaAs substrate 1 and the layered structure 110 having a DH junction portion. Therefore, light traveling to the substrate side, among the LED light emitted from the active layer 3, is not absorbed by the p-type GaAs substrate 1 with a refractive index higher than that of the layered structure 110, and the efficiency at which light is taken out can be increased, compared with the LED 100a of Example 1.

In the present example, the p-type reflective layer 120 is constituted by the combination of GaAs layers and InAlP layers. However, the combination of semiconductor materials constituting the p-type reflective layer 120 is not limited to this. Combinations of other semiconductor materials can be used as long as they are capable of reflecting the LED light, which travels from the active layer 3 to the p-type substrate 1, to the active layer 3.

EXAMPLE 7

FIG. 9 is a cross-sectional view illustrating an LED as a semiconductor light-emitting device of the seventh example according to the present invention. In this figure, the reference numeral 100g denotes an LED of the present example. The LED 100g includes an n-type GaP current diffusion layer 76 with a Si carrier concentration of $5 \times 10^{18}$ cm$^{-3}$ in place of the $Al_{0.7}Ga_{0.3}As$ current diffusion layer 6 of the LED 100a in Example 1, and an n-type electrode 102 disposed on the n-type GaP current diffusion layer 76 so as to oppose the groove-formed portion 1a of the substrate 1. The other structure of the device is the same as that of the LED 100a of Example 1 shown in FIGS. 1A 1B and 1C.

A method for producing the LED 100g of the present example is different from that of the LED 100a of Example 1, in that GaP is grown as the current diffusion layer 76 on the current path adjusting layer 5, an AuGe layer is grown on the current diffusion layer 76, and the AuGe layer is selectively etched so that a portion opposing the groove-formed region 1a of the substrate 1 remains, whereby the n-type electrode 102 is formed.

A voltage of 2 volts is applied to the LED 100g of the present example in a forward direction so that a current of 20 mA flows therethrough. LED light is obtained, which has a luminance of more than 6 cd at a peak wavelength of 585 nm.

When the composition x and y of the $(Al_xGa_{1-x})_{1-y}In_yP$ active layer 3 is set at 0.50, respectively, pure green emitted light having a luminance of more than 4 cd at a peak wavelength of 555 nm is obtained.

In the present example, the n-type current diffusion layer 76 is made of GaP whose bandgap is larger than that of $Al_{0.7}Ga_{0.3}As$. Therefore, the absorption of light from the active layer by the current diffusion layer is decreased, the efficiency at which light is taken out is increased, and the brightness of the LED can be made high, compared with the LED 100a of Example 1 in which the n-type current diffusion layer 6 is made of $Al_{0.7}Ga_{0.3}As$.

Furthermore, the n-type electrode made of AuGe can be provided on the n-type current diffusion layer 76. Therefore, it is not required o provide a contact layer, reducing the number of production steps.

EXAMPLE 8

Figure 10A:
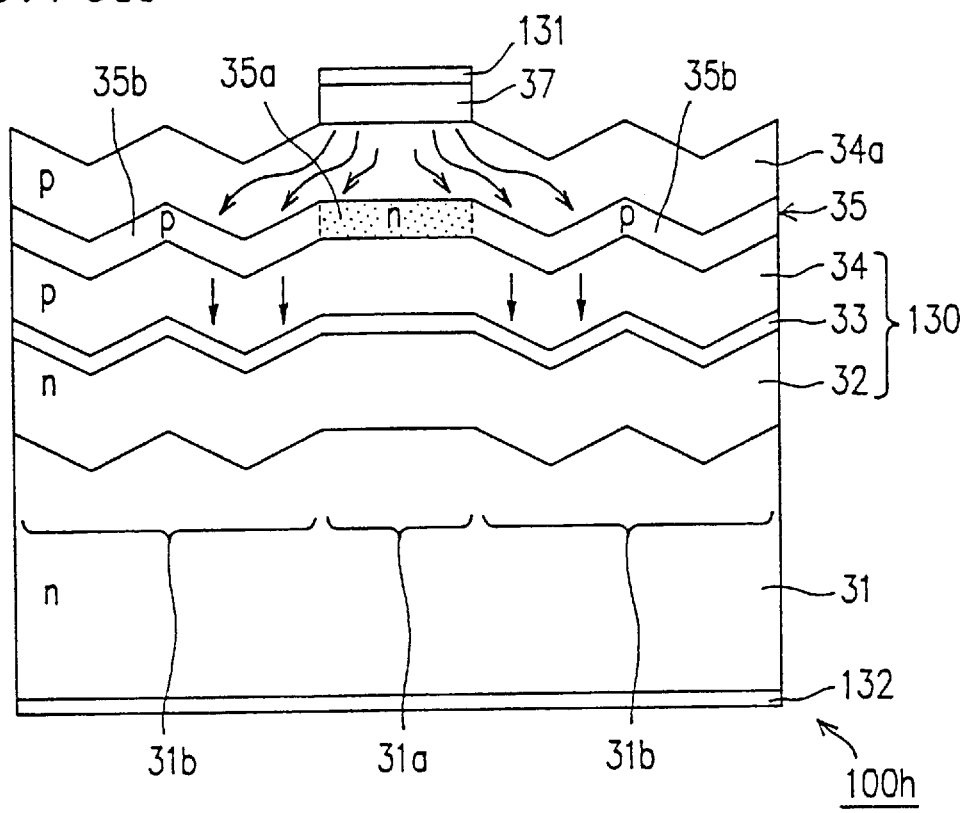
FIG. 10A is a cross-sectional view of an LED of the eighth example according to the present invention.
Figure 10B:
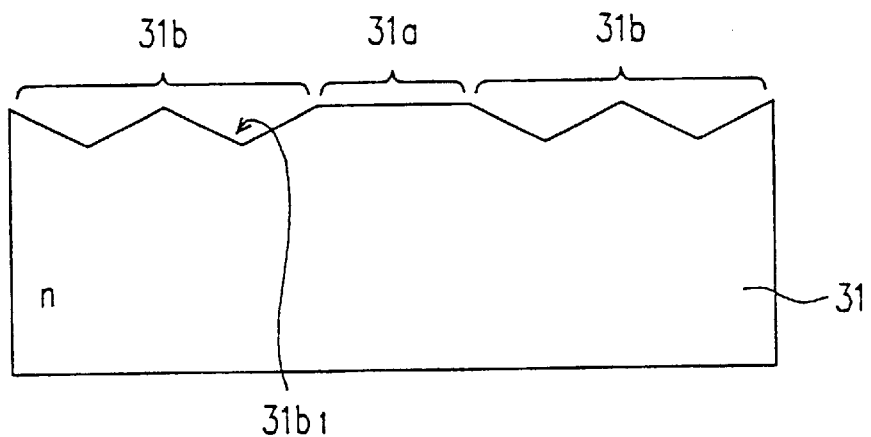
FIG. 10B is a cross-sectional view of a substrate included in the LED.

FIGS. 10A and 10B are views each illustrating an LED as a semiconductor light-emitting device of the eighth example according to the present invention. Specifically, FIG. 10A is a cross-sectional view showing a structure of the LED; and FIG. 10B is a cross-sectional view of a substrate included in the LED.

In these figures, the reference numeral 100h denotes an LED of the present example in which a layered structure 130 with a DH junction portion, including an n-type lower cladding layer 32, an active layer 33, and a p-type upper cladding layer 34 in this order is provided on the surface of an n-type GaAs substrate 31. In the present example, a current path adjusting layer 35 composed of a n-type semiconductor region (current blocking region) 35a blocking a current and p-type semiconductor regions (current passing regions) 35b passing a current is provided on the p-type cladding layer 34 of the layered structure 130. A second p-type cladding layer 34a is provided on the current path adjusting layer 35. A p-type GaAs contact layer 37 is provided on the second p-type upper cladding layer 34a so as to be positioned right above the current blocking region 35a of the current path adjusting layer 35. A p-type electrode 131 is provided on the p-type GaAs contact layer 37. An n-type electrode 132 made of AuGe is formed over the entire reverse surface of the n-type GaAs substrate 31.

The n-type GaAs substrate 31 has a circular flat region 31a with a diameter of 200 μm at the center of the substrate 31. The other regions of the substrate 31 are groove-formed regions 31b each having a plurality of stripe-shaped V-grooves $31b_1$ with a depth of 2.3 μm and a width 10 μm. The flat region 31a of the substrate 1 has an orientation of a (100) plane, and each slope of the V-grooves $31b_1$ has an orientation of a (311)A plane.

The lower cladding layer 32, the active layer 33, and the upper cladding layer 34 are respectively made of $(Al_xGa_{1-x})_{1-y}In_yP$ ($0 \leq x \leq 1$, $0 \leq y \leq 1$); the lower cladding layer 32 and the upper cladding layer 34 have a composition ratio, for example, of x=0.70, and y=0.50, and have a thickness of 1.0 μm; the lower cladding layer 32 has a Si carrier concentration of $1 \times 10^{18}$ cm$^{-3}$ and the upper cladding layer 34 has a Zn carrier concentration of $5 \times 10^{18}$ cm$^{-3}$. The active layer 33, for example, has a composition ratio of x=0.30 and y=0.50 and a thickness of 0.5 μm. The current path adjusting layer 35 is also made of $(Al_xGa_{1-x})_{1-y}In_yP$ ($0 \leq x \leq 1$, $0 \leq y \leq 1$), has a composition ratio of x=0.70 and y=0.50, and has a thickness of 0.7 μm. The current path adjusting layer 35 is doped with Zn as a group-II dopant and with Se as a group-VI dopant. The current blocking region 35a of the current path adjusting layer 35 is positioned right above the flat region 31a of the substrate 31 and has a carrier concentration of $3\times10^{18}$ cm$^{-3}$, exhibiting an n-type conductivity of the Se dopant, based on the (100) plane which is an orientation of the flat region 31a. The current passing regions 35b of the current path adjusting layer 35 are positioned above the groove-formed regions 31b of the substrate 31, and has a carrier concentration of $3\times10^{18}$ cm$^{-3}$, exhibiting a p-type conductivity of the Zn dopant, based on the (311) plane which is an orientation of each slope of the grooves $31b_1$ of the substrate 31.

The second upper cladding layer 34a is made of a p-type $(Al_{0.7}Ga_{0.3})_{0.5}In_{0.5}P$ layer with a Zn carrier concentration of $1\times10^{18}$ cm$^{-3}$ in the same way as the upper cladding layer 34 between the current path adjusting layer 35 and the active layer 33 and has a thickness of about 1 μm. The p-type GaAs contact layer 37 has a carrier concentration of $1\times10^{18}$ cm$^{-3}$ and a thickness of 1 μm.

Hereinafter, a method for producing the LED 100h will be described.

A plurality of stripe-shaped grooves $31b_1$ are formed by etching the surface of the n-type GaAs substrate 31 excluding the circular region 31a with a diameter of 200 μm so as to have a depth of 2.3 μm, a width of 10 μm, and an orientation of each slope of, for example, a (311)A plane (see FIG. 10B).

Then, each of the semiconductor layers 32 to 35, 34a, and 37 is formed on the substrate 31, subjected to the etching treatment, by an MOCVD method during the first crystal growth step.

Specifically, after the etching treatment, n-type $(Al_{0.7}Ga_{0.3})_{0.5}In_{0.5}P$ is grown on the substrate 31 as the n-type lower cladding layer 32 so as to have a thickness of about 1.0 μm and a Si carrier concentration of $1\times10^{18}$ cm$^{-3}$. Then, $(Al_{0.3}Ga_{0.7})_{0.5}In_{0.5}P$ is grown as the active layer 33 so as to have a thickness of about 0.50 μm, and p-type $(Al_{0.7}Ga_{0.3})_{0.5}In_{0.5}P$ is grown as the p-type upper cladding layer 34 so as to have a thickness of about 1 μm and a Zn carrier concentration of $1\times10^{18}$ cm$^{-3}$. At this time, the surface configuration of the substrate 31 is transferred to the semiconductor layers grown thereon. That is, regions of the surface of the p-type upper cladding layer 34 corresponding to the groove-formed regions 31b of the substrate 1 have a plurality of grooves whose orientation of a slope is a (311)A plane, and a region of the surface of the p-type upper cladding layer 34 corresponding to the flat region 31a of the substrate 31 has a flat face whose orientation is a (100) plane.

Furthermore, $(Al_{0.7}Ga_{0.5})_{0.5}In_{0.5}P$ is grown as the current path adjusting layer 35 on the surface of the p-type upper cladding layer 34 so as to have a thickness of about 0.7 μm while being simultaneously doped with Zn (group-II dopant) and Se (group-VI dopant).

As described in Example 1, p-type semiconductor regions with a carrier concentration of $3\times10^{18}$ cm$^{-3}$ are formed, as the current passing regions 35b, in regions of the p-type upper cladding layer 34 where the (311)A plane is exposed, i.e., regions corresponding to the groove-formed regions 31b of the substrate 31, and an n-type semiconductor region with a carrier concentration of $3\times10^{18}$ cm$^{31\ 3}$ is formed, as the current blocking region 35a, in a region pf the p-type upper cladding layer 34 where the (100) plane i exposed, i.e., a region corresponding to the flat region 31a of the substrate 31.

Then, p-type $(Al_{0.7}Ga_{0.3})_{0.5}In_{0.5}P$ is grown on the current path adjusting layer 35 as the second p-type upper cladding layer 34a so as to have a thickness of about 1 μm and a carrier concentration of $1\times10^{18}$ cm$^{-3}$, and a p-type GaAs layer is grown on the second p-type upper cladding layer 34a so as to have a thickness of about 1 μm and a Zn carrier concentration of $3\times10^{18}$ cm$^{-3}$.

Next, a AuZn layer is formed on the p-type GaAs layer, and a AuGe layer 132 of formed on the reverse surface of the n-type substrate 31 as an n-type electrode. Thereafter, the p-type GaAs layer and the AuZn layer are selectively etched so that portions thereof positioned right above the flat region 31a of the substrate 31 remain, whereby the p-type GaAs contact layer 37 and the p-type electrode 131 are formed. Thus, the LED 100h is completed (see FIG. 10A).

A voltage of 2 volts is applied to the LED 100h of the present example in a forward direction so that a current of 20 mA flows therethrough. Pure green emitted light is obtained, which has a luminance of more than 4 cd at a peak wavelength of 585 nm.

When the composition x and y of the $(Al_xGa_{1-x})_{1-y}In_yP$ active layer 3 is set at 0.50, respectively, pure green emitted light having a luminance of more than 2 cd at a peak wavelength of 555 is obtained.

In the LED 100h of the present example, the current path adjusting layer 35 composed of the current blocking region 35a and the current passing regions 35b is formed on the layered structure 130 including the active layer 33 on the n-type GaAs substrate 31, and the p-type electrode 131 is provided above the current path adjusting layer 35 via the second p-type cladding layer 34a and the p-type contact layer 37 so as to be positioned right above the current blocking region 35a. Therefore, current is not likely to flow in a region of the active layer 33 right below the p-type electrode 131 due to the current blocking region 35a of the current path adjusting layer 35. Because of this, a light-emitting region of the active layer 33 spreads to the periphery of the active layer 35, avoiding the region right below the p-type electrode 131, and LED light generated in the active layer 33 is efficiently taken out of a region on the surface of the LED 100h where the p-type electrode 131 is not positioned.

Furthermore, since the current path adjusting layer 35, the second p-type upper cladding layer 34a, and the like are make of $(Al_{0.7}Ga_{0.3})_{0.5}In_{0.5}P$, they have a bandgap wider than that of the active layer 33 made of $(Al_{0.3}Ga_{0.7})_{0.5}In_{0.5}P$. This does not allow the current path adjusting layer 35 and the second upper cladding layer 34a to absorb LED light from the active layer 33, improving the efficiency at which light is taken out to make the brightness of the LED 100h higher.

In the present example, a plurality of stripe-shaped grooves $31b_1$ are formed on the (100) plane of the n-type GaAs substrate 31 by selectively etching the (100) plane excluding a predetermined circular region so as to expose the (311)A plane. Therefore, the (311)A plane exposed in the groove-formed regions 31b and the (100) plane of the flat region 31a appear on the surface of the layered structure 130 including the active layer 33 formed on the substrate 31, i.e., on the surface of the p-type upper cladding layer 34.

Regions on the surface of the device corresponding to the current passing regions 35b of the current path adjusting layer 35 have an uneven configuration based on the surface configuration of the groove-formed regions 31b of the substrate 31. Therefore, the ratio of the LED light incident upon the device surface from the light-emitting regions of the active layer 33 right below the current passing regions 35b at an angle equal to or more than a critical angle decreases, resulting in improvement of the efficiency at which light is taken out of the device surface. In addition, the light-emitting region of the active layer 33 also has an uneven configuration, so that a light-emitting area becomes larger compared with the case where the light-emitting region is flat, leading to an increase in the efficiency at which light is taken out.

Furthermore, the (311)A plane appears on each slope of the grooves $31b_1$ in the groove-formed regions 31b of the substrate 31. Therefore, even when an AlGaInP mixed semiconductor material is grown on the groove-formed regions 31b, a super-lattice is not formed. In the present example, the current passing regions 35b of the current path adjusting layer 35 are positioned above the groove-formed regions 31b. Because of this, even when an AlGaInP mixed semiconductor material is grown as the active layer 33 by an MOCVD method, a super-lattice is not formed in the light-emitting region of the active layer 33 corresponding to the current passing regions 35b, and the wavelength of the LED light can be prevented from becoming larger due to the super-lattice. Consequently, the Al composition ratio is not required to be increased for the purpose of obtaining LED light with a predetermined wavelength, and high-brightness and highly-reliable LEDs can be obtained.

Furthermore, in the present example, AlGaInP is grown on the p-type upper cladding layer 34 while being doped with Zn and Se. Therefore, the current blocking region 35a having an n-type conductivity of the Se dopant is formed on the (100) plane and the current passing regions 35b having a p-type conductivity of the Zn dopant are formed on the (311)A plane. Because of this, the crystal growth process is not interrupted during the step of forming the current path adjusting layer 35 having the current blocking region 35a; and the p-type upper cladding layer 34, the current path adjusting layer 35, the second p-type upper cladding layer 34a, and the p-type contact layer 37 are grown during a single MOCVD step. This reduces production cost and substantially increases yield.

In addition, the characteristics and reliability of the device can be prevented from being degraded due to the crystallinity at the re-growth interface in the semiconductor layered structure included in the LED.

Furthermore, in the present example, unlike Examples 1 to 7, a portion of the device surface where the electrode is provided is flat. Therefore, the surface of the p-type electrode 131 becomes flat and adhesion between the p-type electrode 131 and a wire to be bonded thereto can be made strong and satisfactory.

EXAMPLE 9

Figure 11:
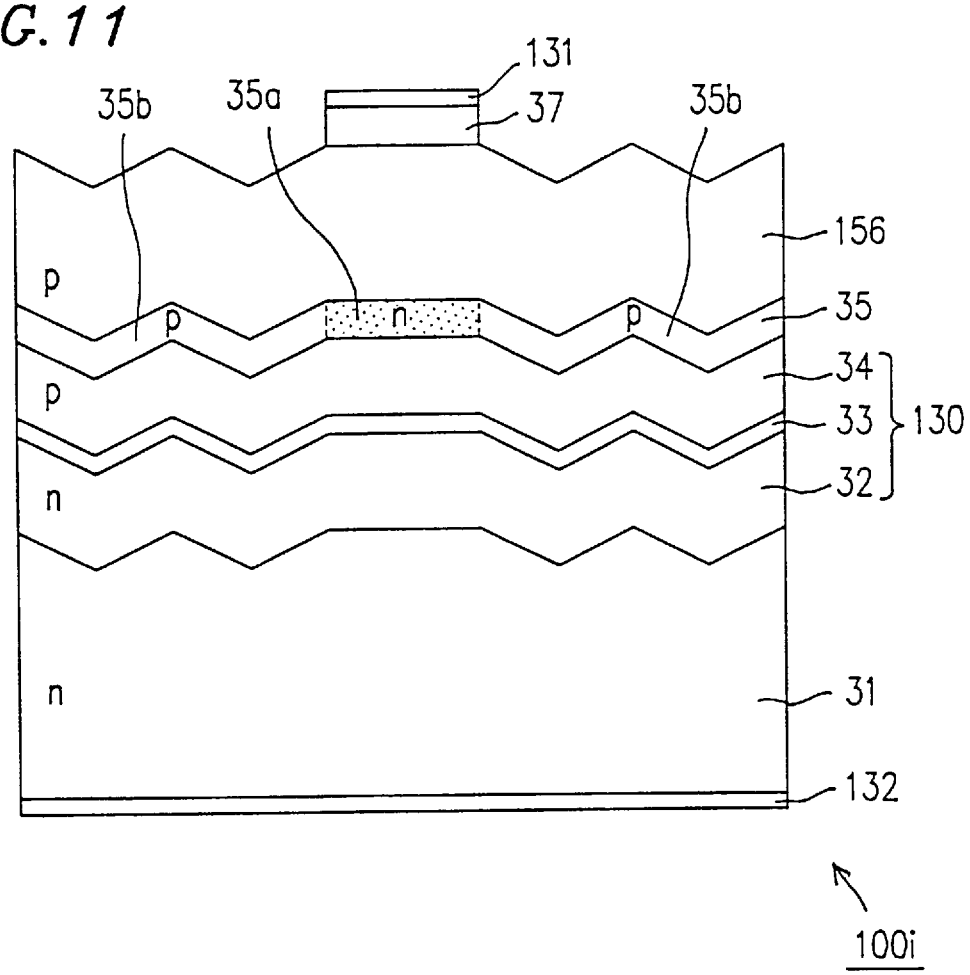
FIG. 11 is a cross-sectional view of an LED of the ninth example according to the present invention.

FIG. 11 is a cross-sectional view illustrating an LED as a semiconductor light-emitting device of the ninth example according to the present invention. In this figure, the reference numeral 100i denotes an LED of the present example. The LED 100i includes a p-type current diffusion layer 156 in place of the second p-type upper cladding layer 34a of the LED 100h of Example 8. The p-type current diffusion layer 156 is made of $Al_{0.7}Ga_{0.3}As$, and has a Zn carrier concentration of $5 \times 10^{18}$ cm$^{-3}$ and a thickness of 5 μm. The p-type GaAs contact layer 37 disposed on the current diffusion layer 156 has a Zn carrier concentration of $5 \times 10^{18}$ cm$^{-3}$. The other structure of the device is the same as that of the LED 100h of Example 8.

According to a method for producing the LED 100i of the present example, the current path adjusting layer 35 is formed, and then, the p-type $Al_{0.7}Ga_{0.3}As$ current diffusion layer 156 is formed instead of the second p-type $(Al_{0.7}Ga_{0.3})_{0.5}In_{0.5}P$ upper cladding layer 34a. The other steps are the same as those of the method for producing the LED 100h of Example 8.

A voltage of 2 volts is applied to the LED 100i of the present example in a forward direction so that a current of 20 mA flows therethrough. LED light is obtained, which has a luminance of more than 5 cd at a peak wavelength of 585 nm.

When the composition x and y of the $(Al_xGa_{1-x})_{1-y}In_yP$ active layer 33 is set at 0.50, respectively, pure green emitted light having a luminance of more than 2.5 cd at a peak wavelength of 555 nm is obtained.

In the present example, the p-type current diffusion layer 157 is provided on the current path adjusting layer 35, so that a current can also be diffused by the p-type current diffusion layer 156, and light can be emitted in a wider region outside of the region of the active layer 33 corresponding to the p-type electrode 131. This enables the efficiency at which light is taken out to improve and the LED to have a higher brightness.

In the present example, the $Al_{0.7}Ga_{0.3}As$ current diffusion layer 156 has a bandgap larger than that of the $(Al_{0.3}Ga_{0.7})_{0.5}In_{0.5}P$ active layer 33. Therefore, the absorption of light from the active layer 33 by the current diffusion layer 156 is decreased, the efficiency at which light is taken out is increased, and the brightness of the LED can be made high.

EXAMPLE 10

Figure 12:
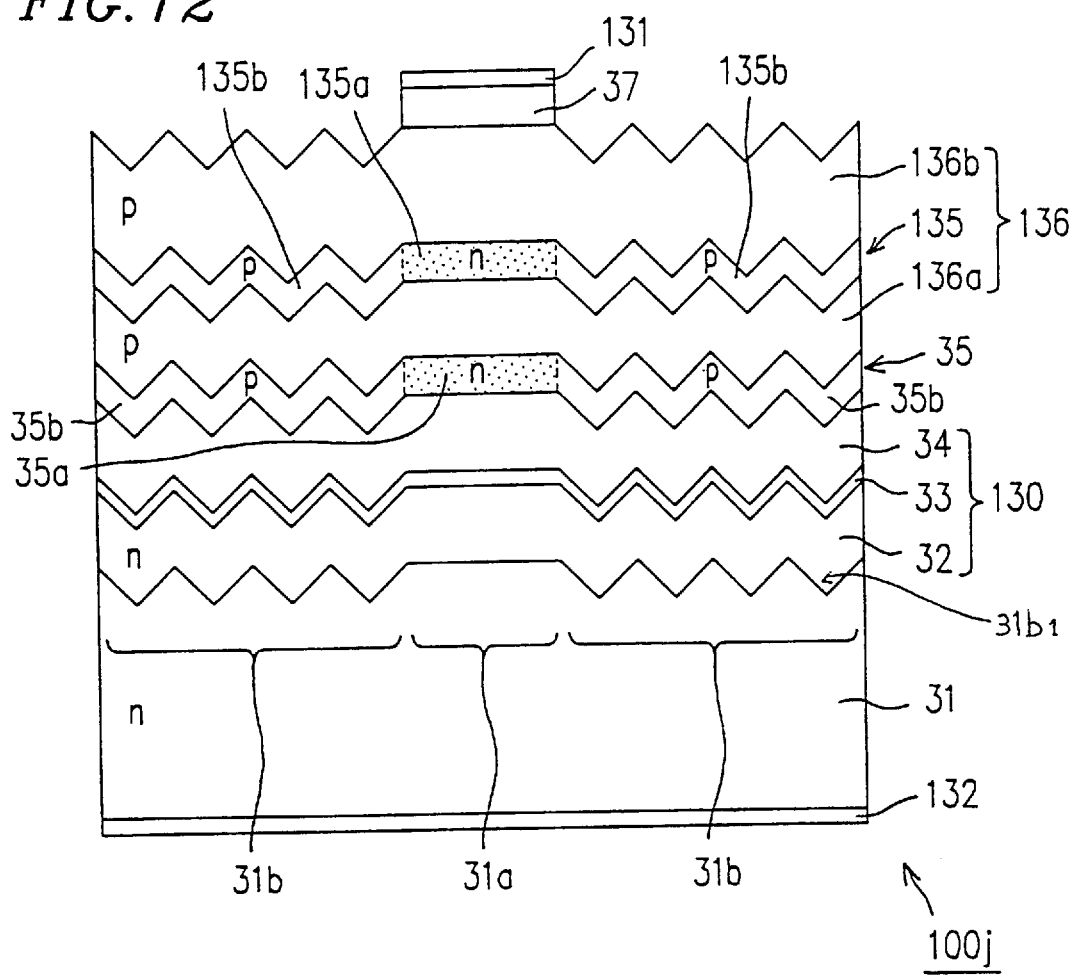
FIG. 12 is a cross-sectional view of an LED of the tenth example according to the present invention.

FIG. 12 is a cross-sectional view illustrating an LED as a semiconductor light-emitting device of the tenth example according to the present invention. In this figure, the reference numeral 100j denotes an LED of the present example. The LED 100j includes a current diffusion layer 136 having a second current path adjusting layer 135, in place of the current diffusion layer 156 of Example 9. The second current path adjusting layer 135 is composed of a current blocking region 135a disposed right below the p-type electrode 131 and current passing regions 135b disposed around the current blocking region 135a. Each slope of the grooves $31b_1$ in the groove-formed regions 31b of the n-type GaAs substrate 31 has a crystal orientation of a (111)A plane.

The second current path adjusting layer 135 is also made of a $(Al_{0.7}Ga_{0.3})_{0.5}In_{0.5}P$ layer doped with Zn and Se. The current passing regions 135b of the current path adjusting layer 135 are positioned above the groove-formed regions 31b of the substrate 31 and have a carrier concentration of $3 \times 10^{18}$ cm$^{-3}$, exhibiting a p-type conductivity of the Zn dopant, based on the (111)A plane which is an orientation of each slope of the grooves $31b_1$ of the substrate 31. The current blocking region 135a of the current path adjusting layer 135 is positioned right above the flat region 31a of the substrate 31 and has a carrier concentration of $3 \times 10^{18}$ cm$^{-3}$, exhibiting an n-type conductivity of the Se dopant, based on the (100) plane which is an orientation of the flat region 31a.

The reference numerals 136a and 136b denote the lower and upper portions sandwiching the current path adjusting layer 135 in the current diffusion layer 136, respectively. The lower and upper portions 136a and 136b have a thickness of 2.5 μm, respectively.

A method for producing the LED 100j of the present example is the same as that of the LED 100i of Example 9, except that the second current path adjusting layer 135 is formed in the course of growing the current diffusion layer 136.

A voltage of 2 volts is applied to the LED 100j of the present example in a forward direction so that a current of 20 mA flows therethrough. LED light is obtained, which has a luminance of more than 6 cd at a peak wavelength of 585 nm.

When the composition x and y of the $(Al_xGa_{1-x})_{1-y}In_yP$ active layer 33 is set at 0.50, respectively, pure green emitted light having a luminance of more than 3 cd at a peak wavelength of 555 nm is obtained.

In the present example, the second current path adjusting layer 135 is provided in the p-type current diffusion layer 136 in addition to the current path adjusting layer 35 provided between the p-type upper cladding layer 34 and the p-type current diffusion layer 136. Therefore, a current flowing between the p-type electrode 131 and the active layer 33 is blocked at two places, i.e., by the current blocking region 35a of the current path adjusting layer 35 and the current blocking region 135a of the second current path adjusting layer 135 and is diffused diffuse to the outside of the region of the active layer 33 right below the p-type electrode 131. Thus, the current flowing into the active layer 33 can be diffused in a much wider region. This reduces the amount of emitted light in the region of the active layer 33 right below the p-type electrode 131 and the vicinity thereof, and the amount of emitted light increases by the reduced amount in regions away from that of the active layer 33 right below the p-type electrode 131, whereby the efficiency at which light is taken out can be increased.

Furthermore, according to the method for producing the LED of the present example, a plurality of semiconductor layers included in the LED can be grown during a single MOCVD growth step, so that re-growth is not conducted while the semiconductor layers are grown. This enables LEDs having more than three current path adjusting layers to be easily produced. It is noted that the current path adjusting layers may be provided in any portion as long as it is above the active layer 33.

EXAMPLE 11

Figure 13:
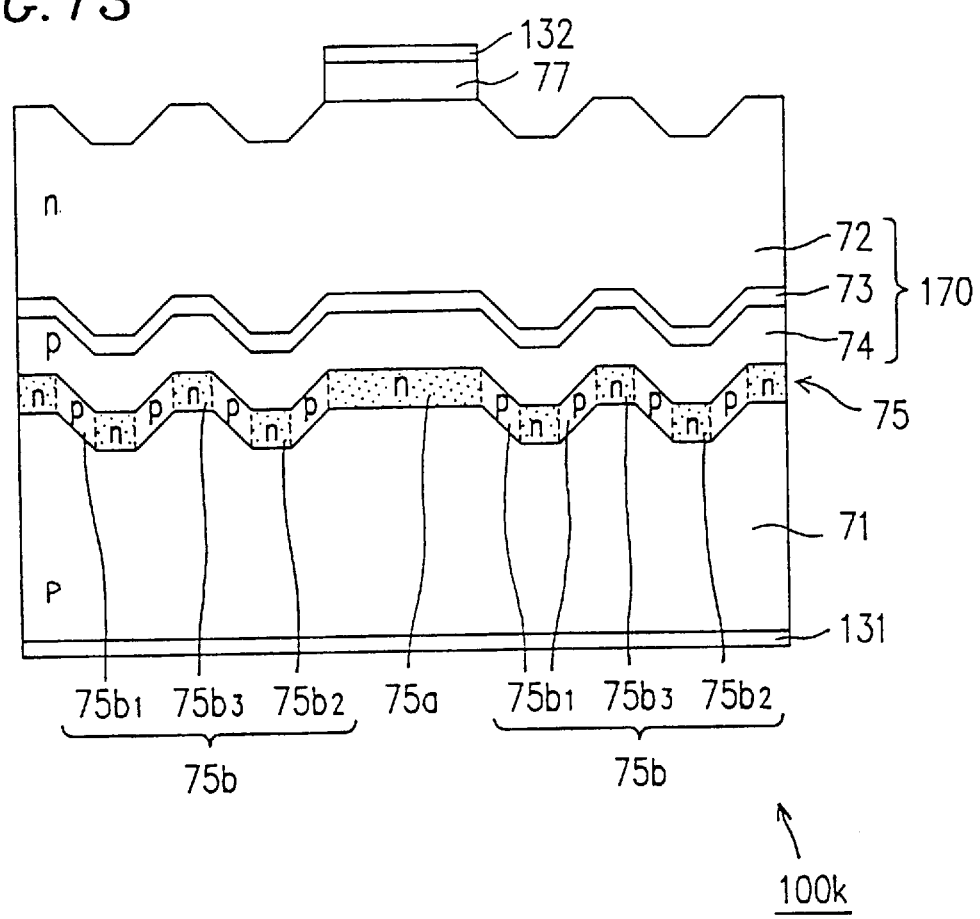
FIG. 13 is a cross-sectional view of an LED of the eleventh example according to the present invention.
Figure 14A:
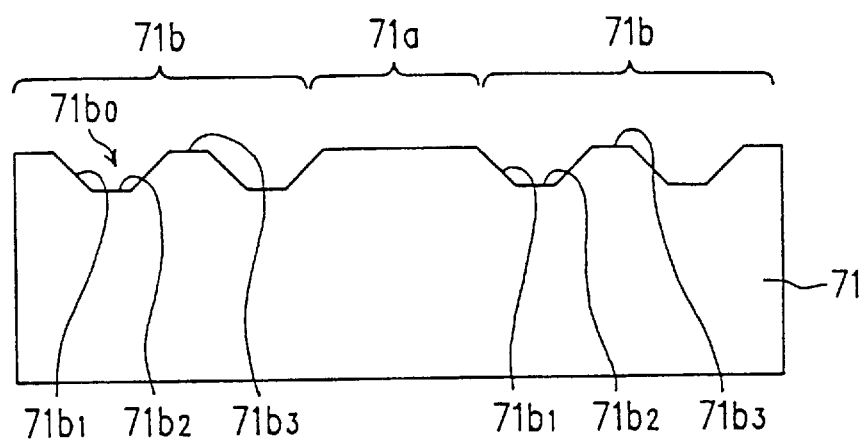
FIG. 14A is a cross-sectional view of a substrate included in the LED of the eleventh example.
Figure 14B:
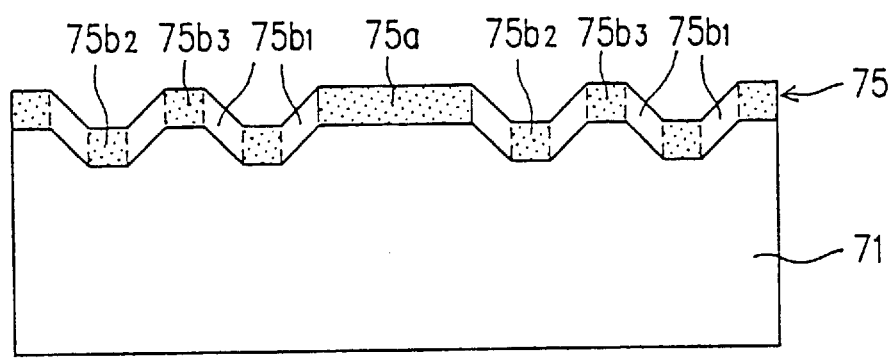
FIG. 14B is a cross-sectional view showing the state where a current path adjusting layer is formed on the substrate.

FIG. 13 is a cross-sectional view illustrating an LED as a semiconductor light-emitting device of the eleventh example according to the present invention. FIGS. 14A and 14B respectively illustrate a part of the steps of producing the LED: specifically, FIG. 14A is a cross-sectional view of a substrate included in the LED; and FIG. 14B is a cross-sectional view showing a state where a current path adjusting layer is formed on the substrate. In these figures, the reference numeral 100k denotes an LED of the present example. The LED 100k includes a p-type GaAs substrate 71, on which a current path adjusting layer 75 including n-type semiconductor regions (current blocking regions) 75a, 75$b_2$, and 75$b_3$, and p-type semiconductor regions (current passing regions) 75$b_1$ passing a current is provided.

A layered structure 170 having a DH junction portion is provided on the current path adjusting layer 75. The layered structure 170 includes a p-type lower cladding layer 74, an active layer 73, and an n-type upper cladding layer 72 successively grown in this order.

An n-type GaAs contact layer 77 is provided on the layered structure 170, and an n-type electrode 132 made of AuGe is disposed on the n-type GaAs contact layer 77. A p-type electrode 131 made of AuZn is provided over the entire reverse surface of the p-type GaAs substrate 71.

The p-type GaAs substrate 71 has a plurality of stripe-shaped grooves 71$b_0$ in groove-formed regions 71b excluding a circular flat region 71a with a diameter of 200 μm at the center of the substrate 71. The grooves 71$b_0$ respectively have a bottom face 71$b_2$ and slopes 71$b_1$ and are formed at a predetermined interval so as to have a depth 5 μm and a width of 15 μm. The flat region 71a of the substrate 71, the bottom face 71$b_2$ of each groove 71$b_0$, and a surface portion 71$b_3$ of the substrate 71 between the respective adjacent grooves 71$b_0$ have an orientation of a (100) plane, and the slope 71$b_1$ of each groove 71$b_0$ has an orientation (111)A plane.

The current path adjusting layer 75 is made of $(Al_xGa_{1-x})_{1-y}In_yP$ ($0 \leq x \leq 1$, $0 \leq y \leq 1$), has a composition ratio of x=0.70 and y=0.5, and has a thickness of 1 μm. The current path adjusting layer 75 is doped with Zn as a group-II dopant and with Se as a group-VI dopant. The current blocking region 75a of the current path adjusting layer 75 is positioned right above the flat region 71a of the substrate 71 and has a carrier concentration of $3 \times 10^{18}$ cm$^{-3}$, exhibiting an n-type conductivity of the Se dopant, based on the (100) plane which is an orientation of the flat region 71a. The current blocking regions 75$b_2$ and 75$b_3$ of the current path adjusting layer 75 are positioned right above the bottom faces 71$b_2$ of each groove 71$b_0$ and right above the surface portion 71$b_3$ between the respective adjacent grooves 71$b_0$, respectively, and have a carrier concentration of $3 \times 10^{18}$ cm$^{-3}$, exhibiting an n-type conductivity of the Se dopant, based on the (100) planes of the bottom faces 71$b_2$ of each groove 71$b_0$ and the surface portion 71$b_3$ between the respective adjacent grooves 71$b_0$.

The current passing regions 75$b_1$ of the current path adjusting layer 75 have a carrier concentration of $3 \times 10^{18}$ cm$^{-3}$, exhibiting a p-type conductivity of the Zn dopant, based on the (111)A plane which is an orientation of the slope 71$b_1$ of each groove 71$b_0$ of the substrate 71.

The lower cladding layer 74, the active layer 73, and the upper cladding layer 72 are respectively made of $(Al_xGa_{1-x})_{1-y}In_yP$ ($0 \leq x \leq 1$, $0 \leq y \leq 1$); the lower cladding layer 74 and the upper cladding layer 72 have a composition ratio, for example, of x=0.70, and y=0.50, and have a thickness of 1.0 μm and 3.0 μm, respectively; the lower cladding layer 74 has a Zn carrier concentration of $1 \times 10^{18}$ cm$^{-3}$ and the upper cladding layer 72 has a Si carrier concentration of $1 \times 10^{18}$ cm$^{-3}$. The active layer 73, for example, has a composition ratio of x=0.30 and y=0.50 and a thickness of 0.5 μm.

Furthermore, the n-type GaAs contact layer 77 has a Si carrier concentration of $3 \times 10^{18}$ cm$^{-3}$ and a thickness of 1 μm.

Hereinafter, a method for producing the LED 100k will be described.

The surface of the p-type GaAs substrate 71, excluding the circular region 71a with a diameter of 200 μm is subjected to an etching treatment, whereby a plurality of stripe-shaped grooves 71$b_0$ with a depth of 5 μm and a width of 15 μm are formed so as to have an orientation of each slope 71$b_1$ of, for example, a (111)A plane and an orientation of each face 71$b_2$ of (100) (see FIG. 14A).

Then, each of the semiconductor layers 75, 72 to 74, and 77 are formed on the substrate 71 subjected to the etching treatment by a single crystal growth step using an MOCVD method.

Specifically, after the etching treatment, $(Al_{0.7}Ga_{0.3})_{0.5}In_{0.5}P$ is grown on the substrate 71 as the current path adjusting layer 75 so as to have a thickness of about 1 μm while being doped with Zn (group-II dopant) and Se (group-VI dopant). At this time, an n-type semiconductor region with a Se carrier concentration of $3 \times 10^{18}$ cm$^{-3}$ is formed on a region of the surface of the substrate 71 where the (100) plane is exposed, i.e., the flat region 71a of the substrate 71, the bottom face 71$b_2$ of each groove 71$b_0$, and the surface portion 71$b_3$ between the respective adjacent grooves 71$b_0$, respectively, as the current blocking regions 75a, 75$b_2$, and 75$b_3$. A p-type semiconductor region with a Zn carrier concentration of $3×10^{18}$ cm$^{-3}$ is formed on regions of the surface of the substrate 71 where the (111)A plane is exposed, i.e., the slope 71$b_1$ of each groove 71$b_0$ of the substrate 71 as the current passing regions 75$b_1$.

Thereafter, (Al$_{0.7}$Ga$_{0.3}$)$_{0.5}$In$_{0.5}$P is grown on the current path adjusting layer 75 while the conductivity and thickness thereof are controlled, whereby the p-type lower cladding layer 74, the active layer 73, and the n-type upper cladding layer 72 are grown, and an n-type GaAs layer is grown on the n-type upper cladding layer 72.

Next, a AuGe layer is formed on the n-type GaAs layer, and a AuZn layer is formed on the reverse surface of the p-type substrate 71 as the p-type electrode 131. Then, the n-type GaAs layer and the AuGe layer thereon are selectively etched so that portions thereof positioned right above the flat region 71$a$ of the substrate 71 remain, whereby the n-type GaAs contact layer 77 and the n-type electrode 132 are formed. Thus, the LED 100$k$ is completed (see FIG. 13).

A voltage of 2 volts is applied to the LED 100$k$ of the present example in a forward direction so that a current of the 20 mA flows therethrough. LED light is obtained, which has a luminance of more than 7 cd at a peak wavelength of 584 nm.

When the composition x and y of the (Al$_x$Ga$_{1-x}$)$_{1-y}$In$_y$P active layer 73 is set at 0.50, respectively, pure green emitted light having a luminance of more than 3.5 cd at a peak wavelength of 555 nm is obtained.

In the present example, the current path adjusting layer and the current diffusion layer enable the efficiency at which LED light is taken out to improve in the same way as in the aforementioned examples. The semiconductor layers included in the LED can continuously formed by a single crystal growth step. Therefore, the production steps are simplified, cost is reduced, and yield is increased. In addition, crystal growth is not interrupted by the etching treatment and the like, so that the characteristics and reliability of the LED can be maintained at a high level without degrading the crystallinity of the re-growth interface.

Furthermore, in the present example, a p-type substrate is used in the LED, so that the current path adjusting layer 75 composed of the n-type current blocking regions 75$a$,75$b_2$, and 75$b_3$, and the p-type current passing region 75$b_1$ can be disposed on the surface of the substrate 71 below the layered structure 170. This prevents the orientation of the underlying crystal structure from becoming distorted when the current path adjusting layer 75 is grown, and the selective growth of the current blocking regions 75$a$, 75$b_2$, and 75$b_3$ and the current passing region 75$b_1$ based on the orientation of the underlying crystal can be satisfactorily conducted while the carrier concentration of each region is made sufficiently large. As a result, the function of the current path adjusting layer 75 is more effective, the amount of emitted light in the regions of the active layer 73 other than that right below the n-type electrode 132 increases, and the efficiency at which light is taken out can be improved.

In the present example, the grooves 71$b_c$ on the surface of the p-type substrate 71 have the bottom faces 71$b_2$ and the surface portions 71$b_3$ having a crystal orientation of a (100) plans are exposed. Moreover, in addition to the n-type current blocking region 75$a$ positioned in a region right below the n-type electrode 132, the n-type current blocking regions 75$b_2$ and 75$b_3$ positioned separately in the periphery of the region right below the n-type electrode 132. Therefore, a current, which is blocked by the current blocking region 75$a$ right below the n-type electrode 132 and spread in the periphery thereof, can be diffused in a wider region by the current blocking region 75$b_2$ and 75$b_3$.

EXAMPLE 12

FIG. 15 is a cross-sectional view illustrating an LED as a semiconductor light-emitting device of the twelfth example according to the present invention. In this figure, the reference numeral 100 m denotes an LED of the present example. The LED 100 m includes a p-type GaAs substrate 81, on which a current path adjusting layer 85 including an n-type semiconductor region (current blocking region) 85$a$ blocking a current and a p-type semiconductor regions (current passing regions) 85$b$ passing a current is provided.

A layered structure 180 having a DH junction portion is provided on the current path adjusting layer 85. The layered structure 180 includes a p-type lower cladding layer 54, an active layer 53, and an n-type cladding layer 82 in this order from the substrate side.

Furthermore, an n-type GaAs contact layer 77 is provided above the layered structure 180 via an n-type current diffusion layer 86, and an n-type electrode 132 made of AuGe is disposed on the n-type GaAs contact layer 77. A p-type electrode 131 made of AuZn is formed over the entire reverse surface of the p-type GaAs substrate 81.

In the same way as the n-type GaAs substrate 31 of Example 5, the p-type GaAs substrate 81 has a circular flat region 81$a$ with a diameter of 200 $\mu$m at the center of the substrate 81. The other regions of the substrate 81 are groove-formed regions 81$b$ each having a plurality of strips-shaped V-grooves 51$b_1$ with a depth of 2.3 $\mu$m and a width 10 $\mu$m. The flat region 81$a$ of the substrate 81 has an orientation of a (100) plane, and each slope of the V-grooves 81$b_1$ has an orientation of a (311)A plane.

The current path adjusting layer 85 is made of (Al$_x$Ga$_{1-x}$)$_{1-y}$In$_y$P (0≦x≦1, 0≦y≦1), has a composition ratio of x=0.70 and y=0.50, has a thickness of 1 $\mu$m. The current path adjusting layer 85 is doped with Zn as a group-II dopant and with as Se as a group-VI dopant. The current blocking region 85$a$ of the current path adjusting layer 85 is positioned right above the flat region 81$a$ of the substrate 81 and has carrier concentration of $3×10^{18}$ cm$^{-3}$, exhibiting an n-type conductivity of the Se dopant, based on the (100) plane which is an orientation of the flat region 81$a$. The current passing regions 85$b$ of the current path adjusting layer 85 are positioned above the groove-formed regions 81$b$ of the substrate 81, and have a carrier concentration of $3×10^{18}$ cm$^{-1}$, exhibiting a p-type conductivity of the Zn dopant, based on the (311) plane which is an orientation of each slope of the grooves 81$b_1$ of the substrate 81.

The lower cladding layer 84, the active layer 83, and the upper cladding layer 82 are respectively made of (Al$_x$Ga$_{1-x}$)$_{1-y}$In$_y$P (0≦x≦1, 0≦y≦1); the lower cladding layer 84 and the upper cladding layer 82 have a composition ratio, for example, of x=0.70, and y=0.50, and have a thickness of 1.0 $\mu$m; the lower cladding layer 84 has a Zn carrier concentration of $1×10^{18}$ cm$^{-3}$ and the upper cladding layer 82 has a Si carrier concentration of $1×10^{18}$ cm$^{-3}$. The active layer 83, for example, has a composition ratio of x=0.30 and y=0.50 and a thickness of 0.5 $\mu$m.

The n-type current diffusion layer 86 is made of n-type Al$_x$Ga$_{1-x}$As (0≦x≦1) and has a composition ratio of x=0.70 and a thickness of 5 $\mu$m. The n-type current diffusion layer 86 and the n-type GaAs contact layer 77 have a Si carrier concentration of $5×10^{18}$ cm$^{-3}$.

Hereinafter, a method for producing the LED 100$m$ will be described.

A plurality of strips-shaped grooves 81$b_1$ are formed by etching the surface of the p-type GaAs substrate 81, excluding the circular region 81a with a diameter of 200 µm, so as to have a depth of 2.3 µm, a width of 10 µm, and an orientation of each slope of, for example, a (311)A plane in the same way as in Example 8.

Then, each of the semiconductor layers 85, 84, 83, 82, 56, and 77 is formed on the substrate 81, subjected to the etching treatment, by an MOCVD method during the first crystal growth step.

Specifically, after the etching treatment, $(Al_{0.7}Ga_{0.3})_{0.5}In_{0.5}P$ is grown on the substrate 81 as the current path adjusting layer 85 so as to have a thickness of about 1.0 µm while being simultaneously doped with Zn (group-II dopant) and Se (group-VI dopant).

At this time, an n-type semiconductor region with a Se carrier concentration of $3 \times 10^{18}$ cm$^{-3}$ is formed, as the current blocking region 85a, in a region of the substrate 81 where the (100) plane is exposed, i.e., the flat region 81a of the substrate 81, and p-type semiconductor regions with a Zn carrier concentration of $3 \times 10^{18}$ cm$^{-3}$ are formed, as the current passing regions 85b, in regions of the substrate 81 where the (311)A plane is exposed, i.e., the groove-formed regions 81b of the substrate 81.

Thereafter, $(Al_{0.7}Ga_{0.3})_{0.5}In_{0.5}P$ is grown on the current path adjusting layer 85 while the conductivity and thickness thereof are controlled, whereby the p-type lower cladding layer 84, the active layer 83, and the n-type upper cladding layer 82 are grown, and an n-type $Al_{0.7}Ga_{0.3}As$ layer with a thickness of 5 µm and an n-type GaAs layer having a thickness of 1 µm are respectively grown on the n-type upper cladding layer 82 so as to have a Si carrier concentration of $5 \times 10^{18}$ cm$^{-3}$.

Next, a AuGe layer if formed on the n-type GaAs layer, and a AuZn layer is formed on the reverse surface of the p-type substrate 81 as the p-type electrode 131. Then, the n-type GaAs layer and the AuGe layer thereon are selectively etched so that portions thereof positioned right above the flat region 81a of the substrate 81 remain, whereby the n-type GaAs contact layer 77 and the n-type electrode 132 are formed. Thus, the LED 100m is completed (see FIG. 15).

A voltage of 2 volts is applied to the LED 100m of the present example in a forward direction so that a current of 20 mA flows therethrough. LED light is obtained, which has a luminance of more than 8 cd at a peak wavelength of 584 nm.

When the composition x and y of the $(Al_xGa_{1-x})_{1-y}In_yP$ active layer 83 is set at 0.50, respectively, pure green emitted light having a luminance of more than 4 cd at a peak wavelength of 555 nm is obtained.

In the present example, the current path adjusting layer 85 and the current diffusion layer 86 enable the efficiency at which LED light is taken out to improve in the same way as in Example 9. The semiconductor layered structure having the current blocking region 85a of the LED can be continuously formed by a single crystal growth step.

Furthermore, in the present example, a p-type substrate is used in the LED, so that the current path adjusting layer 85 composed of the n-type current blocking region 85a and the p-type current passing regions 85b can be disposed on the surface of the substrate 81 below the layered structure 180. This prevents the orientation of the underlying crystal structure from becoming distorted when the current path adjusting layer 85 is grown, and the selective growth of the current blocking region 85a and the current passing regions 85b based on the orientation of the underlying crystal can be satisfactorily conducted while the carrier concentration of each region is made sufficiently large. As a result, the function of the current path adjusting layer 85 becomes more effective, the amount of emitted light in the regions of the active layer 83 other than that right below the n-type electrodes 132 increases, and the efficiency at which light is taken out can be improved.

In the present example. Since the current diffusion layer 86 has an n-type conductivity, the degree of current movement is larger than of p-type current diffusion layer. In addition, because of the decreased resistance, a current can be diffused in regions away from the region of the active layer 83 right below the n-type electrode 132. Thus, the efficiency at which light is taken out is further improved.

EXAMPLE 13

Figure 16:
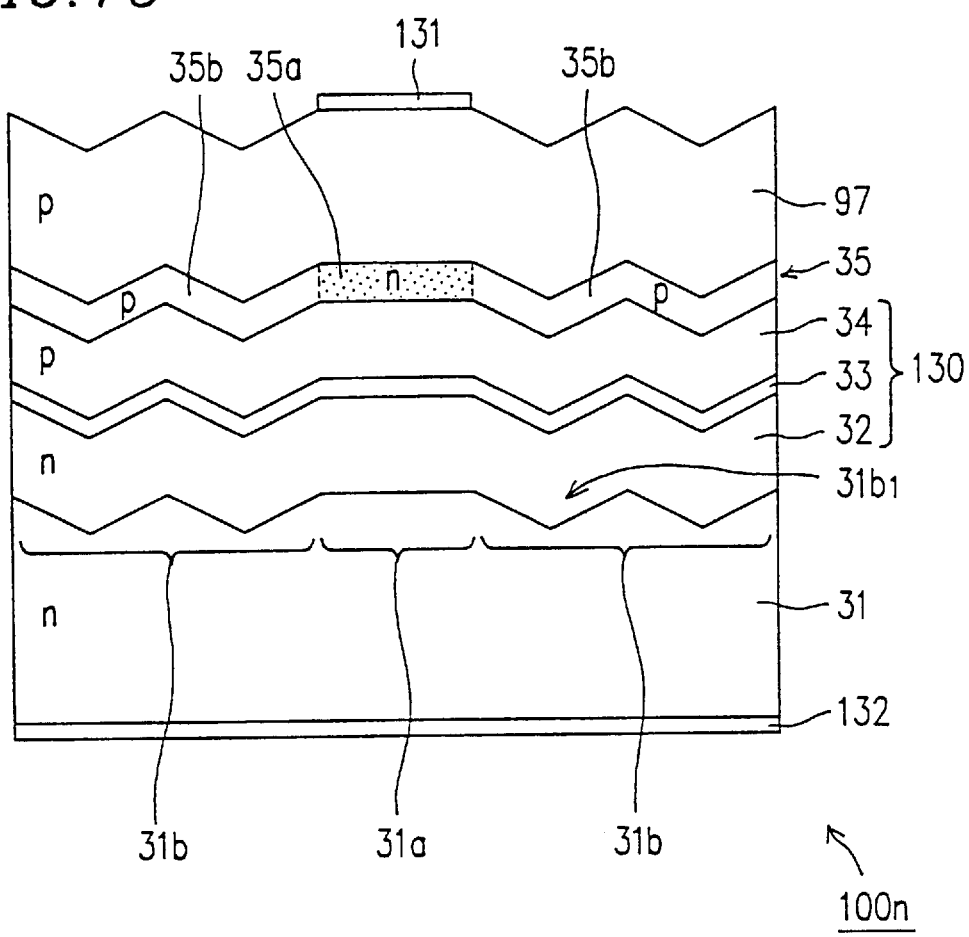
FIG. 16 is a cross-sectional view of an LED of the thirteenth example according to the present invention.

FIG. 16 is a cross-sectional view illustrating an LED as a semiconductor light-emitting device of the thirteenth example according to the present invention. In this figure, the numeral 100n denote an LED of the present example. In the 100n, a GaP current diffusion layer 97 with a Zn carrier concentration of $3 \times 10^{18}$ cm$^{-3}$ and a thickness of 5 µm is used in place of the $Al_{0.7}Ga_{0.3}As$ current diffusion layer 156 of example 9, and the p-type electrode 131 is on the Gap current diffusion layer 97 so as to be positioned right above the flat region 31a of the n-type GaAs substrate 31. Furthermore, each slope of the grooves 31b₁ formed in the groove-formed regions 31b of the n-type GaAs substrate 31 has an orientation of a (111)A plane.

A method for producing the LED 100n of the present example is different from that of the LED 100i of Example 9, in that GaP is grown on the current path adjusting layer 35 as the current diffusion layer 97, a AuZn layer is grown on the current diffusion layer 97, and the AuZn layer is selectively etched so that a portion thereof corresponding to the flat region 31a of the substrate 31 remains to form the p-type electrode 131.

A voltage of 2 volts is applied to the LED 100n of the present example in a forward direction so that a current of 20 mA flows therethrough. LED light is obtained, which has a luminance of more than 9 cd at a peak wavelength of 584 nm.

When the composition x and y of the $(Al_xGa_{1-x})_{1-y}In_yP$ active layer 33 is set at 0.50, respectively, pure green emitted light having a luminance of more than 4.5 cd at a peak wavelength of 555 nm obtained.

In the present example, the n-type current diffusion layer 97 is made of GaP whose bangap is larger than that of $Al_{0.7}Ga_{0.3}As$. Therefore, the absorption of light from the active layer 33 by the n-type current diffusion layer 97 is decreased, compared with the LED 100i of Example 9 in which the n-type current diffusion layer is made of $Al_{0.7}Ga_{0.3}As$, the efficiency at which light is taken out is increased, and the brightness of the LED can be made high.

Furthermore, since the p-type electrode 131 can be provided on the GaP current diffusion layer 97, a contact layer is not required, thus simplifying the production steps.

EXAMPLE 14

Figure 17:
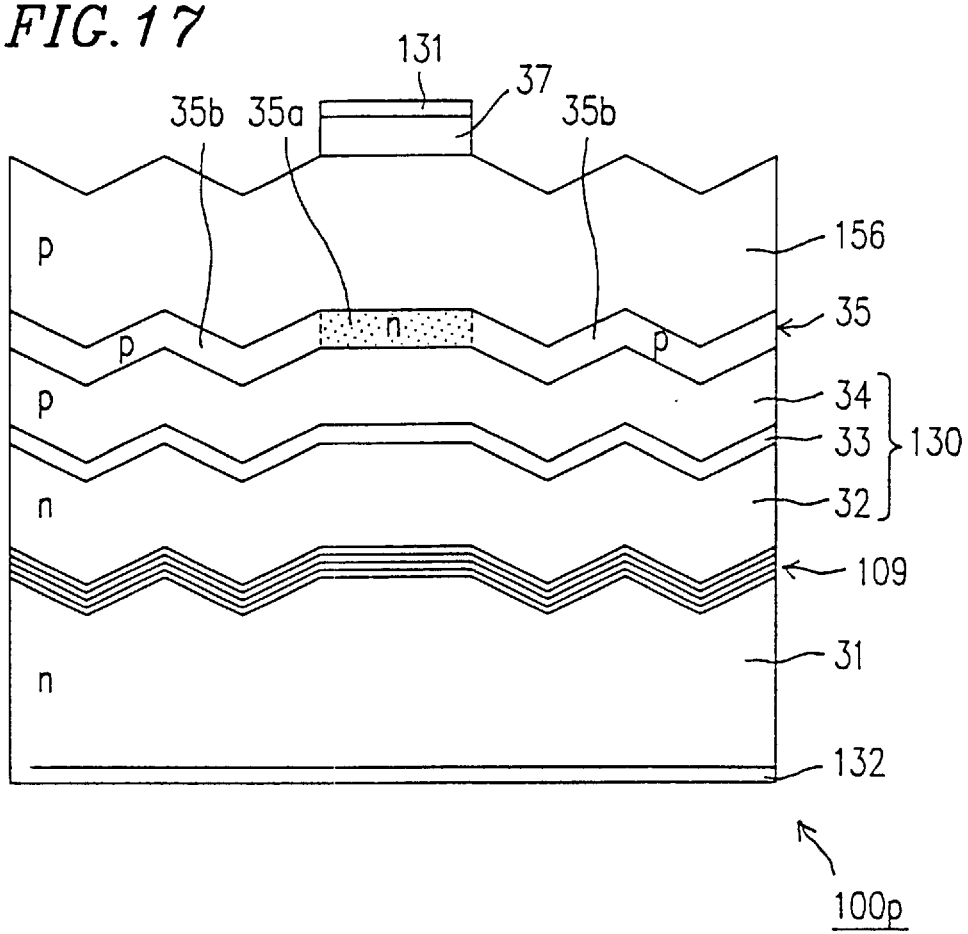
FIG. 17 is a cross-sectional view of an LED of the fourteenth example according to the present invention.

FIG. 17 is a cross-sectional view illustrating an LED as a semiconductor light-emitting device of the fourteenth example according to the present invention. In this figure, the reference numeral 100p denotes an LED of the present example. The LED 100p includes an n-type reflective layer 109 which is positioned between the n-type GaAs substrate 31 and the layered structure 130 having a DH junction portion and reflects LED light traveling from the active layer 33 to the n-type substrate 31 toward the active layer 33 side. The other structure of the device is the same as that of the LED 100*i* of Example 9.

The n-type reflective layer 109 has 10 pairs of a GaAs layer and a AlInP layer, which are alternately layered. Each GaAs layer has a thickness of 0.01 μm, each AlInP layer has a thickness of 0.005 μm, and the n-type reflective layer 109 has thickness of about 0.15 μm.

A method for producing the LED 100*p* of the present example is the same as that of the LED 100*i* of Example 9, except that the n-type reflective layer 109 is formed on the n-type GaAs substrate 31 before the n-type lower cladding layer 32 is formed.

A voltage of 2 volts is applied to the LED 100*p* of the present example in a forward direction so that a current of 20 mA flows therethrough, LED light is obtained, which has a luminance of more than 10 cd at a peak wavelength of 585 nm.

When the composition x and y of the $(Al_xGa_{1-x})_{1-y}In_yP$ active layer 33 is set at 0.50, respectively, pure green emitted light having a luminance of more than 5 cd at a peak wavelength of 555 nm is obtained.

In the present example, the n-type reflective layer 109 reflecting LED light, which travels from the active layer 33 to the n-type GaAs substrate 31, to the active layer 33 is disposed between the n-type GaAs substrate 31 and the layered structure 130 having a DH junction portion. Therefore, light traveling to the substrate side, among the LED light emitted from the active layer 33, is not absorbed by the p-type GaAs substrate 31 with a reflective index higher than that of the layered structure 130, and the efficiency at which light is taken out can be increased, compared with the LED 100*i* of Example 9.

In the present example, the n-type reflective layer 109 is constituted by the combination of the GaAs layers and the InAlP layers. However, the combination of semiconductor materials constituting the n-type reflective layer 109 is not limited to these materials. Combinations of other semiconductor materials can be used as long as they are capable of reflecting the LED light, which travels from the active layer 33 to the n-type GaAs substrate 31, to the active layer 33.

EXAMPLE 15

Figure 18:
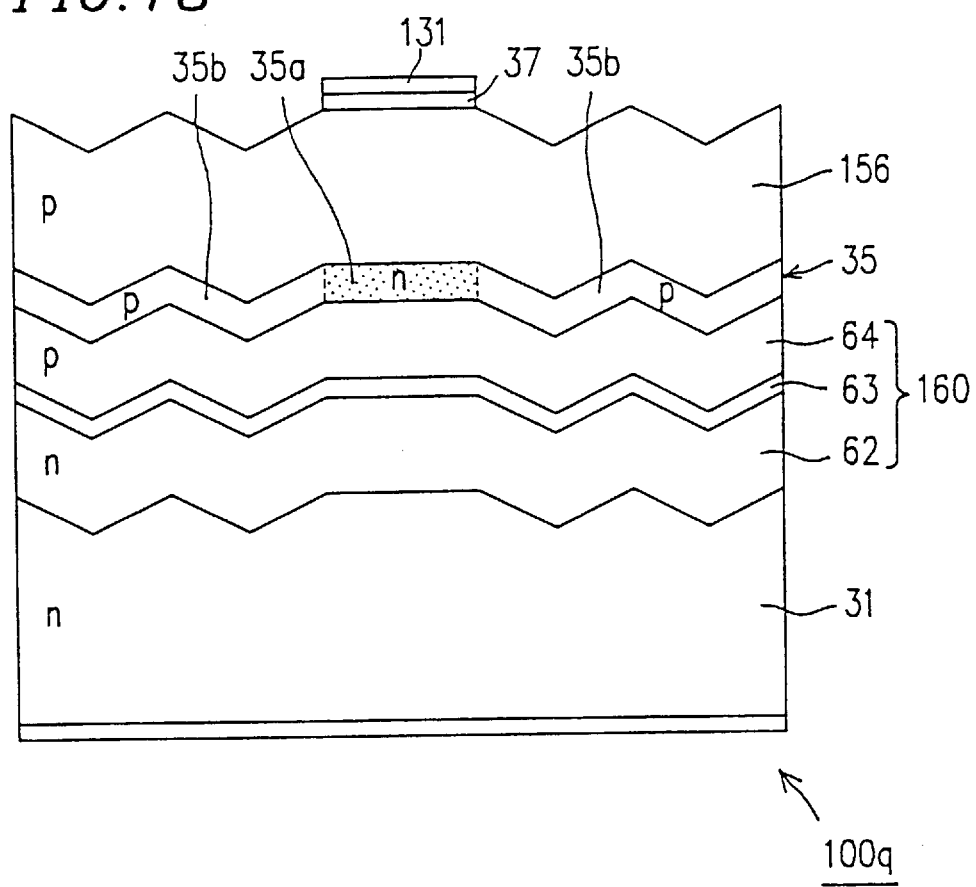
FIG. 18 is a cross-sectional view of an LED of the fifteenth example according to the present invention.

FIG. 18 is a cross-sectional view illustrating an LED as a light-emitting diode of the fifteenth example according to the present invention. In this figure, the reference numeral 100*q* denotes an LED of the present example. Like reference numerals refer to like parts of FIG. 11. In the LED 100*q*, a layered structure 160 having a DH junction portion is made of an AlGaAs type mixed semiconductor instead of the AlGaInP type mixed semiconductor used in Example 9.

An n-type lower cladding layer 62, an active layer 63, and a p-type upper cladding layer 64 included in the layered structure 160 are respectively made of $Al_xGa_{1-x}As$ ($0 \leq x \leq 1$). The lower cladding 62 and the upper cladding layer 64 have a composition of x=0.70 and a thickness of 1.0 μm, respectively, for example. The lower cladding layer 62 has a Si carrier concentration of $1 \times 10^{18}$ cm$^{-3}$ and the upper cladding layer 64 has a Zn carrier concentration of $1 \times 10^{18}$ cm$^{-3}$. The active layer 63 has a composition of x=0.30 and a thickness of 0.50 μm, for example.

The other structure of the device is the same as that of the LED 100*i* of Example 9.

A voltage of 2 volts is applied to the LED 100*q* of the present example in a forward direction so that a current of 20 mA flows therethrough. LED is obtained, which has a luminance of more than 30 cd at a peak wavelength of 660 nm.

In the present example, the layered structure having a DH junction portion is made of a AlGaAs type mixed semiconductor. However, LED light emitted by the active layer is not absorbed by the current path adjusting layer made of a AlGaInP type semiconductor; thus, the same effect as that of Example 9 can be obtained.

It is noted that even when the layered structure having a DH junction portion is made of a semiconductor material other than those of a AlGaAs type or a AlGaInP type, e.g., type a GaInN type semiconductor, the same effect as that of the above-mentioned example can be obtained.

The present invention is not limited to the LEDs of the above-mentioned respective examples. For example, in each of the above examples, the AlGaInP layer or the AlGaAs layer having an Al composition of 0.3 or 0.5 is used as the active layer. However, emitted light in a visible light region from red to green can be obtained as LED light emitted from the LED by changing the Al composition. In this case, the same effect of the present invention is obtained even when the Al composition is changed.

By changing the semiconductor material of the active layer to other materials such as a AlGaInN type mixed semiconductor, emitted light in a visible light region from red to blue can be obtained. By changing the Al composition of the AlGaInN type mixed semiconductor or the like, emitted light in a visible light region from red to blue can be obtained.

Furthermore, regarding the other semiconductor layers included in LED of each example, that is, the cladding layer, the current path adjusting layer, and the current diffusion layer, the composition ratio and the material can be changed in the same way as in the active layer.

In each example, each slope of the grooves has an orientation of a (311)A plane or a (111)A plane. Alternatively, each slope of the grooves may tilt in a [011] direction from the (100) plane of a semiconductor crystal. As shown in FIG. 3, even when each slope has another orientation, the grooves can be controlled so as to have a p-type conductivity as long as the orientation is an A face. In this case, the same effect of the present invention can be obtained.

Furthermore, in each example, the first region of the substrate on which the current blocking region is formed has a (100) plane. However, as seen in FIG. 3, even when the flat region has an A plane, the same effect can be obtained as long as the semiconductor layer to be grown on the flat region has a crystal orientation not having a p-type conductivity, e.g., an n-type orientation or a high-resistant orientation. For example, one of the p-type dopant and the n-type dopant to be doped in the current path adjusting layer can be reduced by forming a high-resistant region as the current blocking region.

The groove-formed region or the flat region corresponding to the current blocking region at the center of the substrate is not limited to a circular shape. The same effect can be obtained even when other shapes are used.

Furthermore, in each example, the current diffusion layer is made of $Al_xGa_{1-x}As$ ($0 \leq x \leq 1$) or $(Al_xGa_{1-x})_{1-y}In_yP$ ($0 \leq x \leq 1, 0 \leq y \leq 1$). However, the current diffusion layer can be made of other materials, as long as the materials have a bandgap allowing the materials to be transparent with respect to light generated in the active layer.

In each example, although the GaAs substrate is used in the LED, the material of the substrate is not limited to GaAs.

The same effect of the present invention can be obtained by using any compound semiconductor materials, such as those of a AlGaAs type, AlGaInP type (e.g., GaP), and an AlGaInN type (e.g., GaN).

EXAMPLE 16

Figure 19A:
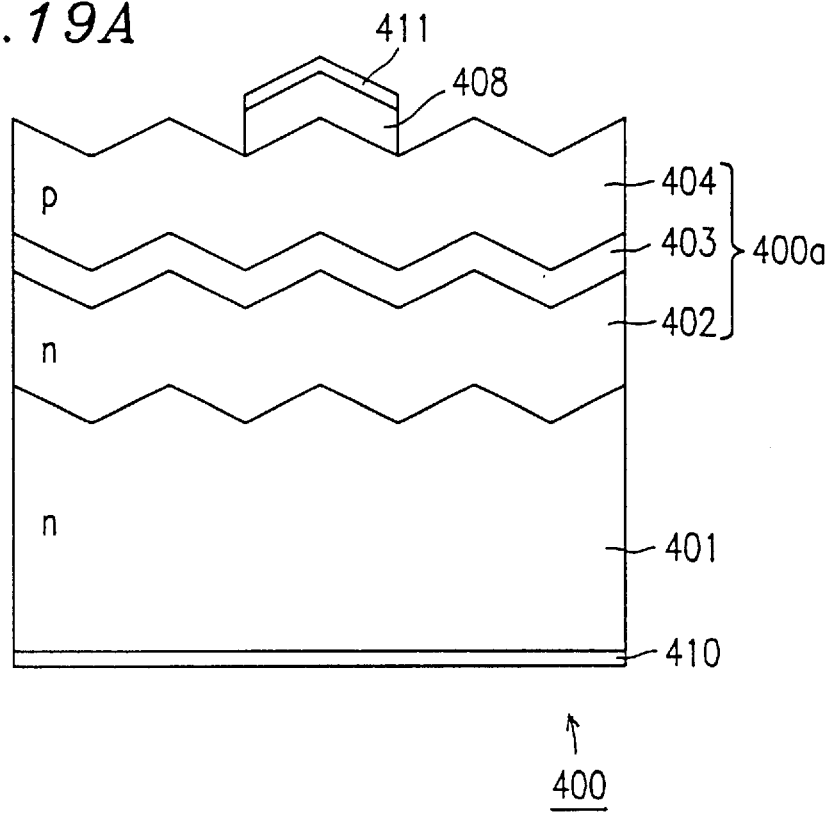
FIG. 19A is a cross-sectional view of an LED of the sixteenth example according to the present invention.
Figure 19B:
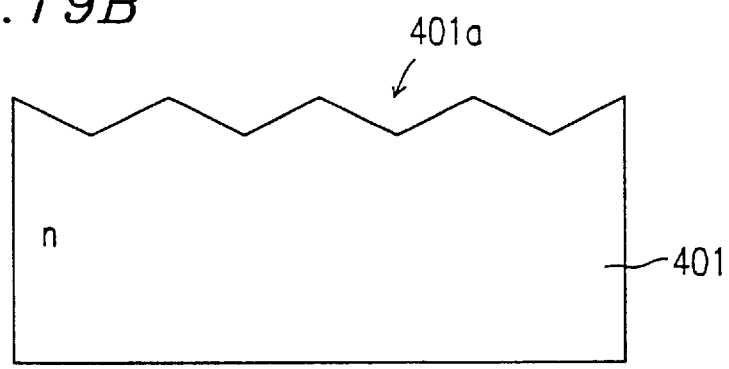
FIG. 19B is a cross-sectional view of a substrate included in the LED.
Figure 21A:
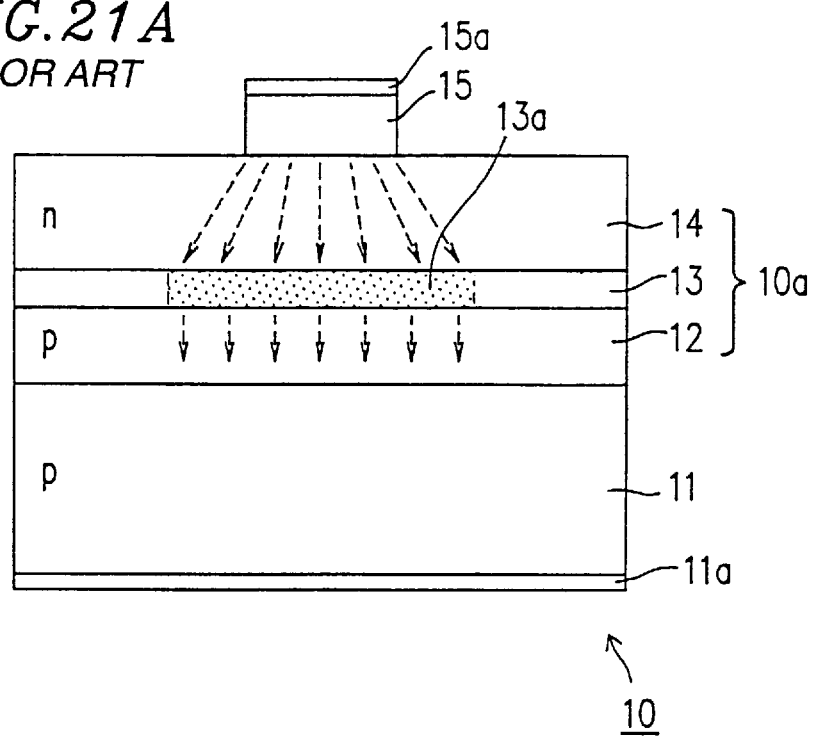
FIG. 21A is a cross-sectional view of a conventional pn-junction LED, showing a current distribution.
Figure 21B:
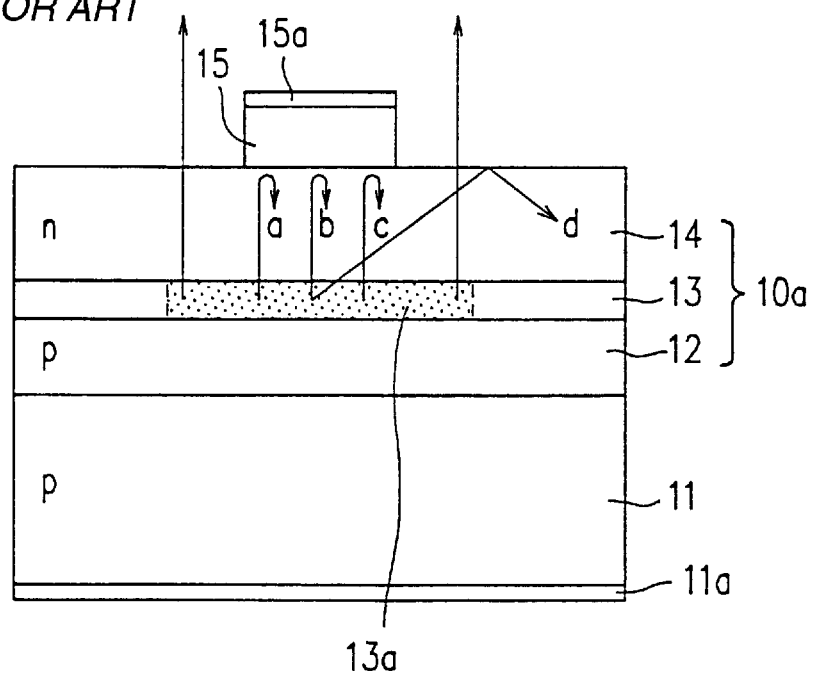
FIG. 21B shows the way light is emitted in the LED.
Figure 22:
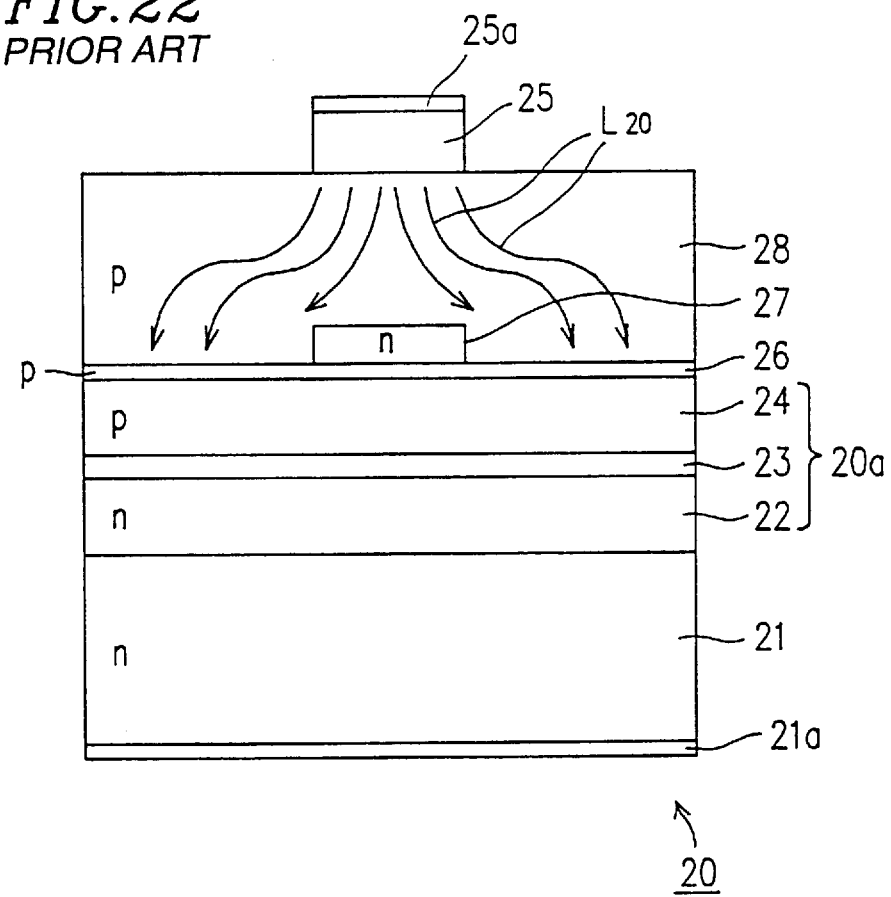
FIG. 22 is a cross-sectional view of a conventional LED having a current diffusion layer.

FIGS. 19A and 19B are cross-sectional views each illustrating as LED as a semiconductor light-emitting device of the sixteenth example according to the present invention. Specifically, FIG. 19A is a cross-sectional view showing a structure of the LED; and FIG. 19B is a cross-sectional view showing a structure of a substrate included in the LED.

In these figures, the reference numeral 400 denotes an a LED of the present example. The LED 400 includes an n-type GaAs substrate 401 on which a light-emitting portion 400a is provided. The light-emitting portion 400a includes an n-type lower cladding layer 402, an active layer 403, and a p-type upper cladding layer 404 grown in this order from the substrate side. The light-emitting portion 400a has a DH junction portion and emits light generated in the active layer 403. A p-type electrode 411 made of AuZn is provided above the p-type upper cladding layer 404 of the light-emitting portion 400a via a p-type GaAs contact layer 408. Furthermore, an n-type electrode 410 made of AuGe is formed over the entire reverse surface of the n-type GaAs substrate 401.

In the present example, a plurality of stripe-shaped V-grooves 401a are formed on the surface of the n-type GaAs substrate 401 so as to have a depth of 5 µm and a width of 20 µm, and thus, the surface of the substrate 401 has an uneven configuration. An inclination angle of each slope of the grooves 401a is 30°.

The lower cladding layer 402, the active layer 403, and the upper cladding layer 404 are made of $(Al_xGa_{1-x})_{1-y}In_yP$ ($0 \leq x \leq 1$, $0 \leq y \leq 1$), respectively. The lower cladding layer 402 and the upper cladding layer 404 have a composition ratio of x=0.70 and y=0.50 and a thickness of 1.0 µm, respectively. The Si carrier concentration of the lower cladding layer 402 and the Zn carrier concentration of the upper cladding layer 404 are $1 \times 10^{18}$ cm$^{-3}$, respectively.

The active layer 403 has a composition ratio, for example, or x=0.30 and y=0.50 and a thickness of 0.50 µm.

The p-type GaAs contact layer 408 is provided in a circular region with a diameter of 200 µm at the center of the light-emitting portion 400a, and has a Zn carrier concentration of $3 \times 10^{18}$ cm$^{-3}$ and a thickness of 1 µm.

Hereinafter, a method for producing the LED 400 will be described.

A plurality of stripe-shaped grooves are formed by etching the surface of the n-type GaAs substrate 401 so as to have a depth of 5 µm, a width of 20 µm, and an inclination angle of each slope of 30° (see FIG. 19B).

Then, each of the semiconductor layers 402 to 404, and 408 are formed on the substrate 401, subjected to the etching treatment, by an MOCVD method.

Specifically, after the etching treatment, n-type $(Al_{0.7}Ga_{0.3})_{0.5}In_{0.5}P$ is formed on the substrate 401 as the n-type lower cladding layer 402 so as to have a thickness of about 1.0 µm and a Si carrier concentration of $1 \times 10^{18}$ cm$^{-3}$. Then, $(Al_{0.3}Ga_{0.5})_{0.5}In_{0.5}P$ is grown on the n-type lower cladding layer 402 as the active layer 403 so as to have a thickness of about 0.5 µm, and p-type $(Al_{0.7}Ga_{0.3})_{0.5}In_{0.5}P$ is grown on the active layer 403 as the p-type upper cladding layer 404 so as to have a thickness of about 1 µm and Zn carrier concentration of $1 \times 10^{18}$ cm$^{-3}$.

At this time, the surface configuration of the substrate 401 is transferred to the semiconductor layers grown thereon. Because of this, the active layer 403 has a wave-shaped surface. In addition, a plurality of grooves with its orientation angle of each slope of about 30° are formed on the p-type upper cladding layer 404, and thus, the surface of the p-type upper cladding layer 404 has a uneven shape.

Then, a p-type GaAs layer is grown on the upper cladding layer 404 so as to have a thickness of about 1 µm and a Si carrier concentration of $3 \times 10^{18}$ cm$^{-3}$. Thereafter, a AuZn layer is formed on the p-type GaAs layer and a AuGe layer 410 is formed on the reverse surface of the n-type substrate 401 as an n-type electrode. The p-type GaAs layer and the AuZn layer are selectively etched so that portions thereof on the circular region with a diameter of 200 µm at the center of the light-emitting portion 400a remain, whereby the n-type GaAs contact layer 408 and the p-type electrode 411 are formed. Thus, the LED 400 is completed (FIG. 19A).

A voltage of 2 volts is applied to the LED 400 of the present example in a forward direction so that a current of 20 mA flows therethrough. LED light is obtained, which has a luminance of more than 3 cd at a peak wavelength of 595 nm.

When the composition x and y of the $(Al_xGa_{1-x})_{1-y}In_yP$ active layer 403 is set at 0.50, respectively, pure green emitted light having a luminance of more than 1 cd at a peak wavelength of 565 nm is obtained.

As described above, in the present example, the n-type GaAs substrate 401 has an uneven surface, the light-emitting portion 400a provided on the substrate 401 includes the n-type lower cladding layer 402, the active layer 403, and the p-type upper cladding layer 404 grown in this order, and each of the semiconductor layer 402 to 404 included in the light-emitting portion 400a has an uneven shape corresponding to that of the surface of the substrate. Therefore, the device surface from which LED light is emitted has an uneven shape, and the ratio of LED light which is incident upon the device surface at an angle equal to or larger than a critical angle decreases. Moreover, even when the LED light is incident at an angle equal to or larger than the critical angle and is reflected, the LED light is incident upon the surface of the device again at an angle smaller than the critical angle and is take outside of the device. Thus, the efficiency at which LED light is taken out can be improved.

Furthermore, the active layer 403 emitting the LED light also has an uneven surface corresponding to that of the substrate 401, and hence, the light-emitting area increases, compared with a flat active layer. This results in an increase in light-emitting efficiency of LED light.

The increase in light-emitting efficiency and improvement of the efficiency at which light is taken out enable the LED 400 to have a higher brightness.

EXAMPLE 17

FIG. 20 is a cross-sectional view illustrating an LED as a light-emitting device of the seventeenth example according to the present invention. In this figure, the reference numeral 500 denotes an LED of the present example. The LED 500 includes an n-type GaAs substrate 521 on which a plurality of stripe-shaped V-grooves 521a are formed so as to have a depth of 4.3 µm, a width of 6 µm, and an orientation of each slope, for example, of a (111)A plane.

The other structure of the LED 500 is the same as that of the LED 400 of Example 16. More specifically, a light-emitting portion 500a having a DH junction portion is provided on the substrate 521. The light-emitting portion 500a includes an n-type lower cladding layer 522, an active layer 523, and a p-type upper cladding layer 524 grown in this order from the substrate side. The light-emitting portion 500a emits light generated in the active layer 523. A p-type electrode 511 made of AuZn is provided above the p-type upper cladding layer 524 of the light-emitting portion 500a via a p-type GaAs contact layer 528 with a Zn carrier concentration of $3 \times 10^{18}$ cm$^{-3}$. Furthermore, an n-type electrode 510 made of AuGe is formed over the entire reverse surface of the n-type GaAs substrate 521.

The p-type GaAs contact layer 528 and the p-type electrode 511 have a circular shape with a diameter of 200 μm in the same way as in the above example. The n-type lower cladding layer 522, the active layer 523, and the p-type cladding layer 524 are made of $(Al_xGa_{1-x})_{1-y}In_yP$, respectively, in the same way as in Example 16. The compositions, carrier concentrations, and thickness of the n-type lower cladding layer 522 and the p-type upper cladding layer 524, and the composition of the active layer 523 are the same as those in Example 16.

A voltage of 2 volts is applied to the LED 500 of the present example in a forward direction so that a current of 20 mA flows therethrough. LED light is obtained, which has a luminance of more than 3 cd at a peak wavelength of 585 nm.

When the composition x and y of the $(Al_xGa_{1-x})_{1-y}In_yP$ active layer 523 is set at 0.50, respectively, pure green emitted light having a luminance of more than 1 cd at a peak wavelength of 555 nm is obtained.

In the present example, the n-type GaAs substrate 521 has a plurality of stripe-shaped grooves 521a so as to have an uneven surface configuration, and the orientation of each slope of the grooves 521a formed on the surface of the substrate 521 is a (111)A plane based on a (100) plane of GaAs crystal. Alternatively, each slope of the grooves 521a may tilt in a [011] direction from the (100) plane of substrate 521. Therefore, the same effect as that of Example 16 is obtained. In addition to this, a super-lattice is not formed on the surface of the substrate 521 even when an AlGaInP mixed semiconductor material is grown thereon by a MOCVD method. More specifically, $(Al_{0.3}Ga_{0.7})_{0.5}In_{0.5}P$ crystal grown above the n-type GaAs substrate 521 as the active layer 523 by a MOCVD method contains no super-lattice. Because of this, LED light can be prevented from having a longer wavelength due to such a super-lattice. As a result, it is not required to adjust the wavelength of the LED light by increasing the Al composition, and LEDs with high brightness and high reliability can be obtained.

A shape or size of the region in which the grooves are formed is not limited to that of Examples 16 and 17. The top surface of the semiconductor substrate may include a flat region and a groove-formed region in which the grooves are formed as explained in Examples 1 to 15.

The present invention is not limited to Examples 1 through 17. Particularly, in Example 16, the active layer is made of a AlGaInP type semiconductor material; however, the active layer can be made of AlGaAs, or semiconductor materials of a AlGaInN type or a MgZnSe type. LED light in a visible light region from red to blue can be obtained by changing the material for the active layer. This also applies to the cladding layer.

Furthermore, in each example, LED light in a visible light region from red to blue can also be obtained by adjusting the Al composition of x in $(Al_xGa_{1-x})_{1-y}In_yP$.

Needles to say, the same effect of the present invention can be obtained even when the material for the active layer and the composition ratio of the material thereof are changed.

Such changes in the material and the composition ratio of the material can be made in the cladding layer and the contact layer as well as the active layer.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor light-emitting device comprising:
   a semiconductor substrate of first conductivity type having a top surface and a bottom surface;
   a current path adjusting layer including a current blocking region and a current passing region, containing a first dopant of the first conductivity type and a second dopant of a second conductivity type;
   a multi-layer structure formed between the top surface of the semiconductor substrate and the current path adjusting layer, the multi-layer structure including an active layer for emitting light and a pair of cladding layers sandwiching the active layer;
   a first electrode formed on the bottom surface of the semiconductor substrate; and
   a second electrode formed over the current blocking region of the current path adjusting layer,
   wherein the top surface of semiconductor substrate has a flat region and a groove-formed region in which at least one groove is formed and conductivity of the current path adjusting layer is locally changed depending upon a crystal orientation of a slope of the groove and a crystal orientation of the flat region of the top surface of the semiconductor substrate, and
   the current blocking region above the groove-formed region has the first conductivity and the current passing region above the flat region has the second conductivity.

2. A semiconductor light-emitting device according to claim 1, wherein the crystal orientation of the flat region of the top surface of the semiconductor substrate is (100), and the crystal orientation of the slope of the groove in the groove-formed region is A orientation.

3. A semiconductor light-emitting device according to claim 1, wherein a cladding layer having the second conductivity type is formed between the current path adjusting layer and the second electrode.

4. A semiconductor light-emitting device according to claim 1, further comprising a current diffusion layer having the second conductivity type formed between the current path adjusting layer and the second electrode, diffusing a current so that a cross-sectional of a current path becomes larger on the current path adjusting layer side than on the side of the second electrode.

5. A semiconductor light-emitting according to claim 4, wherein the current diffusion layer includes a second current path adjusting layer therein,
   the second current path adjusting layer contains a first dopant for the first conductivity type and a second dopant for the second conductivity type, and
   the second current path adjusting layer includes a second current blocking region having a first conductivity type by the first dopant based on the crystal orientation of the slope of the groove in the groove-formed region of the semiconductor substrate and a second current passing region has the second conductivity by the second dopant based on the crystal orientation of the flat region of the semiconductor substrate.

6. A semiconductor light-emitting according to claim 1, wherein the current blocking region of the current path adjusting layer is a high-resistance region.

7. A semiconductor light-emitting according to claim 1, wherein the multi-layer structure includes a reflective layer reflecting generated in the active layer.

8. A semiconductor light-emitting according to claim 1, wherein the multi-layer structure is made of $(Al_xGa_{1-x})_{1-y}In_yP$ layers ($0 \leq x \leq 1$, $0 \leq y \leq 1$).

9. A semiconductor light-emitting device according to claim 1, wherein the current path adjusting layer is made of a $(Al_xGa_{1-x})_{1-y}In_yP$ layer ($0 \leq x \leq 1$, $0 \leq y \leq 1$).

10. A semiconductor light-emitting device according to claim 1, wherein the current diffusion layer is made of $Al_xGa_{1-x}As$ ($0 \leq x \leq 1$).

11. A semiconductor light-emitting device according to claim 1, wherein the current diffusion layer is made of a $In_y(Ga_{1-x}Al_x)_{1-y}P$ layer ($0 \leq x \leq 1$, $0 \leq y \leq 1$).

12. A semiconductor light-emitting device comprising:
a semiconductor substrate of a first conductivity type having a top surface and a bottom surface;
a multi-layer structure above the substrate including an active layer for emitting light and a pair of cladding layers sandwiching the active layer;
a current path adjusting layer formed between the top surface of the semiconductor substrate and the multi-layer structure, the current path adjusting layer including a current blocking region and a current passing region, containing a first dopant of the first conductivity type and a second dopant of a second conductivity type;
a first electrode formed on the bottom surface of the semiconductor substrate,
a second electrode formed over the current blocking region of the current path adjusting layer; and
wherein the top surface of semiconductor substrate has a flat region and a groove-formed region in which at least one groove is formed, and conductivity of the current path adjusting layer is locally changed depending upon a crystal orientation of a slope of the grooves and a crystal orientation of the flat region of the top surface of the semiconductor substrate, and
the current blocking region above the groove-formed region has the flat conductivity and the current passing region above the flat region has the second conductivity.

13. A semiconductor light-emitting device according to claim 12, wherein the current blocking region of the current path adjusting layer is a high-resistance region.

14. A semiconductor light-emitting device according to claim 12, wherein the semiconductor substrate comprises a second cladding layer having the first conductivity formed between the semiconductor substrate and the current path adjusting layer.

15. A semiconductor light-emitting device according to claim 14, comprising a current diffusion layer having the second conductivity, provided between the multi-layer structure and the second electrode diffusing a current so that a cross-sectional of a current path becomes larger on the layered structure side than on the side of the second electrode.

16. A semiconductor light-emitting device according to claim 15, wherein a reflective layer reflecting light generated in the active layer is formed on the semiconductor substrate.

17. A semiconductor light-emitting device according to claim 16, wherein the multi-layer structure is made of a $(Al_xGa_{1-x})_{1-y}In_yP$ layer ($0 \leq x \leq 1$, $0 \leq y \leq 1$).

18. A semiconductor light-emitting device according to claim 16, wherein the current path adjusting layer is made of a $(Al_xGa_{1-x})_{1-y}In_yP$ layer ($0 \leq x \leq 1$, $0 \leq y \leq 1$).

19. A semiconductor light-emitting device according to claim 16, wherein the current diffusion layer is made of $Al_xGa_{1-x}As$ ($0 \leq x \leq 1$).

20. A semiconductor light-emitting device according to claim 16, wherein the current diffusion layer is made of a $In_y(Ga_{1-x}Al_x)_{1-y}P$ layer ($0 \leq x \leq 1$, $0 \leq y \leq 1$).

21. A semiconductor light-emitting device comprising:
a semiconductor substrate of a first conductivity type having a top surface and a bottom surface;
a current path adjusting layer above the substrate including a current blocking region and a current passing region, containing a first dopant of the first conductivity type and a second dopant of a second conductivity type;
a multi-layer structure formed between the top surface of the semiconductor substrate and the current path adjusting layer, the multi-layer structure including an active layer for emitting light and a pair of cladding layers sandwiching the active layer;
a first electrode formed on the bottom surface of the semiconductor substrate; and
a second electrode formed over the current blocking region of the current path adjusting layer and said current passing region being substantially uncovered by the second electrode,
wherein the top surface of the semiconductor substrate has a flat region and a grooved region on top surface having at least one groove, and conductivity of the current path adjusting layer is locally changed depending upon a crystal orientation of a slope of the at least one groove and a crystal orientation of the flat region of the top surface of the semiconductor substrate, and
the current blocking region above the flat region has the first conductivity type and the current passing region above the grooved region has the second conductivity type.

22. A semiconductor light-emitting device according to claim 21, comprising a current diffusion layer having the second conductivity formed between the current path adjusting layer and the second electrode, diffusing a current so that a cross-section of a current path becomes larger on the current path adjusting layer side than on the side of the second electrode.

23. A semiconductor light-emitting device according to claim 21, wherein the current blocking region is a high-resistance region.

24. A semiconductor light-emitting device according to claim 21, wherein a reflective layer reflecting light generated in the active layer is formed on the semiconductor substrate.

25. A semiconductor light-emitting device comprising:
a semiconductor substrate of a first conductivity type having a top surface and a bottom surface;
a current path adjusting layer above the substrate including a current blocking region and a current passing region, containing a first dopant of the first conductivity type and a second dopant of a second conductivity type;
a multi-layer structure formed between the top surface of the semiconductor substrate and the current path adjusting layer, the multi-layer structure including an active layer for emitting light and a pair of cladding layers sandwiching the active layer;
a first electrode formed on the bottom surface of the semiconductor substrate; and a second electrode formed over the current blocking region of the current path adjusting layer;

wherein the top surface of the semiconductor substrate has a flat region and a grooved region on the top surface, and conductivity of the current path adjusting layer is locally changed depending upon a crystal orientation of a slope of the grooved region and a crystal orientation of the flat region of the top surface of the semiconductor substrate, and the current blocking region above the flat region has the flat conductivity type and the current region above the grooved region has the second conductivity type;

further comprising a current diffusion layer having the second conductivity formed between the current path adjusting layer and the second electrode, diffusing a current so that a cross-section of a current path becomes larger on the current path adjusting layer side than on the side of the second electrode;

wherein the current diffusion layer includes a second current path adjusting layer, the second current path adjusting layer contains a first dopant for the first conductivity and a second dopant for the second conductivity, and the second current path adjusting layer includes a second current blocking region formed so as to have a conductivity of the first dopant based on the orientation of the flat region of the semiconductor substrate and a second current passing region formed so as to have a conductivity of the second dopant based on the orientation of the slope of the grooved region of the semiconductor substrate.

26. A semiconductor light-emitting device comprising:

a semiconductor substrate of a first conductivity type having a top surface and a bottom;

a multi-layer structure including an active for emitting light and a pair of cladding layers sandwiching the active layer;

a current path adjusting layer formed between the top surface of the semiconductor substrate and the multi-layer structure, the current path adjusting layer including a current blocking region and a current passing region, containing a first dopant of the first conductivity type and a second dopant for a second conductivity type;

a first electrode formed on the bottom surface of the semiconductor substrate; and a second electrode formed over the current blocking region of the current path adjusting layer and said second electrode being substantially confined to an area over the current blocking region, wherein the top surface of the semiconductor substrate has a flat region and a grooved region in which grooves are formed, and conductivity of the current path adjusting layer locally changed depending upon a crystal orientation of slopes of the grooves and a crystal orientation of the flat region of the top surface of the semiconductor substrate, and the current blocking region above the flat region has the second conductivity type and the current passing region above the grooved region has the first conductivity type.

27. A semiconductor light-emitting device according to claim 26, wherein the current blocking region is a high-resistance region.

28. A semiconductor light-emitting device according to claim 26, comprising a current diffusion layer having the second conductivity provided between the multi-layer structure and the second electrode, and wherein a current is diffused by the current diffusion layer so that a cross-section of a current path becomes larger on the layered structure side than on the side of the second electrode.

29. A semiconductor light-emitting device according to claim 28, wherein a reflective layer reflecting light generated in the active layer is formed on the semiconductor substrate.

30. A semiconductor light-emitting device comprising:

a semiconductor substrate with a top surface with an uneven shape, and having a first conductivity type;

a current path adjusting layer above the substrate including a current blocking region and a current passing region, containing a first dopant of the first conductivity type and a second dopant conductivity type;

a light-emitting portion including an active layer and a pair of cladding layers sandwiching the active layer, the light-emitting portion disposed on the top surface of the semiconductor substrate, emitting light generated in the active layer;

a first electrode formed on a bottom surface of the semiconductor substrate; and a second electrode formed over the light-emitting portion and being substantially confined to an area above the current blocking region of the current adjusting layer, wherein each semiconductor layer included in the light-emitting portion has a front face with an uneven corresponding to the uneven shape of the top surface of the semiconductor substrate.

31. A semiconductor light-emitting device according to claim 30, wherein a plurality of strip-shaped grooves are formed on the top surface of the semiconductor substrate of the semiconductor substrate so that the top surface becomes uneven, and an orientation of slopes of the grooves is an A-plane with respect to a (100) plane of semiconductor crystal.

32. A semiconductor light-emitting device according to claim 30, wherein the top surface of the semiconductor substrate is tilted in a [011] direction from the (100) plane of semiconductor crystal.

33. A semiconductor light-emitting device according to claim 30, wherein the top surface of the semiconductor substrate includes a plane tilted in a [011] direction from a (100) plane semiconductor crystal and a (100) plane.

* * * * *